US006756740B2

(12) United States Patent
Inukai

(10) Patent No.: US 6,756,740 B2
(45) Date of Patent: *Jun. 29, 2004

(54) ELECTRONIC DEVICE

(75) Inventor: Kazutaka Inukai, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

This patent is subject to a terminal disclaimer.

(21) Appl. No.: 10/368,775

(22) Filed: Feb. 18, 2003

(65) Prior Publication Data

US 2003/0146712 A1 Aug. 7, 2003

Related U.S. Application Data

(63) Continuation of application No. 09/747,646, filed on Dec. 22, 2000, now Pat. No. 6,548,960.

(30) Foreign Application Priority Data

Dec. 24, 1999 (JP) .......................................... 11-365824

(51) Int. Cl.[7] ................................................ G09G 3/10
(52) U.S. Cl. ................................ 315/169.3; 315/169.2; 345/204
(58) Field of Search .......................... 315/169.3, 169.2, 315/169.4; 345/204, 211, 214, 76, 92, 55

(56) References Cited

U.S. PATENT DOCUMENTS

| 5,095,248 A | * | 3/1992 | Sato ........................ 315/169.3 |
| 5,247,190 A | | 9/1993 | Friend et al. .................. 257/40 |
| 5,399,502 A | | 3/1995 | Friend et al. ................... 437/1 |
| 5,610,628 A | * | 3/1997 | Yamamoto et al. .......... 345/100 |
| 5,736,752 A | * | 4/1998 | Hseuh et al. .................. 257/72 |
| 5,990,629 A | | 11/1999 | Yamada et al. ........... 315/169.3 |
| 6,246,180 B1 | | 6/2001 | Nishigaki ................. 315/169.3 |
| 6,292,183 B1 | | 9/2001 | Yamazaki et al. ........... 345/211 |
| 6,335,716 B1 | | 1/2002 | Yamazaki et al. ............. 345/92 |

FOREIGN PATENT DOCUMENTS

| EP | 1 061 497 | 12/2000 |
| JP | 10-092576 | 4/1998 |
| JP | 10-312173 | 11/1998 |
| JP | 2000-221942 | 8/2000 |
| JP | 2000-235370 | 8/2000 |
| JP | 2000-347621 | 12/2000 |
| JP | 2001-42822 | 2/2001 |
| JP | 2001-60076 | 3/2001 |
| WO | WO 90/13148 | 11/1990 |

OTHER PUBLICATIONS

Shenk, H. et al, "Polymers for Light Emitting Diodes," EuroDisplay '99, Proceedings of the 19th International Display Research Conference, Berlin, Germany, Sep. 6–9, 1999, pp. 33–37.

English abstract re Japanese Patent Application No. 10–092576, published Apr. 10, 1998.

English abstract re Japanese Patent Application No. 10–214060, published Aug. 11, 1998.

English abstract re Japanese Patent Application No. 10–232649, published Sep. 2, 1998.

(List continued on next page.)

Primary Examiner—Wilson Lee
Assistant Examiner—Thuy Vinh Tran
(74) Attorney, Agent, or Firm—Cook, Alex, McFarron, Manzo, Cummings & Mehler, Ltd.

(57) ABSTRACT

To provide an electronic device capable of suppressing a luminous amount of an EL element and realizing a large number of gray-scale levels. The electronic device is characterized in that the luminescence of the EL element is controlled by a pair of EL driver TFTs, one of the pair of EL driver TFTs is controlled by one of the pair of switching TFTs and one of the pair of eliminating TFTs, the other of the pair of EL driver TFTs is controlled by the other of the pair of switching TFTs and the other of the eliminating TFTs, and gray-scale display is performed by controlling the luminescence time of the EL elements.

52 Claims, 27 Drawing Sheets

OTHER PUBLICATIONS

Complete English translation re Japanese Patent Application No. 10–312173, published Nov. 24, 1998.

US patent application No. 09/724,387 (pending) to Inukai filed Nov. 28, 2000, including specification, abstract, claims, drawings and PTO filing receipt.

US patent application No. 09/725,798 (pending) to Koyama filed Nov. 29, 2000, including specification, abstract, claims, drawings and PTO filing receipt.

JP 2000–221942 English abstract.
JP 2000–235370 English abstract.
JP 2000–347621 full English translation.
JP 2001–42822 full English translation.
JP 2001–60076 English Abstract.

US patent application No. 09/724,387 (pending) to Inukai including PTO filing receipt specification, claims, abstract, and drawings.

US patent application No. 09/725,798 (pending) to Koyama including PTO filing receipt specification, claims, abstract, and drawings.

US patent application No. 09/836,719 (pending) to Kimura et al. including PTO filing receipt specification, claims, abstract, and drawings.

US patent application No. 09/840,584 (pending) to Inukai including PTO filing receipt specification, claims, abstract, and drawings.

US patent application No. 09/841,098 (pending) including specification, claims, abstract, and drawings.

US patent application No. 09/886,148 (pending) to Inukai including PTO filing receipt specification, claims, abstract, and drawings.

US patent application No. 09/992,569 (pending) to Kimura including PTO filing receipt specification, claims, abstract, and drawings.

US patent application No. 10/079,072 (pending) to Kimura including PTO filing receipt specification, claims, abstract, and drawings.

* cited by examiner

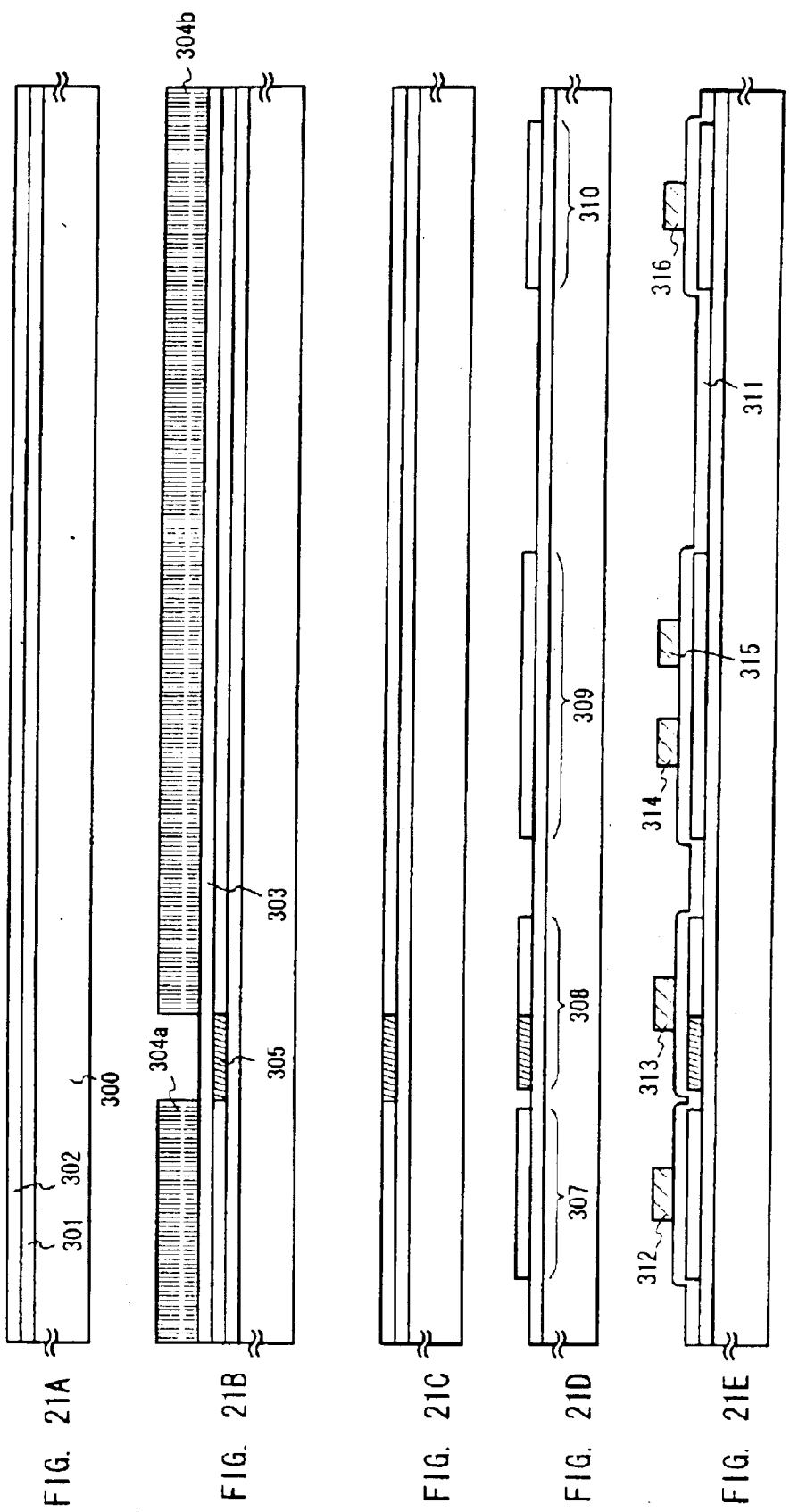

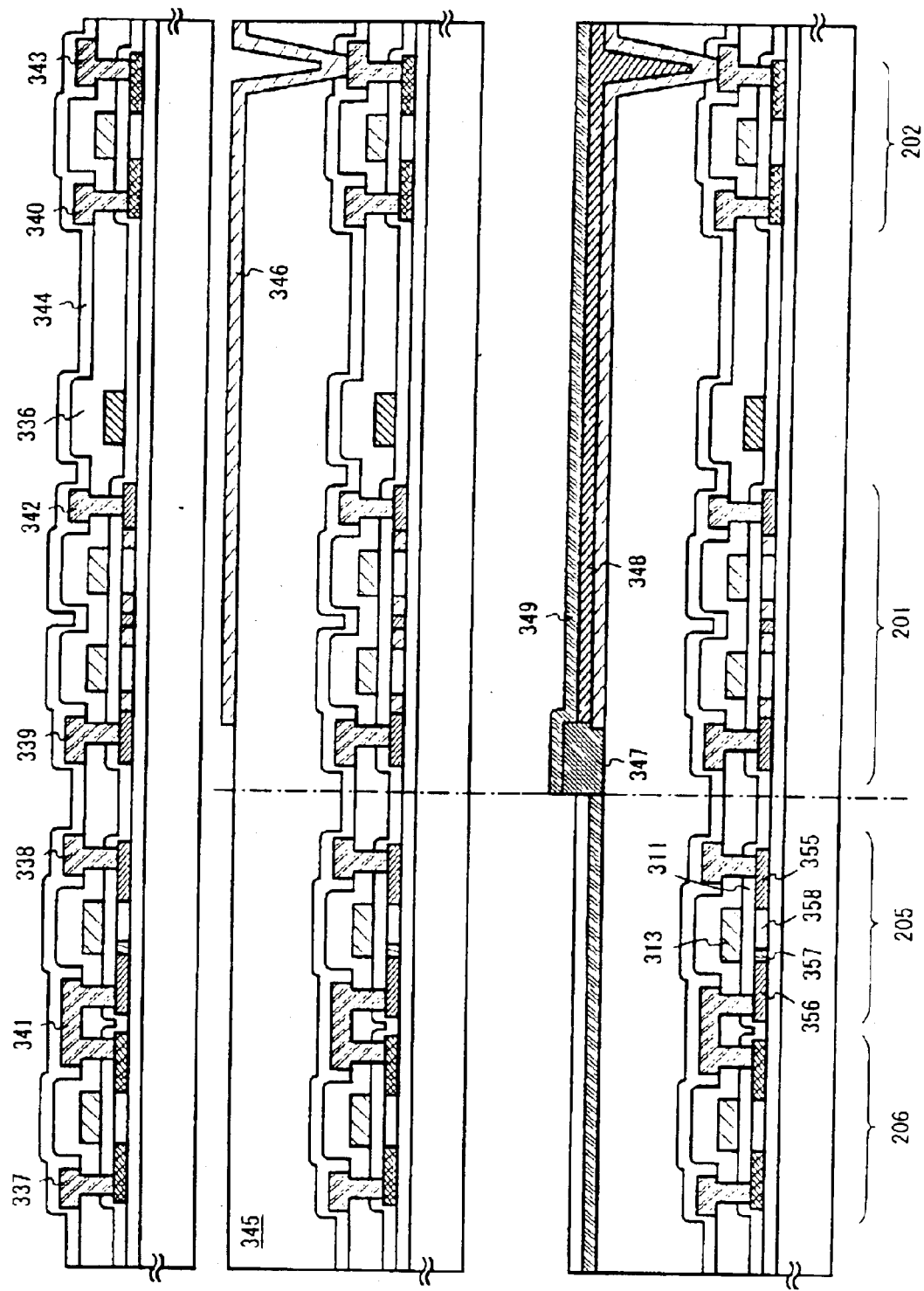

ELECTRONIC DEVICE

This application is a continuation of U.S. application Ser. No. 09/747,646, filed on Dec. 22, 2000, which is now U.S. Pat. No. 6,548,960.

BACKGROUND OF THE INVENTION

1. Field of the Invention

The present invention relates to an EL display (electronic device) formed by fabricating an EL (electro luminescence) element on a substrate. Particularly, the present invention relates to an EL display using a semiconductor element (an element employing a semiconductor thin film), and furthermore to electronic equipment using the EL display as a display portion.

2. Description of the Related Art

In recent years, remarkable progress has been made in a technique for forming TFTs on a substrate, and developing the application of TFTs to an active matrix display device is proceeding. TFTs using a poly-silicon film, in particular, have a higher electric field effect mobility (also referred to as mobility) than that of conventional TFTs using an amorphous silicon film, and hence a high speed operation may be made. Thus, control of pixels, which in the past has been controlled by a driver circuit external to a substrate, can now be made by driver circuits formed on the same substrate as the pixels.

Various merits such as reduction of manufacturing cost, miniaturization of a display device, and increase of yield and reduction of throughput can be obtained from such an active matrix display device by forming various circuits and elements on the same substrate.

A research on active matrix EL displays having an EL element as a self-luminous element is being actively carried out. The EL display is also referred to as an organic EL display (OLED) or an organic light emitting diode (OLED).

Unlike a liquid crystal display, the EL display is a self-luminous type. The EL element has a structure composed of a pair of electrodes (anode and cathode) and an EL layer, which is usually a laminate structure, sandwiched therebetween. The laminate structure (hole transporting layer, light-emitting layer, electron transporting layer) proposed by Tang, et al. from Eastman Kodak Company can be cited as a typical laminate structure of the EL layer. This laminate structure has an extremely high luminescence efficiency, and therefore at present, most of the EL displays in which research and development are proceeding adopt this laminate structure of the EL layer.

In addition to the above laminate structure, a structure in which the layers are laminated on the anode in the order of a hole injection layer, a hole transporting layer, a light-emitting layer, and an electron transporting layer or in the order of a hole injection layer, a hole transporting layer, a light-emitting layer, an electron transporting layer, and an electron injection layer may be formed. The light-emitting layer may be doped with a fluorescent pigment or the like.

The EL layer is a generic term in the present specification indicating all the layers formed between the cathode and anode. Therefore, the above-mentioned hole injection layer, the hole transporting layer, the light-emitting layer, the electron transporting layer, the electron injection layer, etc. are all included in the EL layer.

A predetermined voltage from the pair of electrodes is applied to the EL layer having the above structure, whereby a re-coupling of carriers in the light-emitting layer occurs to thereby emit light. It is to be noted that throughout the present specification, the emission of light by the EL element is called driving the EL element. In addition, a luminescent element formed of the anode, the EL layer, and the cathode is called the EL element in the present specification.

A driving method of the analog system (analog drive) can be cited as a driving method of the EL display. An explanation regarding the analog drive of the EL display will be made with references to FIGS. 18 and 19.

FIG. 18 is a diagram showing the structure of a pixel portion in the EL display having the analog drive. A gate signal line (plurality of gate signal lines G1 to Gy) for inputting a gate signal from a gate signal line driver circuit is connected to a gate electrode of a switching TFT 1801 of the respective pixels. As to a source region and a drain region of the switching TFT 1801 of the respective pixels, one is connected to a source signal line (also called data signal line) (S1 to Sx) for inputting an analog video signal whereas the other is connected to a gate electrode of an EL driver TFT 1804 and a capacitor 1808 of each of the pixels, respectively.

A source region of the EL driver TFT 1804 of each of the pixels is connected to power supply lines (V1 to Vx), and a drain region thereof is connected to an EL element 1806, respectively. An electric potential of the power supply lines (V1 to Vx) is called a power supply potential. Each of the power supply lines (V1 to Vx) is connected to the capacitor 1808 of the respective pixels.

The EL element 1806 is composed of an anode, a cathode, and an EL layer sandwiched therebetween. When the anode of the EL element 1806 is connected to either the source region or the drain region, of the EL driver TFT 1804, the anode and the cathode of the EL element 1806 become a pixel electrode and an opposing electrode, respectively. Alternatively, if the cathode of the EL element 1806 is connected to either the source region or the drain region of the EL driver TFT 1804, then the anode of the EL element 1806 becomes the opposing electrode whereas the cathode thereof becomes the pixel electrode.

It is to be noted that in the present specification, an electric potential of the opposing electrode is referred to as an opposing electric potential. An EL driver voltage, which is the electric potential difference between an electric potential of the pixel electrode and an electric potential of the opposing electrode, is applied to the EL layer.

FIG. 19 is a timing chart illustrating the EL display shown in FIG. 18 when it is being driven by the analog system. A period from the selection of one gate signal line to the selection of a next different gate signal line is called a one line period (L). In addition, a period from the display of one image to the display of the next image corresponds to a one frame period (F). In the case of the EL display of FIG. 18, there are "y" number of the gate signal lines and thus a y number of line periods (L1 to Ly) are provided in one frame period.

Because the number of line periods in one frame period increases as resolution becomes higher, driver circuits must be driven at high frequencies.

First of all, the power supply lines (V1 to Vx) are held at a constant power supply potential, and the opposing electric potential that is the electric potential of the opposing electrode is also held at a constant electric potential. There is a difference in electric potential between the opposing electric potential and the power supply potential to a degree that the EL element can emit light.

A gate signal from the gate signal line driver circuit is fed to the gate signal line G1 in the first line period (L1). An analog video signal is then sequentially inputted to source signal lines (S1 to Sx). All the switching TFTs connected to the gate signal line G1 are turned ON to thereby feed the analog video signal that is inputted to the source signal lines to the gate electrode of the EL driver TFT through the switching TFT.

The amount of current flowing in a channel forming region of the EL driver TFT is controlled by the level (voltage) of the electric potential of the signal inputted to the gate electrode of the EL driver TFT. Accordingly, the electric potential applied to the pixel electrode of the EL element is determined by the level of the electric potential of the analog video signal that is inputted to the gate electrode of the EL driver TFT. The emission of light by the EL element is thus controlled by the electric potential of the analog video signal.

The above described operation is repeated and the first line period (L1) ends upon the completion of inputting the analog video signal to the source signal lines (S1 to Sx). Next, a gate signal is fed to the gate signal line G2 in the second line period (L2). Similar to the first line period (L1), an analog video signal is sequentially inputted to the source signal lines (S1 to Sx).

When the gate signals have been inputted to all the gate signal lines (G1 to Gy), all the line periods (L1 to Ly) are completed to thereby complete one frame period. Display is performed by all the pixels in the one frame period to form one image.

Thus, the luminous amount emitted by the EL element is controlled by the analog video signal and gray-scale display is therefore performed by this control of the luminous amount of emitted. This system is a driving system which is referred to as the so-called analog drive method where gray-scale display is performed by the variations of the electric potential of the analog video signal fed to the source signal lines.

The state in which the amount of current supplied to the EL element is controlled by the gate voltage of the EL driver TFT will be explained in detail using FIGS. 20A and 20B.

FIG. 20A is a graph showing a current-voltage characteristic of the EL element When a voltage exceeding a certain threshold value is applied to the EL element, the current through the EL element changes exponentially with respect to a chance in the applied voltage.

FIG. 20B is a graph for evaluation of the current through the EL element, in which ΔV represents the difference between the power supply potential and the opposing potential; $V_{EL}$, a voltage applied to the EL element (called EL drive voltage); Vds, a voltage applied between the source and the drain of the EL driver TFT (called drain voltage); and Vgs, a voltage applied between the gate and the source of the FL driver TFT (called gate voltage). FIG. 20B shows a curve representing the current-voltage characteristic of the EL element and curves formed in such a manner that curves representing current-voltage characteristics of the EL driver TFT with respect to several are voltages are flipped about a ΔV/2 line. The EL driver TFT and the EL element are connected in series, and the current flowing through the EL driver TFT and the EL element can be read from the points of intersection in the graph of FIG. 20B. With respect to any gate voltage, the current flowing through the EL driver TFT and the EL element can also be read in the same manner.

When the switching TFT is turned ON to input an analog video signal to the pixel, the potential of the analog video signal is applied to the gate electrode of the EL driver TFT. At this time, the current flowing through the EL element is determined in the one-to-one relationship with the gate voltage according to the current-voltage characteristic shown in FIG. 20B. That is, the current flowing through the EL element is determined with respect to the voltage of the analog video signal inputted to the gate electrode of the EL driver TFT, and the EL element emits a luminous amount corresponding to the current.

The luminous amount by the EL element is thus controlled by the video signal, and gray-scale display is performed in accordance with this control of the luminous amount.

However, the above-described analog drive has a drawback of being easily influenced by TFT characteristic variation. For example, in a case where the switching TFTs of a plurality of pixels have different current-voltage characteristics and are operated to display the same level of gray-scale, the currents flowing through the switching TFTs vary and different gate voltages, depending on the variations of the currents, are applied to the EL driver TFTs of the pixels. Different currents are thereby caused to flow through the EL elements (see FIG. 20B), so that the EL elements emits different luminous amounts, resulting in failure to uniformly display the gray-scale.

In the case where the current-voltage characteristics of the EL driver TFTs vary, characteristics of the EL driver TFTs shown in FIG. 20 are changed, and different currents flow through the EL element even when the gate voltages applied to the EL driver TFTs are equal to each other. Moreover, because the current through each EL element changes exponentially with respect to a change in the gate voltage (see FIG. 20A), the difference between the currents flowing through some of the EL elements may become considerably large even if the difference between the current-voltage characteristics of the EL driver TFTs is small. Consequently, even in a case where the current-voltage characteristics of the EL driver TFTs vary only slightly, a considerably large difference may be caused between the luminous amounts emitted by the EL elements of the adjacent pixels with respect to a certain input signal level.

In fact, the characteristic variation of the TFT becomes a multiplier effect of both of the variations of the switching TFT and the EL driver TFT, thereby becoming more conditionally severe. Thus, the analog drive is very susceptible to the characteristic variation of the TFT, a point which had become an obstacle in the gray-scale display of conventional active matrix EL displays.

SUMMARY OF THE INVENTION

The present invention has been made in view of the above problem, and an object of the present invention is therefore to provide an active matrix EL display device capable of performing clear multiple gray-scale color display. Another object of the present invention is to provide a high-performance electronic equipment (electronic device) incorporating such an active matrix EL display as its display unit.

The inventors of the present invention considered the principle of the analog drive to be inseparable from the system of controlling a gate voltage by an analog video signal and controlling a current through an EL element by the gate voltage.

In the case of the conventional analog drive, since the current flowing through the EL element changes abruptly when the gate voltage changes, the current through the EL element is liable to be influenced by variation in the characteristics of the TFT. In other words, even when the same analog video signal is inputted to a plurality of pixels, the gate voltages applied to an EL driver TFTs vary due to variations in the characteristics of the TFTs. Also, even if the gate voltages applied to the EL driver TFTs are equal, the currents flowing through the EL elements may vary largely, resulting in failure to obtain the desired gray-scale level.

The inventors of the present invention then studied a system for controlling the luminous amount emitted by each EL element through control of the time period during which the EL element emits light, instead of controlling the current through the EL element using an analog video signal. In such a method, a digital signal (called digital data signal) is used as the video signal, and each of the EL driver TFT and the EL element has two states: the ON state and the OFF state, or the luminescing state and the non-luminescing state. According to the present invention, the luminous amount emitted by the EL element is controlled based on such control with respect to time to perform gray-scale display. A drive method in which the time during which the EL element emits light is controlled to perform gray-scale display is called a time-division drive method. Also, gray-scale display performed by the time-division drive method is called time-division gray-scale display.

According to the present invention, by using the above-described system, nonuniformity of the currents outputted from TFTs when the gate voltages applied to the TFTs are equal can be limited even if the characteristics of the TFTs vary to some extent. Thus, it is possible to avoid occurrence of a large difference between the luminous amounts of adjacent pixels due to variations of the characteristics of the TFTs when signals having the same voltage level are inputted to the TFTs.

More specifically, time-division gray-scale display is performed as described below. Display of $2^n$ gray-scale levels using an n-bit digital data signal will be described. An EL display of the present invention described below has pairs of source signal line driver circuits and pairs of gate signal line driver circuits.

First, one frame period is divided into an (n) number of display periods (Tr1 to Trn). A time period in which n-bit digital data signals are inputted to all the pixels in the display area to perform display is called a frame period, and regions defined by further dividing one frame period are called display periods (Tr1 to Trn).

In ordinary EL displays, it is preferable to set 60 or more frame periods per second. If the number of images displayed per second is less than 60, there is a possibility of flicker becoming easily visible.

During each of the display periods (Tr1 to Trn), display is performed on the basis of one-bit digital data signal in n-bit digital data signals, which one-bit digital data is inputted in one of an (n) number of writing-in periods (Ta1 to Tan) in one frame period. The writing-in period that comes first is represented by Ta1 and the subsequent writing-in periods are represented by Ta2, Ta3, . . . , Tan in order with respect to time. The corresponding display periods appear in the order of Tr1 to Trn, in each of the writing-in periods (Ta1 to Tan), one of each pair of the source signal line driver circuit and the gate signal line driver circuit.

Each pixel has one EL element. The EL element is formed of an anode, a cathode, and an EL layer interposed between the anode and the cathode. One of the anode and the cathode is called a pixel electrode, and is connected to the source region or the drain region of TFTs. The other of the anode and the cathode is called an opposing electrode, and a predetermined potential (opposing potential) is applied to the opposing electrode through a wiring.

In the present invention, each of the opposing potential and the power supply potential is always maintained at a constant level. The potential difference between the opposing potential and the power supply potential is set to such a value that the EL element produces a sufficient luminous amount when the power supply potential is applied to the pixel electrode. The power supply potential is a potential applied to the pixel electrode when the TFT connected to the pixel electrode of the EL element is in the ON state.

A digital data signal inputted to one pixel in each writing-in period selects the state of the EL element of the pixel (luminescing or non-luminescing). When a bit of the digital data signal for selecting the luminescing state is inputted to the pixel, the power supply potential is immediately applied to the pixel electrode of the EL element of the pixel, thereby causing the EL element of luminesce. On the other hand, when a bit of the digital data signal for selecting the non-luminescing state is inputted to the pixel, the pixel electrode of the EL element of the pixel is immediately disconnected from a wiring for supplying the power supply potential (called a power supply line), so that the EL element does not luminesce. The bit of digital data signal inputted to the pixel is held until the next bit of the digital data signal is inputted. In other words, the EL element of the pixel is maintained in the luminescing or non-luminescing state until the next bit of digital data signal is inputted.

Thus, when one of the writing-in periods (Ta1 to Tan) begins, and when a bit of a digital data signal is inputted, the corresponding display period (one of Tr1 to Trn) begins immediately. When the next writing-in period begins, and when another bit of the digital data signal is inputted, the display period terminates immediately. Simultaneously, the next display period begins. That is, each of the display periods (Tr1 to Trn) is determined by the time difference between the moment at which one of the writing-in periods (Ta1 to Tan) begins and the moment at which the next writing-in period begins.

As bits of the digital data signal are inputted to the pixels in the writing-in periods (Ta1 to Tan), n display periods (Tr1 to Trn) appear successively. The nth bit of the digital data signal is held in the pixel until the first bit of the digital data signal is again inputted. When the first bit of the digital data signal is again inputted, the display period Trn terminates and the frame period also terminates simultaneously.

The lengths of the display periods (Tr1 to Trn) are set so that their lengths arranged in increasing order are in proportions of $2^0:2^1:2^2: \ldots :2^{(n-2)}: \ldots :2^{(n-1)}$. Gray-scale display using desired levels in $2^n$ gray-scale levels can be performed by selecting a combination of these display periods.

The gray-scale level of one pixel in display during one frame period is determined as the total sum of the lengths of the display periods during which the corresponding EL element emits light in the frame period. For example, a case is which n=8 and display periods are set so as to appear in increasing order is considered. If the luminance of the pixel when the pixel luminesces through all the display periods is 100%, a 1% luminance can be expressed by luminescence of the pixel through the periods Tr1 and Tr2. Also, a 60% luminance can be expressed by luminescence of the pixel when the periods Tr3, Tr5, and Tr8 are selected.

In the present invention, it is possible to perform display through each pixel even in the writing-in period. Therefore, the proportion of the total sum of the lengths of the display periods in one frame (duty ratio) can be set to a higher value.

In the present invention, a pair of gate signal line driver circuits and a pair of source signal line driver circuits are provided and different gate signal line driver circuits and different source signal line driver circuits may be used with respect to each adjacent pair of the writing-in periods to enable to overlap the two writing-in periods each other. For example, the writing-in period Ta2 can begin before the end of the writing-in period Ta1. Overlapping of the writing-in periods described above enables each display period to be set so as to be shorter than the corresponding writing-in period. Consequently, an extremely short display period can be set to realize a large number of gray-scale levels.

In the present invention, it is necessary that each of the sums Tr1+Tr2, Tr2+Tr3, . . . , Trn+(initial display period Tr1 for the next frame) of the adjacent pairs of the display periods be equal to or greater than the length of the corresponding one of the writing-in periods Ta1, Ta2, . . . , Tan. Needless to say, it is also necessary that the sum of the lengths of the writing-in periods for writing with one gate signal line driver circuit is shorter than one frame period.

The above-described power supply potential and opposing potential are supplied through an IC or the like externally provided on the EL display of the present invention. In a typical EL display at present, when the luminous amount per unit area that pixel luminesces is 200 cd/m$^2$, about several mA/cm$^2$ of current is required for the unit area of the pixel portion. Therefore, if the screen size is increased, it becomes difficult to control by an external switch the level of the electric potential supplied from the power source provided to the above-mentioned IC or the like. In the present invention, the power supply potential and the opposing potential are always held at a constant level, and hence using a switch to control the level of the electric potential from the power source provided to the IC is not necessary, which makes the present invention useful in realizing a panel with a larger screen size.

The present invention will be described below with respect to the configuration thereof.

An electronic device comprising a pair of source signal line driver circuits, a pair of gate signal line driver circuits, and a pixel portion, characterized in that: the pixel portion includes a plurality of pixels; the plurality of pixels each have an EL element, a pair of EL driver TFTs, a pair of switching TFTs and a pair of eliminating TFTs; the luminescence of the EL element is controlled by the pair of EL driver TFTs; one of the pair of EL driver TFTs is controlled by one of the pair of switching TFTs and one of the pair of eliminating TFTs; the other of the pair of EL driver TFTs is controlled by the other of the pair of switching TFTs and the other of the eliminating TFTs; and gray-scale display is performed by controlling the luminescence time of the plurality of EL elements.

An electronic device comprising a first source signal line driver circuit, a second source signal line driver circuit, a first gate signal line driver circuit, a second gate signal line driver circuit, a pixel portion, a plurality of first source signal lines connected to the first source signal line driver circuit, a plurality of second signal lines connected to the second source signal line driver circuit, a plurality of first gate signal lines connected to the first gate signal line driver circuit a plurality of second gate signal lines connected to the second gate signal line driver circuit, and a power supply line, characterized in that: the pixel portion includes a plurality of pixels: the plurality of pixels each have a first switching TFT, a second switching TFT, a first eliminating TFT, a second eliminating TFT, a first EL driver TFT, a second EL driver TFT, and an EL element; a gate electrode of the first switching TFT is connected to the first gate signal line; a gate electrode of the second switching TFT is connected to the second gate signal line; one of a source region and a drain region of the first switching TFT is connected to the first source signal lines, and another thereof is connected to a gate electrode of the first EL driver TFT: one of a source region and a drain region of the second switching TFT is connected to the second source signal lines, and another thereof is connected to a gate electrode of the second EL driver TFT; a sate electrode of the first eliminating TFT is connected to the first gate signal line, a gate electrode of the second eliminating TFT is connected to the second gate signal line; one of a source region and a drain region of the first eliminating TFT is connected to the power supply line, and another thereof is connected to the gate electrode of the second FL driver TFT; one of a source region and a drain region of the second eliminating TFT is connected to the power supply line, and another thereof is connected to the gate electrode of the first EL driver TFT; one of a source region and a drain region of the first EL driver TFT is connected to the power supply line, and another thereof is connected to the EL element, and one of a source region and a drain region of the second EL driver TFT is connected to the power supply line, and another thereof is connected to the EL element The first switching TFT and the first eliminating TFT can be simultaneously turned ON or OFF, and the second switching TFT and the second eliminating TFT can be simultaneously turned ON or OFF.

The first EL driver TFT and the second EL driver TFT each can be the OFF state when the electric potential of the power supply line is applied to the gate electrode of each EL driver TFT.

There is provided an electronic device characterized in that: an (n) number of writing-in periods Ta1, Ta2, . . . , Tan and an (n) number of display periods Tr1, Tr2, . . . , Trn are provided in one frame period; the (n) number of writing-in periods Ta1, Ta2, . . . , Tan appear in the order; the (n) number of display periods Tr1, Tr2, . . . , Trn appear in the order; the time period from the moment at which one of the (n) number of writing-in periods Ta1, Ta2, . . . , Tan begins to the moment at which the writing-in period subsequent to the one of the (n) number of writing-in periods Ta1, Ta2, . . . , Tan begins corresponds to one of the display periods Tr1, Tr2, . . . , Trn; a writing-in period which appears subsequently to the writing-in period Tan is a writing-in period Ta1' which appears first in the next frame period; a display period which appears subsequently to the display period Trn is a display period Tr1' which appears first in the next frame period; the (n) number of writing-in periods Ta1, Ta2, . . . , Tan is divided into an (i) number of writing-in periods (i: an integer equal to or larger than 0 and equal to or smaller than n) and an (n−1) number of writing-in periods; in each of the (i) number of writing-in periods, digital data signals are inputted from the first source signal line driver circuit to all of the plurality of pixels through the first source signal line; in each of the (n−i) number of writing-in periods, digital data signals are inputted from the second source signal line driver circuit to all of the plurality of pixels through the second source signal line: in each of the (i) number of writing-in periods, the digital data signals inputted from the second source signal line driver circuit before the (i) number of writing-in periods are erased from all of the plurality of pixels: in each of the (n−i) number of writing-in periods, the digital data signals inputted from the first source signal line driver circuit before the (n−i) number of writing-in periods are erased from all of the plurality of pixels; adjacent pairs (Ta1, Ta2), (Ta2, Ta3), . . . , (Ta(n−1), Tan), (Tan, Ta1') between the group of the (n) number of writing-in periods Ta1, Ta2, ..., Tan and the subsequent group of the (n) number of writing-in periods Ta2, Ta3, ..., Ta1' are divided into a group of a (j) number of adjacent pairs of writing-in periods (j: an integer equal to or greater than 0 and equal to or smaller than (n−1)) and an (n−j) number of adjacent pairs of writing-in periods; in each of the (j) number of adjacent pairs of writing-in periods, the two writing-in periods overlap each other; in each of the (n−j) number of adjacent pairs of writing-in periods, the two writing-in periods do not overlap each other; in one writing-in period in each of the (j) number of adjacent pairs of writing-in periods, the digital data signals are inputted from the first source signal line driver circuit to all of the plurality of pixels and, in the other writing-in period, the digital data signals are inputted from the second source signal line driver circuit to all of the plurality of pixels;

in each of the (n) number of writing-in periods Ta1, Ta2, ..., Tan, one of a luminescing state and a non-luminescing state of the EL element of each of the plurality of pixels is selected by the digital data signal inputted to the plurality of pixels; in each of the (n) number of display periods Tr1, Tr2, ..., Trn, the EL element of each of the plurality of pixels is set in one of the luminescing state and the non-luminescing state according to the digital data signal; in each of an (m) number of display periods (m: an integer equal to or larger than 0 and equal to or smaller than n) in the (n) number of display periods Tr1, Tr2, ..., Trn, all of the EL elements of the plurality of pixels are set in the non-luminescing state; and the length of each of the sums Tr1+Tr2, Tr2+Tr3, ..., Trn+Tr1' of the lengths of adjacent pairs between the group of the (n) number of display periods Tr1, Tr2, ..., Trn and the subsequent group of the (n) number of display periods Tr2, Tr3, ..., Tr1' is equal to or longer than the length of the writing-in periods Ta1, Ta2, ..., Tan.

The proportions of the lengths of the (n−m) number of display periods may coincide with the proportions of the lengths of an (n−m) number of periods defined by dividing a (k) number of periods T1, T2, ..., Tk (k: an integer equal to or larger than 1 and equal to or smaller than (n−m)) a (n−m−k) number of times: and if the (k) number of periods T1, T2, ..., Tk are arranged in increasing order of length, the proportions of the lengths of the (k) number of periods T1, T2, ..., Tk may be expressed by $2^0:2^1:2^{(k-1)}$.

The two writing-in periods in at least one of the adjacent pairs of the (n) number of writing-in periods (Ta1, Ta2), (Ta2, Ta3), ..., (Tan, Ta1') may overlap each other.

All the EL elements of the plurality of pixels may be set in the non-luminescing state in at least one of the (n) number of display periods Tr1, Tr2, ..., Trn.

None of the (n) number of display periods Tr1, Tr2, ..., Trn may be set as a period in which all the EL elements of the plurality of pixels are set in the non-luminescing state.

The lengths of the (i) number of writing-in periods may be equal to each other; and the length of the (n−i) number of writing-in periods may be equal to each other.

All the lengths of the (n) number of writing-in periods Ta1, Ta2, ..., Tan may be equal to each other.

The (i) number of writing-in periods and the (n−i) number of writing-in periods may appear alternately.

If the (n−m) number of display periods are arranged in increasing order of length, the proportions of the lengths of the (n−m) number of display periods can be expressed by $2^0:2^1:2^{(n-m-1)}$.

The source signal line driver circuit is formed on the same substrate as the pixel portion, and the drive frequency may be 10 MHZ or more.

The EL element may have a pixel electrode, an opposing electrode, and an EL layer interposed between the pixel electrode and the opposing electrode.

The opposing electrode may be maintained at a constant potential: and the power supply line may be maintained at a constant potential.

The EL layer may be a low molecular type organic material or a polymer organic material.

The low molecular type organic material may comprise $Alq_3$ (tris-8-quinolilite-aluminum) or TPD (triphenylamine derivative).

The polymer organic material may comprise PPV (polyphenylene vinylene), PVK (polyvinyl carbazole), or polycarbonate.

There is provided an EL display device characterized in that the electronic device is used.

There is provided a video camera characterized in that the electronic device is used.

There is provided a head-mount type EL display device characterized in that the electronic device is used.

There is provided a DVD player characterized in that the electronic device is used.

There is provided a head-mount display characterized in that the electronic device is used.

There is provided a personal computer characterized in that the electronic device is used.

There is provided a portable telephone characterized in that the electronic device is used.

There is provided a car audio characterized in that the electronic device is used.

BRIEF DESCRIPTION OF THE DRAWINGS

In the accompanying drawings:

FIGS. 21A to 21E are diagrams showing a manufacturing process of the EL display of the present invention;

FIGS. 23A to 23C are diagrams showing a manufacturing process of the EL display of the present invention;

DETAILED DESCRIPTION OF THE PREFERRED EMBODIMENTS

Hereinafter, a description of a structure and a driving method of an EL display of the present invention will be made. The case of performing $2^n$ gray-scale display by an n-bit digital data signal will be explained here.

Figure 1:
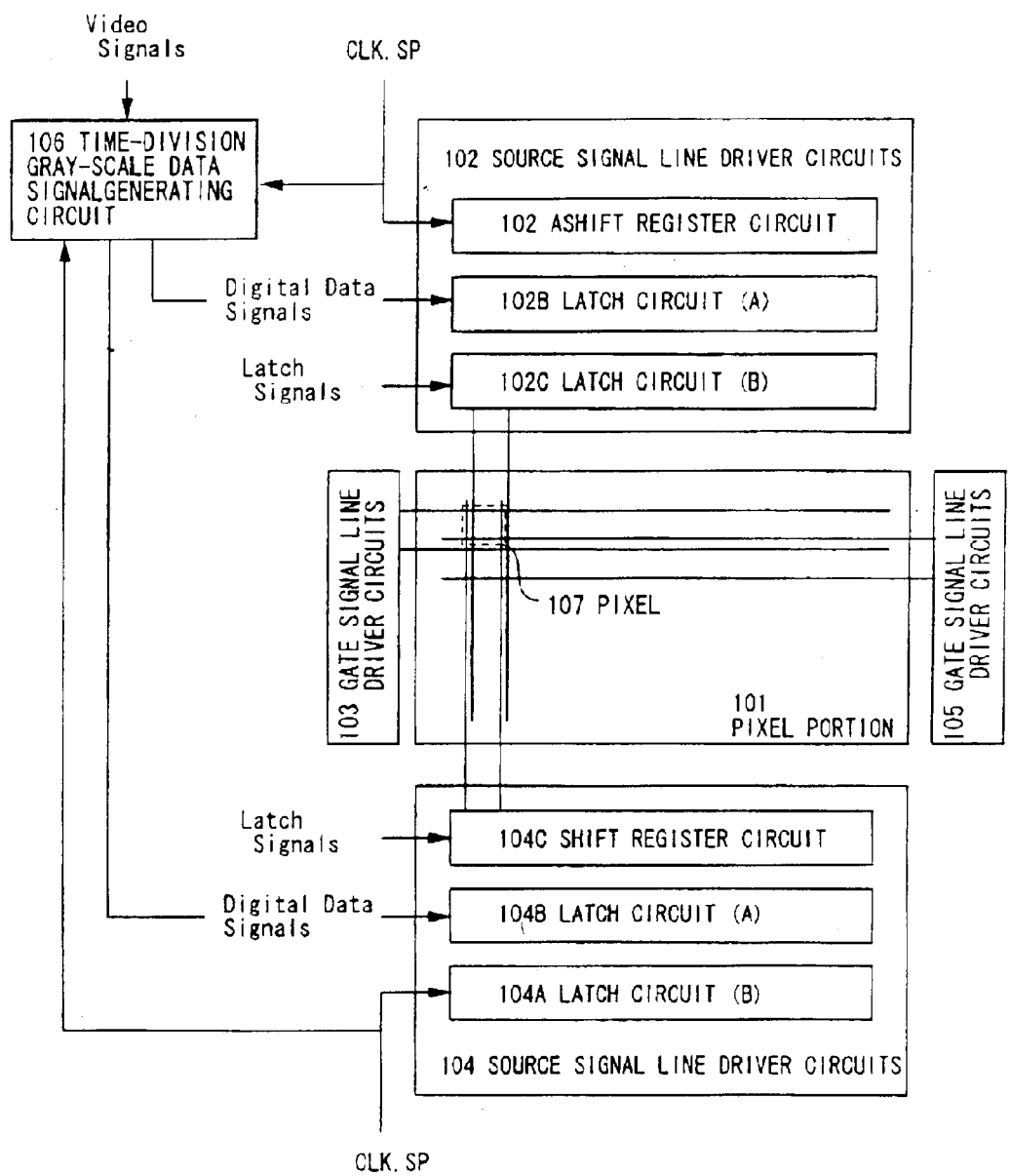
FIG. 1 is a diagram showing a circuit structure of an EL display of the present invention.

FIG. 1 is a block diagram showing an example of an EL display of the present invention. The EL display of FIG. 1 comprises a pixel portion 101, a pair of source signal line driver circuits 102, 104 arranged in the periphery of the pixel portion 101, and a pair of gate signal line driver circuits 103, 105 by TFTs formed on a substrate.

The first source signal line driver circuit 102 is composed of a shift register circuit 102a, a latch circuit (A) 102b, a latch circuit (B) 102c and the like. Similarly, the second source signal line driver circuit 104 is composed of a shift register circuit 104a, a latch circuit (A) 104b, a latch circuit (B) 104c and the like.

In the first source signal line driver circuit 102, a clock signal (CLK) and a start pulse (SP) are inputted to the shift register circuit 102a. The shift register circuit 102a sequentially generates timing signals on the basis of the clock signal (CLK) and the start pulse (SP) to thereby sequentially feed the timing signals to downstream circuits through a buffer (not shown) or the like. Similarly, in the second source signal line driver circuit 104, a clock signal (CLK) and a start pulse (SP) are inputted to the shift register circuit 104a. The shift register circuit 104a sequentially generates timing signals on the basis of the clock signal (CLK) and the start pulse (SP) to thereby sequentially feed the timing signals to downstream circuits through a buffer (not shown) or the like. A common clock signal and a common start pulse may be provided as clock signals (CLK) and start pulses (SP) to be inputted to the pair of source signal line driver circuits (102, 104), or clock signals (CLK) and start pulses (SP) may be separately provided.

In each of the pair of source signal line driver circuits (102, 104), the timing signals from the shift registers (102a, 104a) are current-amplified by a buffer or the like. A large number of circuits or elements are connected to the wiring through which the timing signals are fed, so that the load capacitance (including parasitic capacitance) due to those circuits or elements is large. The buffer is provided to prevent the sharpness of the rise or fall of the timing signals from being reduced by this large load capacitance.

The timing signals current-amplified by the buffer circuit are then fed to the latch circuit (A) 102b. The latch circuit (A) 102b has plural stages of latch circuits for processing n-bit digital data signals. The latch circuit (A) 102b sequentially takes in and holds the n-bit digital data signals fed from a time-division gray-scale data signal generating circuit 106 upon input of the timing signals.

The time necessary to complete writing of the digital data signals into all the stages of the latch circuits of the latch circuit (A) 102b is called a line term. In other words, the line term is defined as a time interval from the start of writing the digital data signals into the latch circuit of the leftmost stage to the end of writing the digital data signals into the latch circuit of the rightmost stage in the latch circuit (A) 102b.

Note that the digital data signals may be sequentially fed to the plural stages of the latch circuits of the latch circuit (A) 102b when the digital data signals are taken in by the latch circuit (A) 102b. However, the present invention is not limited to this structure. A so-called division drive may be performed in one or both of the pair of the source signal line driver circuits 102, 104, that is, the plural stages of latch circuits of the latch circuit (A) 102b is divided into a number of groups and then the digital data signals are parallely fed to the respective groups at the same time. It is to be noted that the number of groups at this point is called a division number. For example, if the latch circuits are grouped into 4 stages each, then it is called a 4-branch division drive.

After the completion of one line term, a latch signal is fed to the latch circuit (B) 102c. In this moment, the digital data signals written in and held by the latch circuit (A) 102b are sent all at once to the latch circuit (B) 102c to be written in and held by all the stages of latch circuits thereof.

Sequential writing-in of digital data signals newly fed from the time-division gray-scale data signal generating circuit 106 on the basis of the timing signals from the shift register circuit 102a is again carried out to the latch circuit (A) 102b after it has completed sending the digital data signals to the latch circuit (B) 102c.

During this second time one line term, the digital data signals written in and held by the latch circuit (B) 102b are inputted to source signal lines.

In the second source signal line driver circuit 104, the same steps as those performed in the first source signal line driver circuit 102 are performed. First, the timing signals current-amplified by the buffer are fed to the latch circuit (A) 104b. Receiving the timing signals, the latch circuit (A) 104b sequentially takes in and holds n-bit digital data signals fed from the time-division gray-scale data signal generating circuit 106. When the latch circuit (A) 104b takes in digital data signals, the digital data signals may be successively inputted to plural latch stages of the latch circuit (A) 104b, or a so-called division drive may be performed, that is, plural latch stages of the latch circuit (A) 104b are divided into a number of groups and digital data signals are simultaneously fed in parallel with each other to the groups of the latch stages. After the completion of one line term, a latch signal is fed to the latch circuit (B) 104c. In this moment, the digital data signals written in and held by the latch circuit (A) 104b are sent all at once to the latch circuit (B) 104c to be written in and held by all the latch stages thereof. Sequential writing-in of digital data signals newly fed from the time-division gray-scale data signal generating circuit 106 is again performed on the basis of the timing signals from the shift register circuit 104a to write the data signals to the latch circuit (A) 104a after the latch circuit (A) 104b has completed sending the previously-written digital data signals to the latch circuit (B) 104c. In this second one line term, the digital data signals written in and held by the latch circuit (B) 104c are outputted to source signal lines.

In the this embodiment mode, the pair of source signal line driver circuits (102, 104) have the latch circuits (A) (102b, 104b) and the latch circuits (B) (102c, 104c), respectively, and the digital data signals held by the latch circuits are simultaneously fed to the source signal lines (for line-sequential drive). However, the present invention is not limited to this structure. In one or both of the pair of the source signal line driver circuits 102 and 104, a plurality of transmission gate stages for processing n-bit digital data signals may be provided instead of the latch circuits (A) and (B). In such a case, the transmission gate in each stage is connected to the shift register circuit, to the time-division gray-scale data signal generating circuit 106 and to one of the source signal lines. When the timing signal from the shift register circuit is inputted to the transmission gate in each stage, the digital data signal from the time-division gray-scale data signal generating circuit 106 is fed to the source signal line through the transmission gate. The timing signals from the shift register circuit are successively inputted to the transmission gate stages to be successively fed to the source signal lines connected to the transmission gate stages. After the timing signals from the shift register circuits have been input to all the transmission gate stages to complete feeding of the digital data signals to the source signal lines, the transmission gate stages again transmit, on the basis of the timing signals from the shift register circuit, digital data signals fed from the time-division gray-scale data signal generating circuit 106 to the source signal lines. In the case where a plurality of transmission gate stages are provided instead of the latch circuits (A) and (B), so-called dot-sequential drive is performed by successively feeding digital data signals to the source signal lines. A level shifter circuit, a buffer circuit or the like may be provided between the shift register circuit and the transmission gates.

On the other hand, the first gate signal line driver circuit 103 and the second gate signal line driver circuit 105 are composed of a shift register circuit and a buffer circuit (both not shown in the figure), respectively. Depending on the situation, the first gate signal line driver circuit 103 and the second gate signal line driver circuit 105 may have a level shifter circuit.

In the gate signal line driver circuit 103 and the gate signal line driver circuit 105, the timing signals from the shift register (not shown in the figure) are fed to the buffer circuit (not shown in the figure) to be fed to corresponding gate signal lines (also referred to as scanning lines). The gate signal lines are connected to the gate electrodes of the pixel TFTs of one line and all the pixel TFTs of one line have to be turned ON simultaneously, requiring the use of a buffer circuit with a large electric current capacity.

In the time-division gray-scale data signal generating circuit 106, analog or digital video signals (signals containing image information) are converted to digital data signals for performing time-division gray-scale and fed to the latch circuits (A) 110b and 104b. The time-division gray-scale data signal generating circuit 106 is also a circuit for generating signals such as a timing pulse that is necessary for performing time-division gray-scale display.

The time-division gray-scale data signal generating circuit 106 may be provided outside the EL display of the present invention. In this case, it becomes a structure in which the digital data signals generated by the time-division gray-scale data signal generating circuit 106 are fed to the EL display of the present invention. Hence, the EL display of the present invention and the time-division gray-scale data signal generating circuit are included as separate components of an electronic equipment having the EL display of the present invention as its display portion.

The time-division gray-scale data signal generating circuit 106 may also take the form of an IC chip or the like and be incorporated in the EL display. In this case, it becomes a structure in which the digital data signals formed by the IC chip are fed to the EL display of the present invention. Thus, the EL display of the present invention incorporating the IC chip containing the time-division gray-scale data signal generating circuit is included as a component of the electronic equipment having the EL display of the present invention as its display portion.

Finally, the time-division gray-scale data signal generating circuit 106 that is formed by using a TFT may be formed on the same substrate as the pixel portion 101, the pair of the source signal line driver circuit (102, 104), and the pair of the gate signal line driver circuit (103, 105). The video signals containing image information that are fed to the EL display can all be processed on the substrate in this case. The time-division gray-scale signal generating circuit in this case may be formed of a TFT using a poly-silicon film as an active layer. Furthermore, in the electronic equipment having the EL display of the present invention as its display portion in this case, the time-division gray-scale signal generating circuit is incorporated into the EL display itself, thereby making it possible to manufacture smaller electronic equipments.

Figure 2:
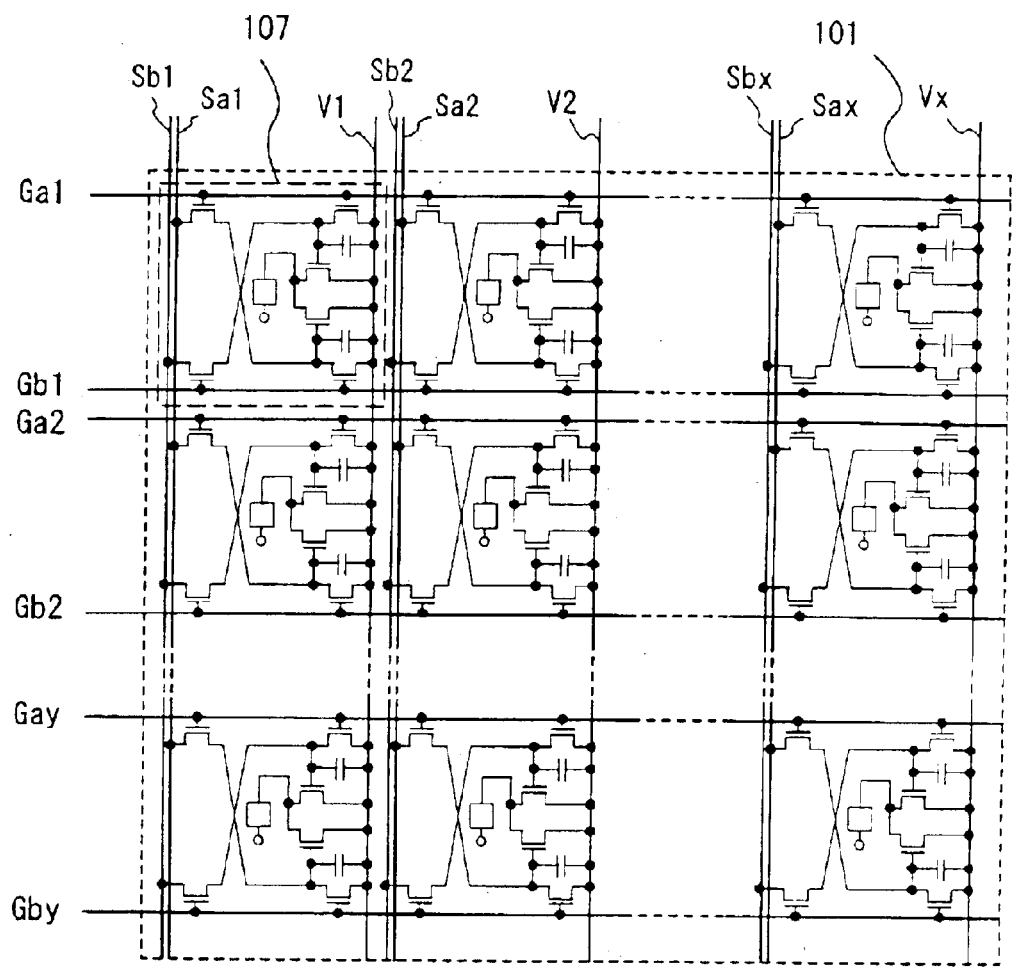
FIG. 2 is a diagram showing a circuit configuration of a pixel portion of the EL display of the present invention.

An enlarged view of the pixel portion 101 is shown in FIG. 2. Provided in the pixel 107 are source signal lines (Sa1 to Sax) connected to the latch circuit (B) 102c of the first source signal line driver circuit 102, source signal lines (Sb1 to Sbx) connected to the latch circuit (B) 104c of the second source signal line driver circuit 104, power supply lines (V1 to Vx) connected to an external power source of the EL display via the FPC, gate signal lines (Ga1 to Gay) connected to the first gate signal line driver circuit 103, and gate signal lines (Gb1 to Gby) connected to the second gate signal line driver circuit 105.

The pixel 107 is the region comprised of the source signal lines (Sa1, Sb1), the power supply line (V1), and the gate signal lines (Ga1, Gb1). In the pixel portion 101, pixels such as the pixel 107 are arranged in matrix.

Figure 3:
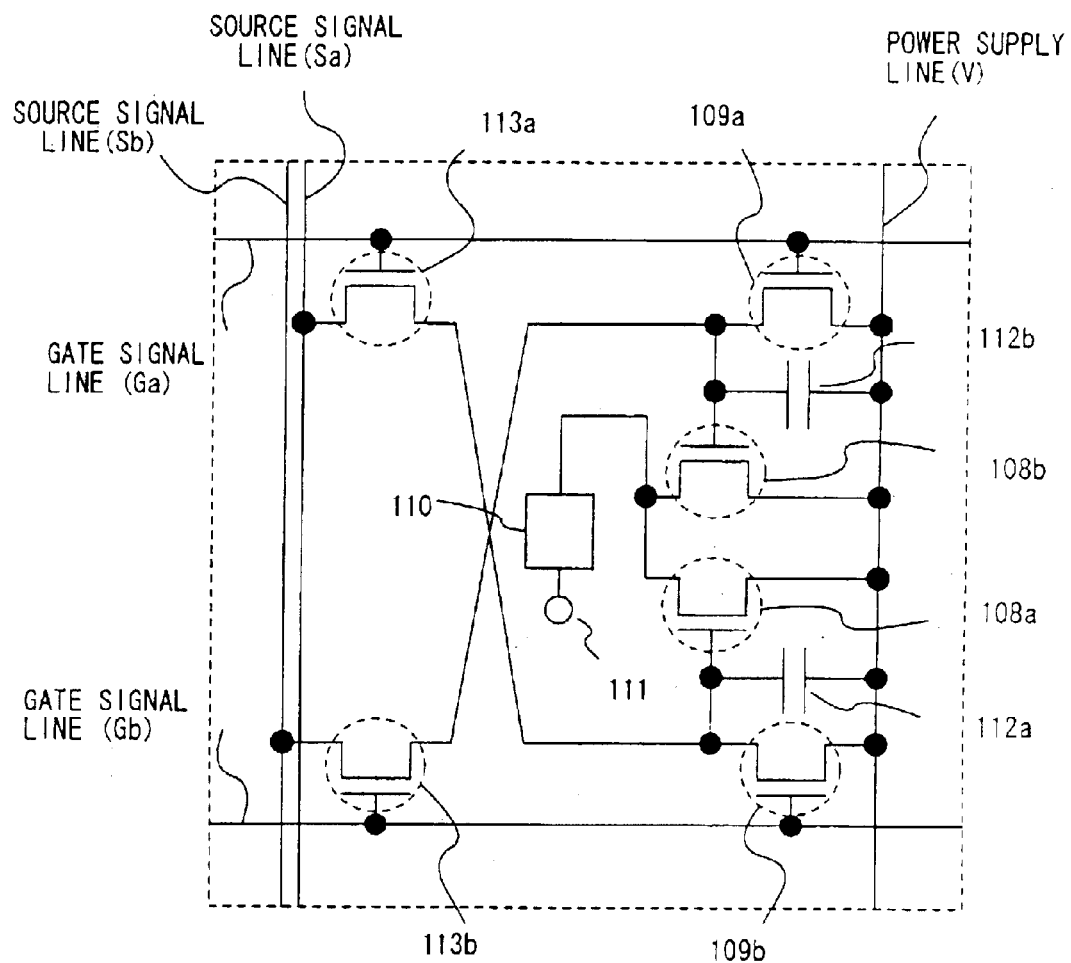
FIG. 3 is a diagram showing a circuit configuration of a pixel of the EL display of the present invention.

Shown in FIG. 3 is an enlarged view of the pixel 107. In FIG. 3, reference numerals 113a, 113b denote switching TFTs. Gate electrodes of the switching TFTs 113a, 113b are connected to the gate signal line Ga and Gb, respectively. As to a source region and a drain region of the switching TFT 113a, one is connected to the source signal line Sa whereas the other is connected to a gate electrode of an EL driver TFT 108a, a capacitor 112a of each of the pixels, and either a source region or a drain region of an eliminating TFT 109b, respectively. Further, as to a source region and a drain region of the switching TFT 113b, one is connected to the source signal line Sb whereas the other is connected to a gate electrode of an EL driver TFT 108b, a capacitor 112b of each of the pixels, and either a source region or a drain region of an eliminating TFT 109a, respectively.

The capacitors 112a and 112b are provided for holding gate voltages of the EL driver TFTs 108a and 108b when the switching TFTs 113a, 113b are in a non-selected state (OFF state). Note that although this embodiment mode shows a structure with the provision of the capacitors 112a, 112b, the present invention is not limited to this structure and may take a structure without the provision of one or both of the capacitors 112a and 112b.

As to the source regions and drain regions of the eliminating TFTs 109a and 109b, the one not connected to the source region or the drain region of the switching TFTs 113a, 113b is connected to the power supply lines V. Gate electrodes of the eliminating TFTs 109a and 109b are connected to the gate signal lines Ga and Gb, respectively.

As to a source region and a drain region of the EL driver TFTs 108a, 108b, one is connected to the power supply line V whereas the other is connected to an EL element 110. The power supply lines V (V1 to Vx) are connected to the capacitors 112a and 112b.

The EL element 110 is composed of an anode, a cathode, and an EL layer sandwiched therebetween. In the case where the anode is connected to the source region or the drain region of the EL driver TFTs 108a, 108b, the anode becomes a pixel electrode and the cathode becomes an opposing electrode. Conversely, if the cathode is connected to the source region or the drain region of the EL driver TFTs 108a, 108b, the cathode becomes the pixel electrode while the anode becomes the opposing electrode.

An opposing potential is applied to the opposing electrode of the EL element 110 and a power supply potential is applied to the power supply lines V. Each of the opposing potential and the power supply potential is always maintained at a constant level. The potential difference between the opposing potential and the power supply potential is set to such a level that the EL element produces a sufficient luminous amount when the power supply potential is applied to the pixel electrode. To supply the power supply potential and the opposing potential, power is given through an IC or the like external to the EL display of the present invention.

In a typical EL display at present, when the luminous amount of an area that the pixel luminesces is 200 cd/m$^2$, about several mA/cm$^2$ of current is required for the area of the pixel portion. Therefore, particularly as a screen size becomes larger, it becomes more difficult to control the level of the electric potential imparted from the power source provided to the IC with an external switch. In the present invention, the power supply potential and the opposing electric potential are always held at a constant level and hence using a switch to control the level of the electric potential imparted from the power source provided to the IC is not necessary, which makes the present invention useful in realizing a panel with a larger screen size.

In the present invention, it is necessary that each of the EL driver TFTs 108a and 108b be off when the power supply potential is applied to the gate electrode.

Either an N channel TFT or a P channel TFT can be used to form the switching TFTs (113a, 113b), the EL driver TFTs (108a, 108b), and the eliminating TFTs (109a, 109b). In addition, the switching TFT (113a, 113b), the EL driver TFT (108a, 108b), and the eliminating TFT (109a, 109b) do not have to be composed of a single gate structure, and may have a multi-gate structure such as a double gate structure or a triple gate structure.

Figure 4:
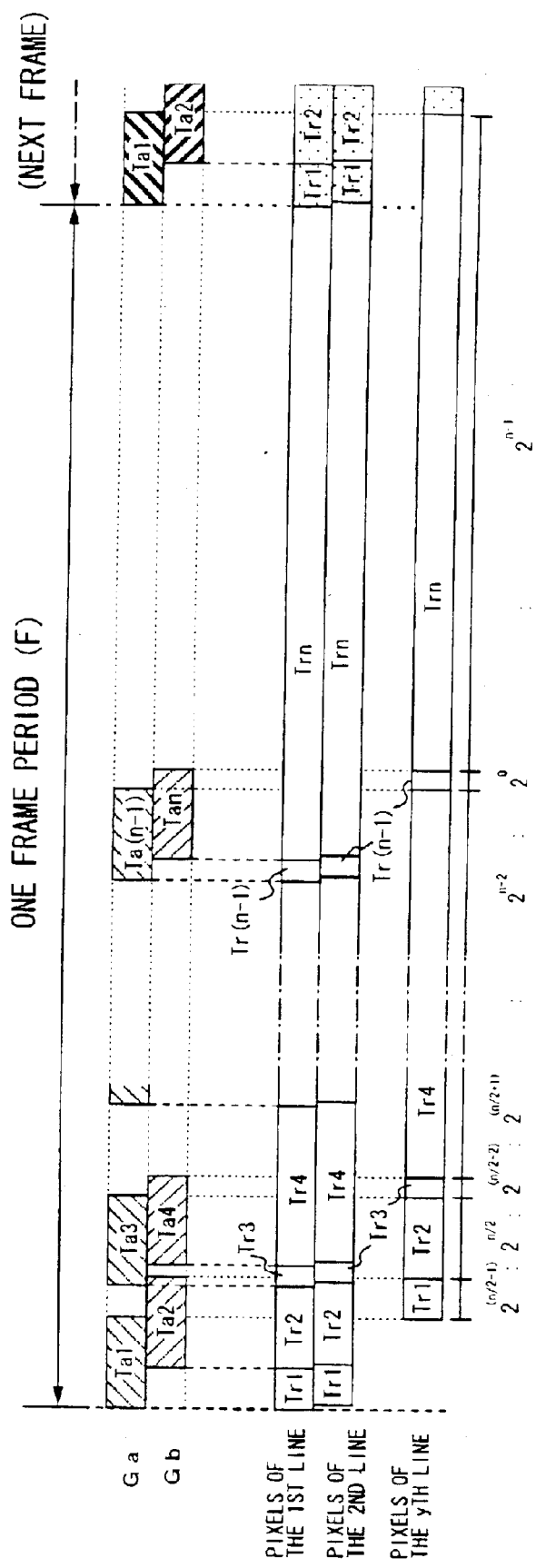
FIG. 4 is a diagram illustrating a driving method of the EL display of the present invention.

A method of driving the EL display of the present invention having the above-described structure will be described with reference to FIG. 4. A method for display using $2^n$ gray-scale levels will be described below as an example of the driving method of the present invention by referring to reference symbols in FIGS. 1 through 3.

A gate signal from the first gate signal line driver circuit 103 is first fed to the writing-in gate signal line Ga1. As a result, the switching TFTs 113a and the eliminating TFT 109a of all the pixels (pixels of the first line) connected to the gate signal line Ga1 are turned to the ON state.

And at the same time, the first bit of the digital data signal from the latch circuit (B) 102c of the source signal line driver circuit 102 is fed to the source signal lines (Sa1 to Sax). The digital data signal is fed to the gate electrode of the EL driver TFT 108a through the switching TFT 113a. A digital data signal has the information "0" or "1", where one has a "Hi" voltage while the other has a "Lo" voltage.

Also, simultaneously, the power supply potential of the power supply lines (V1 to Vx) is applied to the gate electrode of the EL driver TFT 108b through the eliminating TFT 109a, thereby turning OFF the EL driver TFT 108b.

In this embodiment mode, when the digital data signal has the "0" information, the EL driver TFT 108a is in the OFF state. The EL driver TFT 108b is also in the OFF state. Under this condition, the power supply potential is not applied to the pixel electrode of the EL element 110. Consequently, the EL element 110 of the pixel to which the digital data signal with the "0" information is fed does not emit light.

Conversely, when the digital data signal has the "1" information, the EL driver TFT 108a is in the ON state, and hence the power supply potential is applied to the pixel electrode of the EL element 110 regardless of the state (ON or OFF) of the EL driver TFT 108b. As a result, the EL element 110 of the pixel to which the digital data signal with the "1" information is fed emits light.

Thus, the EL element 110 either emits light or not upon input of the digital data signal to each first-line pixel, whereby the first-line pixels perform display.

Simultaneously with the completion of feeding of the gate signal to Ga1, another gate signal from the first gate signal line driver circuit 103 is fed to the gate signal line Ga2. At this time, all the switching TFTs 113a and the eliminating TFTs 109a connected to the gate signal line Ga2 are thereby turned ON to input the first bits of the digital data signals from the source signal lines (Sa1 to Sax) to the second-line pixels. The EL elements of the second-line pixels are thereby set selectively in the luminescing state or the non-luminescing state, whereby the second-line pixels perform display.

Thereafter, gate signals are successively fed to the other gate signal lines (Ga3 to Gay). The time period in which all the gate signal lines (Ga1 to Gay) are selected and the first bits of digital data signals are inputted to the pixels in all the lines is a writing-in period Ta1.

In the writing-in period Ta1, the pixels in each line perform display upon input of the first bits of the digital data signals. The first bit of the digital data signal inputted to each pixel in each line is held until the next digital data signal, i.e. the second bit of the digital data signal, is inputted in a writing-in period Ta2. The time period during which the pixels in each line perform display on the basis of the first bits of the digital data signals is called a display period Tr1. FIG. 4 shows the display period Tr1 during which the pixels in each of the first, second, and yth lines perform display. The display period Tr1 for each line begins with a certain delay from the display period Tr1 or the preceding line.

Before the end of the writing-in period Ta1, the writing-in period Ta2 begins. In other words, before the first bits of the digital data signals are inputted to the pixels in all the lines, a gate signal from the second gate signal driver circuit 105 is fed to the gate signal line Gb1. In this event, inputting of the second bits of the digital data signals is performed in parallel with inputting of the first bits of the digital data signals to the pixels. With respect to the writing-in period Ta2, the circuit other than the first gate signal line driver circuit 103 used with respect to the writing-in period Ta1 in the pair of gate signal line driver circuits, i.e., the second gate signal line driver circuit 105, is used. In this embodiment mode (FIG. 4), the writing-in period Ta2 begins before the end of the writing-in period Ta1. The present invention, however, is not limited to this. That is, the same driving method can be used regardless of whether the time at which the writing-in period Ta2 begins is before or after the end of the writing-in period Ta1.

When the gate signal is fed to the gate signal line Gb1, the switching TFTs 113b and the eliminating TFTs 109b of all the pixels (first-line pixels) connected to the gate signal line Gb1 are turned ON. Simultaneously, the second bits of the digital data signals from the latch circuit (B) 104c of the second source signal line driver circuit 104 are fed to the source signal lines (Sb1 to Sbx). Each digital data signal is fed to the gate electrode of the EL driver TFT 108b through the switching TFT 113b. The digital data signal has information "0" or "1", where one has a "Hi" voltage while the other has a "Lo" voltage. Also, the power supply potential of the power supply lines (V1 to Vx) is applied to the gate electrode of the EL driver TFT 108a through the eliminating TFT 109b, thereby turning OFF the EL driver TFT 108a.

The EL element 110 is set selectively in the luminescing state or the non-luminescing state upon input of the digital data signal to each first-line pixel, as is the EL element 110 in the writing-in period Ta1. Thus, the first-line pixels perform display.

Thereafter, gate signals are successively fed to the other gate signal lines (Gb2 to Gby). The time period in which all the gate signal lines (Gb1 to Gby) are selected and the second bits of the digital data signals are inputted to the pixels in all the lines is called writing-in period Ta2.

In the writing-in period Ta2, when the second bit of the digital data is inputted to each of the pixels in each line, the first bit of the digital data signal previously held is replaced by the second bit of the digital data signal newly written. The pixels in each line thus perform display. That is, the display period Tr1 ends and a display period Tr2 begins. The second bit of the digital data signal is held in each pixel in each line until the next digital data signal, i.e., the third bit of the digital data signal, is inputted in a writing-in period Ta3. The display period Tr2 for each line begins with a certain delay from the display period Tr2 for the preceding line (see FIG. 4).

Similarly, the next writing-in period Ta3 begins. In this embodiment mode (FIG. 4), the writing-in period Ta3 begins before the end of the writing-in period Ta2. With respect to the writing-in period Ta3, the circuit other than the second gate signal line driver circuit 105 used with respect to the writing-in period Ta2 of the pair of gate signal line driver circuits, i.e., the first gate signal line driver circuit 103, is used. The same driving method can also be used in a case where the writing-in period Ta3 begins after the end of the writing-in period Ta2. All the gate signal lines (Ga1 to Gas) are successively selected and the third bits of the digital data signals are inputted to all the pixels. The time period in which the third bits of the digital data signals are inputted to the pixels in all the lines is called writing-in period Ta3.

In the writing-in period Ta3, when the third bit of the digital data signal is inputted to each of the pixels in each line, the second bit of the digital data signal previously held is replaced by the third bit of the digital data signal newly written. The pixels in each line thus perform display. That is, the display period Tr2 ends and the display period Tr3 begins. The third bit of the digital data signal is held in each pixel in each line until following the fourth bit of the digital data signal, is inputted in a writing-in period Ta4. The display period Tr3 for each line begins with a certain delay from the display period Tr3 for the preceding line (see FIG. 4).

The above-described operation is repeatedly performed until the nth bits of the digital data signals are inputted to the pixels. Consequently, the display periods (Tr1 to Trn) appear successively in order (see FIG. 4). The nth bit of each digital data signal is held in the pixel until the first bit of the digital data signal is again input. When the first bit of the digital data signal is again input to the pixel, the display period Trn ends. At this time, the frame period also ends. At the end of the group of display periods (Tr1 to Trn), display of one image is completed. The period in which one image is displayed in the driving method of the present invention is called a frame period (F). Each of the display periods (Tr1 to Trn) is the time period from the moment at which the corresponding writing-in period (one of Ta1 to Tan) begins to the moment at which the next writing-in period begins. Thus, each of the display periods (Tr1 to Trn) is determined by the difference between the beginning times of the corresponding pair of the writing-in periods (Ta1 to Tan).

Thus, after the completion of one frame period, a gate signal from the first gate signal line driver circuit 103 is again fed to the gate signal line Ga1. As a result, the first bit of digital data signal is fed to the pixels and the pixels of the first line again become the display period Tr1. The above-described operation is thus repeated.

The provision of 60 or more frame periods per second in a normal EL display is preferred. If less than 60 images are displayed in one second, the flickering of the images will be conspicuous.

The lengths of the display periods (Tr1 to Trn) are set so that their lengths arranged in increasing order are in proportions of $2^0:2^1:2^2: \ldots :2^{(n-2)}: \ldots :2^{(n-1)}$. Gray-scale display using desired levels in 2n gray-scale levels can be performed by selecting a combination of these display periods. In this embodiment mode (FIG. 4), the set of display periods (Tr1 to Trn) (n: even number) arranged in increasing order of lengths is Tr(n−1), Tr(n−3), Tr(n−5), ..., Tr1, Tr2, Tr4, Tr6, ..., Trn. That is, in this embodiment mode (FIG. 4), the display periods (Tr1 to Trn) are set so that Tr(n−1) Tr(n−3):Tr(n−5): . . . :Tr1:Tr2:Tr 4:Tr6: . . . :Trn= $2^0:2^2:2^2: \ldots :2^{(n/2-1)}:2^{(n/2)}:2^{(n/2+1)}:2^{(n/2+2)}:2^{(n-1)}$.

The gray-scale level of one pixel in display during one frame period is determined by the total sum of the lengths of the display periods during which the corresponding EL element emits light in the one frame period. For example, if n=8 in this embodiment mode (FIG. 4), the lengths of display periods (Tr1 to Tr8) are set so that Tr1:Tr2:Tr3:Tr4:Tr5:Tr6:Tr7:Tr8=$2^3:2^4:2^5:2^1:2^6:2^0:2^7$. In this case, if the luminance of the pixel when the pixel luminesces through all the display periods is 100%, a 13% luminance can be expressed by luminescing of the pixel through the periods Tr4 and Tr5. Also, a 58% luminance can be expressed by luminescing of the pixel when the periods Tr2, Tr3, and Tr8 are selected.

By adopting the above structure, the present invention is capable of suppressing the variations in the amount of current flow outputted when equivalent gate voltages, are applied even if there is a slight variation in the TFTs. As a result, the situation in which the occurrence of a vast difference between the luminous amount of or the EL element with that of an adjacent pixel caused by the variation of the TFT characteristic even if the signals having equivalent voltages are fed, may be avoided.

The writing-in periods for writing with the same gate signal line driver circuit are equal in length. In this embodiment mode (FIG. 4), Ta1=Ta3= . . . =Ta(n−1) and Ta2=Ta4= . . . =Tan are established since the writing-in periods (Ta1 to Tan) are alternately assigned to the pair of gate signal driver circuits. The lengths of the writing-in periods with respect to the different gate signal line driver circuits may be equal or different. In a case where the pair of gate signal line driver circuits have the same driver-circuit configuration and uses a common clock signal (CLK) and a common start pulse (SP), the lengths of the writing-in periods corresponding to the different gate signal line driver circuits are equal to each other. On the other hand, in a case where the pair of gate signal line driver circuits differ in driver circuit configuration (having different dividing numbers, or the like) or use different clock signals (CLK) and different start pulses (SP), the writing-in periods using the different gate signal line driver circuits can be set to different lengths.

In the present invention, it is necessary that each of the sums Tr1+Tr2, Tr2+Tr3, . . . , Trn+(initial display period Tr1 for the next frame) of the adjacent pairs or the display periods be equal to or greater than the length of the corresponding one of the writing-in periods Ta1, Ta2, . . . , Tan. For example, if all the writing-in periods in this embodiment mode (FIG. 4) are equal (Ta), it is necessary that Tr2+Tr3 corresponding to the smallest value of the sums of the adjacent pairs of the display periods be equal to or greater than the writing-in period Ta. More specifically, if n=8, the sum Tr2+Tr3 of the display periods is (one frame period)× $(2^4+2^2)/(2^0+2^1+ \ldots +2^7)$ and it is therefore necessary that the length of the writing-in period Ta be equal to or smaller than (one frame period)×20/255. It is also necessary that the sum of the lengths of the writing-in periods for writing with the same gate signal line driver circuit be shorter than one frame period.

The display periods (Tr1 to Trn) may appear in any order. For example, the display periods can appear in the order of Tr1, Tr3, Tr5, Tr2, . . . in one frame period. However, it is necessary that the sum Tri+Trj (where i and j are different integers equal to or greater than 1 and equal to or smaller than n) of each adjacent pair of the display periods be equal to or greater than the length of the writing-in period Tai corresponding to the preceding display period Tri.

In this embodiment mode (FIG. 4), n is assumed to be an even number for ease of explanation. However, needless to say, the present invention is not limited to this.

In this embodiment mode (FIG. 4), each of the writing-in periods Ta2 and Ta3 begins before the end of the preceding writing-in period Ta1 or Ta2. However, the present invention is not limited to this. Each of the adjacent pairs of the writing-in periods may overlap or not overlap each other. The results of setting of the display periods (Tr1 to Trn) and the length of the writing-in periods (Ta1 to Tan) determine the overlapping or non-overlapping state of the adjacent pair of writing-in periods.

In this embodiment mode (FIG. 4), for ease of explanation, it is assumed that the pair of gate signal line driver circuits are alternately used with respect to the writing-in periods (Ta1 to Tan). However, the present invention is not limited to this. In the present invention, if there is no overlap in each of the adjacent pairs of the writing-in periods, two gate signal line driver circuits or one gate signal line driver circuit may be used for drive during the adjacent pair of writing-in periods. On the other hand, if there is an overlap in the adjacent pairs of the writing-in periods in the present invention, it is necessary to use separate gate signal line driver circuits with respect to the two overlapping writing-in periods.

In the present invention, a display period during which none of the pixels luminesces may be set by adding a writing-in period with a digital data signal for selecting the non-luminescing state of the EL elements in all the pixels (a digital data signal always having "0" information in this embodiment mode) other than the n-bit digital data signal necessary for $2^n$ gray-level display. Such writing-in and display periods are called a non-luminescing writing-in period and a non-luminescing display period, respectively. In the case of the conventional analog drive, the EL elements luminesce continuously when the EL display is made to perform complete-white display. Such a condition may cause the EL layer to deteriorate rapidly. In the present invention, a non-luminescing display period may be set to achieve a certain effect of limiting the deterioration of the EL layer.

In the case where m non-luminescing display periods are set, display periods (Tr1 to Tr(n+m)) consist of m non-luminescing display periods and n display periods is necessary for $2^n$ gray-level display (see Embodiments 3 and 4). In correspondence with the display periods (Tr1 to Tr(n+m)), writing-in periods (Ta1 to Ta(n+m)) consist of m non-luminescing writing-in periods and n writing-in periods necessary for 2n-gray-level display. In this case, it is necessary that, with respect to all the display periods (Tr1 to Tr(n+m)) and writing-in periods (Ta1 to Ta(n+m)), the sum Tri+Trj of each adjacent pair of the display periods be equal to or greater than the length of the writing-in period Tai corresponding to the preceding display period Tri.

In the present invention, the display periods and the writing-in periods overlap each other in proportion. In other words, it is possible to perform display through each pixel even in the writing-in period. Therefore, the proportion of the total sum of the lengths of the display periods in one frame (duty ratio) can be set to a higher value. In particular, in the case where no non-luminescing display periods are provided as in this embodiment mode (FIG. 4), the duty ratio is 100%. Needless to say, suitable non-luminescing display periods may be set to realize any duty ratio equal to or lower than 100%.

In the present invention, a pair of gate signal line driver circuits and a pair of source signal line driver circuits are provided and different gate signal line driver circuits and different source signal line driver circuits may be paired to enable overlapping portion of each of the corresponding adjacent pairs of the writing-in periods. In this manner, each display period can be set so as to be shorter than the corresponding writing-in period. Consequently, an extremely short display period can be set to realize a large number of gray-scale levels.

In a case where m non-luminescing display periods are set, the display periods (Tr1 to Tr(n+m)) may appear in any order. However, it is necessary that the sum Tri+Trj (where i and j are different integers equal to or greater than 1 and equal to or smaller than n) of each adjacent pair of the display periods be equal to or greater than the length of the writing-in period Tai corresponding to the preceding display period Tri. Therefore, the shortest possible value of the display periods that can be set varies depending upon the order in which the display periods (Tr1 to Tr(n+m)) appear.

A simple example of a display system in which display periods appear in increasing order of length, and a corresponding example of this embodiment mode (FIG. 4) will be compared with respect to a case where n=8, that is, 256 gray-scale levels are set. In these two examples, all the writing-in periods are equal in length and no non-luminescing display period is set (m=0). In the case where the display periods appear in increasing order, the display periods arranged in appearing order are in proportions of $2^0:2^1:2^2:2^3:2^4:2^5:2^6:2^7$, and the smallest of the sums of the adjacent pairs of the display periods is the sum of the first two display periods. On the other hand, in the case of this embodiment mode (FIG. 4), the display periods arranged in appearing order are in proportions of $2^3:2^4:2^2:2^5:2^1:2^6:2^0:2^7$, and the sum of the second and third display periods is the smallest. The result of the comparison between these examples is that, when the same writing-in periods are used in common, the smallest of the sums of the adjacent pairs of the display periods in this embodiment mode (FIG. 4) is $(2^4+2^2)/(2^0+2^1)$ times that in the case of the set of displayed periods arranged in increasing order, that is, it can be reduced to 3/20 times.

In the present invention, as described above, the shortest value of the display periods in possible settings varies depending upon the order in which the display periods (Tr1 to Tr(n+m)) appear. Therefore, it is possible to set a shorter display period by optimizing the order of the display periods (Tr1 to Trn) and hence to realize a greater number of gray-scale levels.

Also, in the present invention, it is possible that a much shorter display period will be realized by suitably dividing some display periods sufficiently longer than the writing-in period in the display periods (Tr1 to Trn) and by optimizing the order in which such display periods appear (see Embodiment 2). If display periods are added by further division, writing-in periods for realizing the divided display periods are also provided. The same digital data signal as that inputted to realize the display periods before the division is also used with respect to the newly-added writing-in periods.

The above-described system of the present invention is applicable not only to EL displays but also to apparatuses using any other electronic devices. If a liquid crystal device capable of high-speed response, e.g., one having a response time of several ten microseconds or shorter is realized, the present invention can also be applied to such a liquid crystal device.

Hereinafter, Embodiments of the present invention will be explained.

[Embodiment 1]

In the EL display of the present invention, a case of performing 64 gray-scale display from a 6-bit digital data signal is explained in Embodiment 1. It is to be noted that the EL display of Embodiment 1 has the structure that is illustrated in FIGS. 1 to 3. In addition, FIG. 8 will be used for explanation.

First, a gate signal from a gate signal line driver circuit 103 is fed to a gate signal line Ga1. As a result, a switching TFT 113 and an eliminating TFT 109a of all the pixels (pixels of the first line) connected to the gate signal line Ga1 are turned to the ON state.

Also, simultaneously, a first bits of digital data signals from a latch circuit (B) 102c of a first source signal line driver circuit 102 are fed to a source signal lines (Sa1 to Sax). Each digital data signal is fed to a gate electrode of the EL driver TFT 108a through the switching TFT 113a. The digital data signal has information "0" or "1", where one has a "Hi" voltage while the other has a "Lo" voltage. Also, a power supply potential of power supply lines (V1 to Vx) is applied to the gate electrode of an EL driver TFT 108b through the eliminating TFT 109a, thereby turning OFF an EL driver TFT 108b.

In Embodiment 1, when the digital data signal has the "0" information, the EL driver TFT 108a is in the OFF state. The EL driver TFT 108b is also in the OFF state. Under this condition, the power supply potential is not applied to the pixel electrode of an EL element 110. Consequently, the EL element 110 of the pixel to which the digital data signal with the "0" information is fed does not emit light.

Conversely, when the digital data signal has the "1" information, the EL driver TFT 108a is in the ON state, and hence the power supply potential is applied to the pixel electrode of the EL element 110 regardless of the state (ON or OFF) of the EL driver TFT 108b. As a result, the EL element 110 of the pixel to which the digital data signal with the "1" information is fed emits light.

Figure 8:
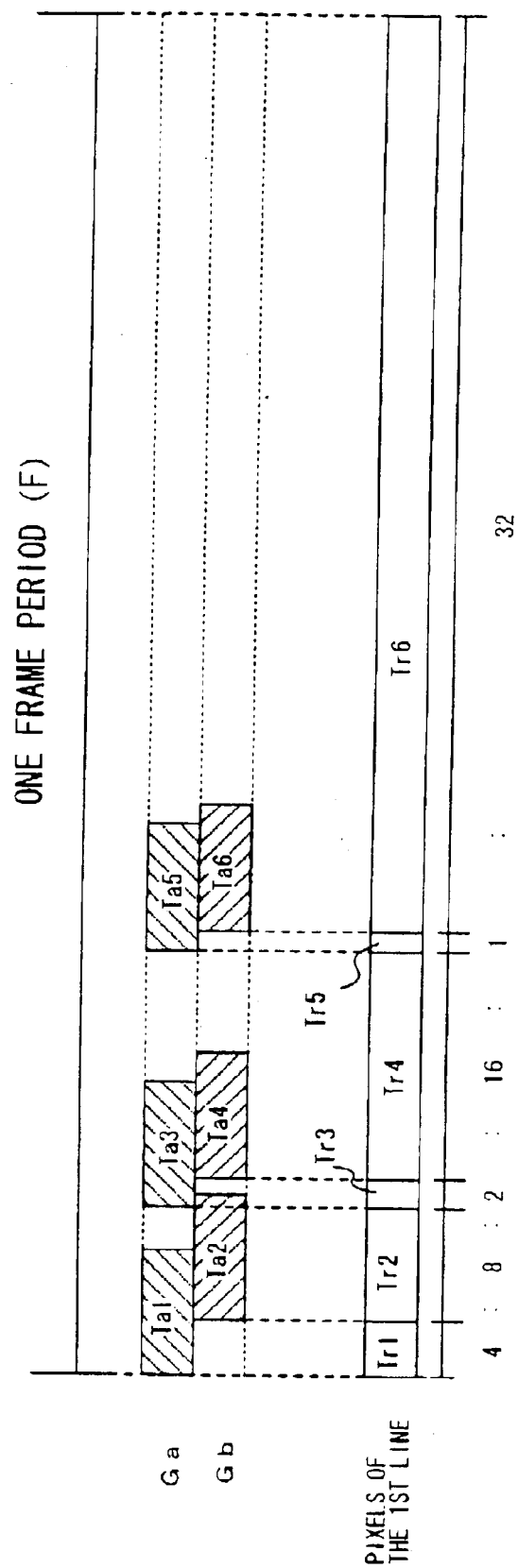
FIG. 8 is a diagram illustrating a driving method of the EL display of the present invention.

Thus, the EL element 110 either emits light or not upon input of the digital data signal to each first-line pixel, whereby the first-line pixels perform display through a time period determined as a display period Tr1. In FIG. 8, for ease of explanation, only the display periods for display through the first-line pixels are shown.

Simultaneously with the completion of feeding of the gate signal to the data signal line Ga1, another gate signal from the first gate signal line driver circuit 103 is fed to a gate signal line Ga2. At this time, all the pixels of the switching TFTs 113a and the eliminating TFTs 109a connected to the gate signal line Ga2 are thereby turned ON to input the first bits of the digital data signals from the source signal lines (Sa1 to Sax) to a second-line pixels. The EL elements 110 are thereby set selectively in the luminescing state or the non-luminescing state, as are those in the first line, thus performing display through the display period Tr1.

Thereafter, gate signals are successively fed to the other gate signal lines (Ga3 to Gay). The time period in which all the gate signal lines (Ga1 to Gay) are selected and the first bits of digital data signals are inputted to the pixels in all the lines is a writing-in period Ta1

On the other hand, before the first bits of the digital data signals are inputted to the pixels in all the lines, in other words, before the writing-in period Ta1 ends, feeding of the gate signal from a second gate signal driver circuit 105 to the gate signal line Gb1 is performed in parallel with inputting of the first bits of the digital data signals to the pixels. In this case, in a writing-in period Ta2, the second gate signal line driver circuit 105, different from the first gate signal line driver circuit 103 used with respect to the writing-in period Ta1 in the pair of gate signal line driver circuits, is used. In Embodiment 1, the part of writing-in periods Ta1 and Ta2 overlap each other. The present invention, however, is not limited to this. The same driving method can also be used in the case where the writing-in periods Ta1 and Ta2 do not overlap each other.

When the gate signal is fed to the gate signal line Gb1, the switching TFTs 113b and the eliminating TFTs 109b of all the pixels (first-line pixels) connected to the gate signal line Gb1 are turned ON. Simultaneously, the second bits of the digital data signals from a latch circuit (B) 104c of a second source signal line driver circuit 104 are fed to the source signal lines (Sb1 to Sbx). Each digital data signal is fed to the gate electrode of the EL driver TFT 108b through the switching TFT 113b. Also, the power supply potential of the power supply lines (V1 to Vx) is applied to the gate electrode of the EL driver TFT 108a through the eliminating TFT 109b, thereby turning OFF the EL driver TFT 108a.

The EL element 110 is set selectively in the luminescing state or the non-luminescing state upon input of the digital data signal to each first-line pixel, as is the EL element 110 in the writing-in period Ta1. Thus, the first-line pixels perform display.

Thereafter, gate signals are successively fed to the other gate signal lines (Gb1 to Gby). The time period in which all the gate signal lines (Gb1 to Gby) are selected and the second bits of the digital data signals are inputted to the pixels in all the lines is called writing-in period Ta2.

In the writing-in period Ta2, when the second bit of the digital data signal is inputted to each of the pixels in each line, the first bit of the digital data signal previously held is replaced by the second bit of the digital data signal newly written. The pixels in each line thus perform display. That is, the display period Tr1 ends and a display period Tr2 begins. The second bit of the digital data signal is held in each pixel in each line until the next digital data signal, i.e., the third bit of the digital data signal, is inputted in a writing-in period Ta3 (FIG. 8).

On the other hand, before the second bits of the digital data signals are inputted to the pixels in all the lines, in other words, before the writing-in period Ta2 ends, feeding of the gate signal from the first gate signal driver circuit 103 to the gate signal line Ga1 is again performed in parallel with inputting of the first bits of the digital data signals to the pixels. In this case, the circuit other than the second gate signal line driver circuit 105 used with respect to the writing-in period Ta2 in the pair of gate signal line driver circuits, i.e., the first gate signal line driver circuit 103, is used in the writing-in period Ta3. In Embodiment 1, the writing-in periods Ta2 and Ta3 overlap each other. The present invention, however, is not limited to this. The same driving method can also be used in the case where the writing-in periods Ta2 and Ta3 do not overlap. Also, all the gate signal lines (Ga1 to Gay) are successively selected and the third bits of the digital data signals are inputted to all the pixels. The time period in which the third bits of the digital data signals are inputted to the pixels in all the lines is called a writing-in period Ta3.

In the writing-in period Ta3, when the third bit of the digital data signal is inputted to each of the pixels in each line, the second bit of the digital data signal previously held is replaced by the third bit of the digital data signal newly written. The pixels in each line thus perform display. That is, the display period Tr2 ends and a display period Tr3 begins. The third bit of the digital data signal is held in each pixel in each line until the next digital data signal, i.e., the fourth bit of the digital data signal, is inputted in a writing-in period Ta4 (FIG. 8).

The above-described operation is repeatedly performed until the sixth bits of the digital data signals are inputted to the pixels. Consequently, the display periods (Tr1 to Tr6) appear successively in order (FIG. 8). The sixth bit of each digital data signal is held in the pixel until the first bit of the digital data signal is again inputted. When the first bit of the digital data signal is again inputted to the pixel, the display period Tr6 ends. At this time, the frame period also ends. At the end of the group of display periods (Tr1 to Tr6), display of one image can be completed. The period in which one image is displayed in the driving method of the present invention is called a frame period (F). Each of the display periods (Tr1 to Tr6) is the time period from the moment at which the corresponding writing-in period (one of Ta1 to Ta6) begins to the moment at which the next writing-in period begins. Thus, each of the display periods (Trn to Tr6) is set by the difference between the beginning times of the corresponding pair of the writing-in periods (Ta1 to Ta6).

After the end of the one frame period, the gate signal from the first gate signal driver circuit 103 is again fed to the gate signal line Ga1. Then, first bits of digital data signals are inputted to the pixels and display through the first-line pixels is again performed during the display period Tr1. The above-described operation is thereafter repeated.

In ordinary EL displays, it is preferable to set 60 or more frame periods per second. If the number of images displayed per second is less than 60, there is a possibility of flicker becoming easily visible.

The length of the display periods Tr is set so that it is $Tr1:Tr2:Tr3:Tr4:Tr5:Tr6:=2^2:2^3:2^1:2^4:2^0:2^5$. With the combination of the display periods, a desired gray-scale display can be performed from among the 64 gray-scales.

Requesting the total sum of the length of the display periods luminesced by the El element in one frame period determines the gray-scale displayed by the pixels in that frame period. For instance, assuming that the luminance of the pixels luminescing in all the display periods is 100%, then in the case of the pixels luminescing in Tr3 and Tr5, a luminance of 5% can be expressed whereas if Tr1 and Tr4 are selected, a 32% luminance can be expressed.

The writing-in periods with one gate signal line driver circuit are equal in length. In Embodiment 1, Ta1=Ta3=Ta5 and Ta2=Ta4=Ta6 are established since the writing-in periods (Ta1 to Ta6) are alternately assigned to the pair of gate signal driver circuits.

In the present invention, it is necessary that each of the sums Tr1+Tr2, Tr2+Tr3, ..., Tr6+(initial display period Tr1 for the next frame) of the adjacent pairs of the display periods be equal to or greater than the length of the corresponding one of the writing-in periods Ta1, Ta2, ..., Ta6. For example, if all the writing-in periods in Embodiment 1 are equal (Ta), it is necessary that Tr2+Tr3 corresponding to the smallest of the sums of the adjacent pairs of the display periods be equal to or greater than the writing-in period Ta. More specifically, the sum Tr2+Tr3 of the display periods is (one frame period)$\times(8+2)/(2^0+2^1+ \ldots +2^5)$ and it is therefore necessary that the length of the writing-in period Ta be equal to or smaller than (one frame period)×10/63. It is also necessary that the sum of the lengths of the writing-in periods for writing with one gate signal line driver circuit be shorter than one frame period.

By adopting the driving method of Embodiment 1, the variations in the amount of current flow outputted when equivalent gate voltages are applied can be suppressed even if there is a slight variation in the characteristic of the TFTs. As a result, it is possible to avoid the situation in which the occurrence of a large difference in the luminous amount of the EL element between adjacent pixels caused by the variation of the characteristic of the TFTs even when signals having the same voltage are inputted to the TFTs.

In Embodiment 1, the display periods (Tr1 to Tr6) may appear in any order. For example, the display periods can appear in the order of Tr1, Tr3, Tr5, Tr2, ... in one frame period. However, it is necessary that the sum Tri+Trj (where i and j are different integers equal to or greater than 1 and equal to or smaller than n) of each adjacent pair of the display periods be equal to or greater than the length of the writing-in period Tai corresponding to the preceding display period Tri.

In Embodiment 1, for ease of explanation, the pair of gate signal line driver circuits are alternately used with respect to the writing-in periods (Ta1 to Ta6). However, the present invention is not limited to this. In the present invention, if there is no overlap in each of the adjacent pairs of the writing-in periods, two gate signal line driver circuits or one gate signal line driver circuit may be used for drive during the adjacent pair of writing-in periods. On the other hand, if there is an overlap in the adjacent pairs of the writing-in periods in the present invention, it is necessary to use separate gate signal line driver circuits with respect to the two overlapping writing-in periods.

Conversely speaking, it does not matter whether each adjacent pair of writing-in periods overlap or not, since in Embodiment 1, the pair of driver circuits are alternately used with respect to the writing-in periods (Ta1 to Ta6). The same driving method can be used in either of the case where each adjacent pair of writing-in periods overlap and the case where each adjacent pair of writing-in periods do not overlap.

In Embodiment 1, a display period during which none of the pixels luminesces may be set by adding a writing-in period with a digital data signal for selecting the non-luminescing state of the EL elements in all the pixels (a digital data signal always having "0" information in Embodiment 1) besides the 6-bit digital data signal necessary for 64 gray-scale display. Such writing-in and display periods are called a non-luminescing writing-in period and a non-luminescing display period, respectively. In the case of the conventional analog drive, the EL elements luminesce continuously when the EL display is made to perform complete-white display. Such a condition may cause the EL layer to deteriorate rapidly. In the present invention, a non-luminescing display period may be set to achieve a certain effect of limiting the deterioration of the EL layer.

In the present invention, the display periods and the writing-in periods overlap each other. In other words, it is possible to perform display through each pixel even in the writing-in period. Therefore, the proportion of the total sum of the lengths of the display periods in one frame (duty ratio) can be set to a higher value. In particular, in the case where no non-luminescing display periods are provided as in Embodiment 1, the duty ratio is 100%. Needless to say, suitable non-luminescing display periods may be set to realize any duty ratio lower than 100%.

[Embodiment 2]

An example of 256 gray-scale display system will be described as another embodiment of the driving method of the present invention with reference to FIG. 9.

In Embodiment 2, the EL display has the configuration shown in FIGS. 1 through 3. The description of the driving method of Embodiment 2 will be made while being simplified with respect to the points already described in the embodiment mode or Embodiment 1.

First, a gate signal from the first gate signal line driver circuit 103 is fed to the gate signal line Ga1 and digital data signals are inputted to the first-line pixels. Then the EL element 110 either emit light or not through the display period Tr. FIG. 9 shows only the display periods with respect to the first-line pixels in particular. Gate signals are successively fed to the gate signal lines (Ga2 to Gay), and display is simultaneously performed. The time period, in which all the gate signal lines (Ga1 to Gay) are selected and the first bits of the digital data signals are inputted to the pixels in all the lines, is a writing-in period Ta1.

On the other hand, before the first bits of the digital data signals are inputted to the pixels in all the lines, in other words, before the writing-in period Ta1 ends, feeding of a gate signal from the second gate signal line driver circuit 105 to the gate signal line Gb1 is performed in parallel with inputting of the first bits of the digital data signals to the pixels. In the first-line pixels, the EL element 110 either emits light or not upon input of the digital data signal, thereby performing display. That is, the display period Tr1 ends and a display period Tr2 begins (FIG. 9). Gate signals are successively fed to the gate signal lines (Gb2 to Gby) to thereby perform display. The time period in which the second bits of the digital data signals are inputted to the pixels in all the lines is called the writing-in period Ta2. In Embodiment 2, the writing-in periods Ta1 and Ta2 overlap each other. However, the present invention is not limited to this, and the same driving method can also be used in the case where the writing-in periods Ta1 and Ta2 do not overlap.

On the other hand, before the second bits of the digital data signals are inputted to the pixels in all the lines, in other words, before the writing-in period Ta2 ends, feeding of the gate signal from the first gate signal line driver circuit 103 to the gate signal line Ga1 is again performed in parallel with inputting of the second bits of the digital data signals to the pixels. In the first-line pixels, the EL element 110 either emits light or not upon input of the digital data signal, thereby performing display. That is, the display period Tr2 ends and a display period Tr3 begins (FIG. 9). The gate signals are successively fed to the gate signal lines (Ga2 to Gay) to thereby perform display. The time period in which the third bits of the digital data signals are inputted to the pixels in all the lines is called the writing-in period Ta3. In Embodiment 2, the writing-in periods Ta2 and Ta3 overlap each other. However, the present invention is not limited to this, and the same driving method can also be used in the case where the writing-in periods Ta2 and Ta3 do not overlap each other.

The above-described operation is repeatedly performed until the tenth bits of the digital data signals are inputted to the pixels. Consequently, the display periods (Tr1 to Tr10) appear successively in order (FIG. 9). The tenth bit of each digital data signal is held in the pixel until the first bit of the digital data signal is again input. When the first bit of the digital data signal is again input to the pixel, the display period Tr10 ends. At this time, the frame period also ends. At the end of the group of the display periods (Tr1 to Tr10), display of one image is completed. The period in which one image is displayed in the driving method of the present invention is called a frame period (F). Each of the display periods (Tr1 to Tr10) is the time period from the moment at which the corresponding writing-in period (one of Ta1 to Ta10) begins to the moment at which the next writing-in period begins (one of Ta2 to Ta10 and the first writing-in period Ta1 for the next frame). Thus, each of the display periods (Tr1 to Tr10) is determined by the difference between the beginning times of the corresponding pair of the writing-in periods (Ta1 to Ta10).

After the end of the one frame period, the gate signal from the first gate signal line driver circuit 103 is again fed to the gate signal line Ga1. Then, first bits of digital data signals are inputted to the pixels and display through the first-line pixels is again performed during the display period Tr1. The above-described operation is thereafter repeated.

The ratio of the lengths of the display periods (Tr1 to Tr10) are set so that Tr1:Tr2:Tr3:Tr4:Tr5:(Tr6+Tr8+Tr10):Tr7:Tr9=$2^4:2^5:2^3:2^6:2^2:2^7:2^1:2^0$. Also, the display periods Tr6, Tr8, and Tr10 are set so that Tr6:Tr8:Tr10=1:1:2. It is necessary that the digital data inputted in the writing-in periods Ta6, Ta8, and Ta10, i.e., the sixth bit, the eighth bit and the tenth bit of the digital data be equal to each other. In other words, it is necessary that the EL element of one pixel be in the same state (luminescing or non-luminescing state) in the display periods Tr6, Tr8, and Tr10. This setting enables gray-scale display using desired levels in 256 gray-scale levels.

The gray-scale level of one pixel in display during one frame period is determined by calculating the total sum of the lengths of the display periods during which the corresponding EL element emits light in the frame period. If the luminance of the pixel when the pixel luminesces through all the display periods is 100%, a 75% luminance can be expressed by luminescing of the pixel through the periods Tr4, Tr6, Tr8 and Tr10. Also, a 16% luminance can be expressed by luminescing of the pixel through the periods Tr2, Tr3, and Tr9.

The writing-in periods for writing with one gate signal line driver circuit are equal in length. In Embodiment 2, Ta1=Ta3=Ta5=Ta7=Ta9 and Ta2=Ta4=Ta6=Ta8=Ta10 are established since the writing-in periods (Ta1 to Ta10) are alternately assigned to the pair of gate signal line driver circuits.

In the present invention, it is necessary that each of the sums Tr1+Tr2, Tr2+Tr3, . . . , Tr10+(initial display period Tr1 for the next frame) of the adjacent pairs of the display periods be equal to or greater than the length of the corresponding one of the writing-in periods Ta1, Ta2, . . . , Ta10. For example, if all the writing-in periods in Embodiment 2 are equal (Ta), it is necessary that Tr8+Tr9 corresponding to the smallest of the sums of the adjacent pairs of the display periods be equal to or greater than the writing-in period Ta. More specifically, the sum Tr8+Tr9 of the display periods is (one frame period)$\times(32+1)/(2^0+2^1+ \ldots +2^7)$ and it is therefore necessary that the length of the writing-in period Ta be equal to or smaller than (one frame period)$\times 33/255$. In comparison with the corresponding value (20/55) in the example in the above-described embodiment mode, the smallest of the sums of the adjacent pairs of the display periods in Embodiment 2 can be reduced to 22/33. Consequently, it is possible to realize a larger number of gray-scale levels. It is also necessary that the sum of the lengths of the writing-in periods for writing with one gate signal line driver circuit be shorter than one frame period.

Thus, it is possible that a much shorter display period will be realized by suitably dividing some display periods sufficiently longer than the writing-in period among the n display periods necessary for $2^n$ gray-scale display and by optimizing the order in which such display periods appear. If display periods are added by further division, writing-in periods for realizing the divided display periods are also provided. The same digital data signal as that inputted to realize the display periods before the division is also used with respect to the newly-added writing-in periods.

Figure 9:
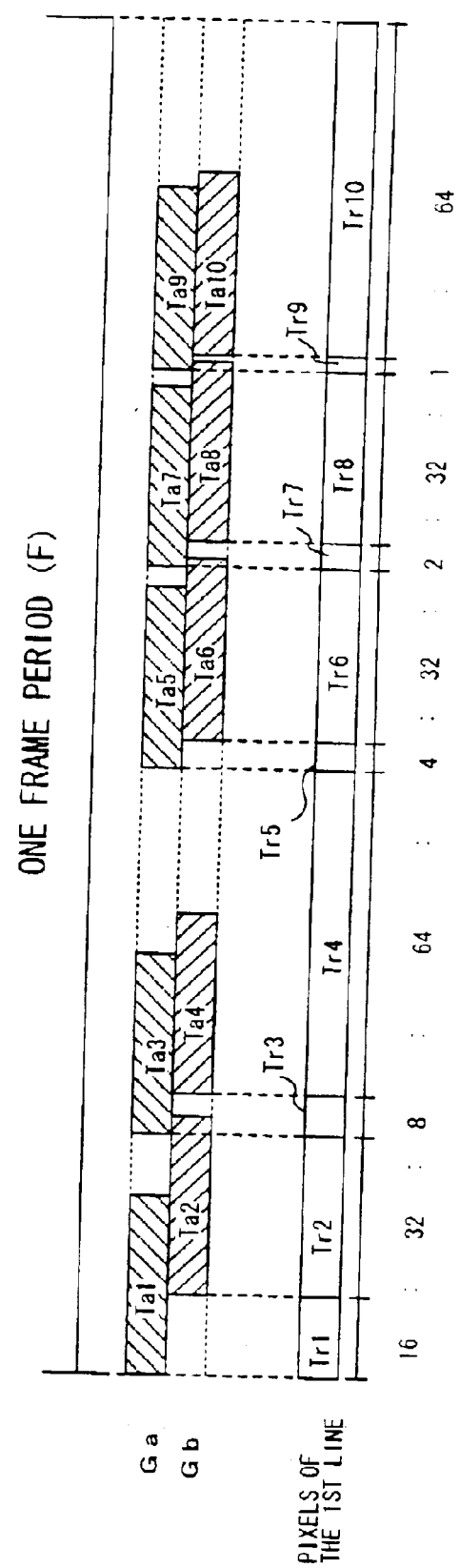
FIG. 9 is a diagram illustrating a driving method of the EL display of the present invention.

That is, in Embodiment 2, the longest period in the eight display periods necessary for 256 gray-scale display is divided into three such that the lengths of the three divided periods are in proportions of 1:1:2, and the divided periods are set in the order shown in FIG. 9, in this manner, it is possible to set shorter display periods while satisfying the condition that the length of the writing-in period Ta is equal to or smaller than (one frame period)$\times 33/255$. In this case, three writing-in periods are set to realize the three divided display periods. Digital data signals inputted in the three writing-in periods are identical with each other, and the same digital data signal as that inputted to realize the display periods before the division is used.

The driving method in Embodiment 2 makes it possible to limit the variation of the currents outputted from TFTs when the gate voltages applied to the TFTs are equal even if the characteristics of the TFTs vary to some extent. Thus, it is possible to avoid occurrence of a large difference in the luminous amount of the EL element between adjacent pixels due to variations of the characteristics of the TFTs when signals having the same voltage level are inputted to the TFTs.

In Embodiment 2, the display periods (Tr1 to Tr10) may appear in any order. For example, the display periods can appear in the order of Tr1, Tr3, Tr5, Tr2, . . . in one frame period. However, it is necessary that the sum Tri+Trj (where i and j are different integers equal to or greater than 1 and equal to or smaller than n) of each adjacent pair of the display periods be equal to or greater than the length of the writing-in period Tai corresponding to the preceding display period Tri.

In Embodiment 2, for ease of explanation, the pair of gate signal line driver circuits are alternately used with respect to the writing-in periods (Ta1 to Ta10). However, the present invention is not limited to this. In the present invention, if there is no overlap in each of the adjacent pairs of the writing-in periods, two gate signal line driver circuits or one gate signal line driver circuit may be used for drive during the adjacent pair of writing-in periods. On the other hand, if there, is an overlap in the adjacent pair of the writing-in periods in the present invention, it is necessary to use separate signal line driver circuits with respect to the two overlapping writing-in periods.

Conversely speaking, it does not matter whether each adjacent pair of writing-in periods overlap or not, since in Embodiment 2 the pair of driver circuits are alternately used with respect to the writing-in periods (Ta1 to Ta10). The same driving method can be used in either of the case where each adjacent pair of writing-in periods overlap and the case where each adjacent pair of writing-in periods do not overlap.

In Embodiment 2, a display period during which none of the pixels luminesces may be set by adding a writing-in period with a digital data signal for selecting the non-luminescing state of the EL elements in all the pixels (a digital data signal always having "0" information in Embodiment 2) besides the 10-bit digital data signal necessary for 256 gray-scale display. Such writing-in and display periods are called a non-luminescing writing-in period and a non-luminescing display period, respectively. In the case of the conventional analog drive, the EL elements luminesce continuously when the EL display is made to perform complete-white display. Such a condition may cause the EL layer to deteriorate rapidly. In the present invention, a non-luminescing display period may be set to achieve a certain effect of limiting the deterioration of the EL layer.

In the present invention, the display periods and the writing-in periods overlap each other. In other words, it is possible to perform display through each pixel even in the writing-in period. Therefore, the proportion of the total sum of the lengths of the display periods in one frame (duty ratio) can be set to a higher value. In particular, in the case where no non-luminescing display period is provided as in Embodiment 2, the duty ratio is 100%. Needless to say, suitable non-luminescing display periods may be set to realize any duty ratio lower than 100%.

[Embodiment 3]

Figure 10:
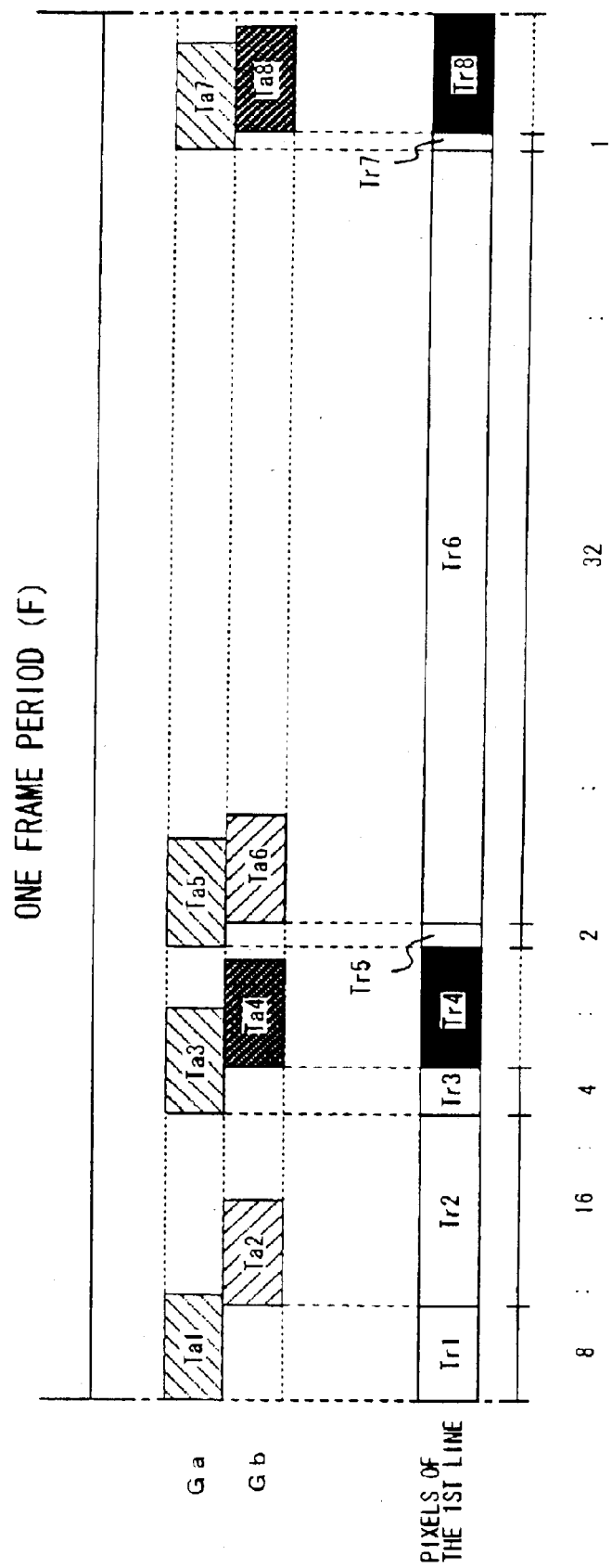
FIG. 10 is a diagram illustrating a driving method of the EL display of the present invention.

Another example of 64 gray-scale display system in the EL display of the present invention will be described with reference to FIG. 10, in Embodiment 3, the EL display has the configuration shown in FIGS. 1 through 3. The method in Embodiment 3 will be only outlined with respect to the points already described in the embodiment mode or Embodiment 1.

First, a gate signal from the first gate signal line driver circuit 103 is fed to the gate signal line Ga1 and digital data signals are inputted to the first-line pixels. Then the EL element 110 either emit light or not through the display period Tr1. FIG. 10 shows the display periods with respect to the first-line pixels in particular. Gate signals are successively fed to the gate signal lines (Ga2 to Gay) and display is simultaneously performed. The time period in which all the gate signal lines (Ga1 to Gay) are selected and the first bits of the digital data signals are inputted to the pixels in all the lines is a writing-in period Ta1.

On the other hand, before the first bits of the digital data signals are inputted to the pixels in all the lines, in other words, before the writing-in period Ta1 ends, feeding of a gate signal from the second gate signal line driver circuit 105 to the gate signal line Gb1 is performed in parallel with inputting of the first bits of the digital data signals to the pixels. In the first-line pixels, the EL element 110 either emits light or not upon input of the digital data signal, thereby performing display. That is, the display period Tr1 ends and the display period Tr2 begins (FIG. 10). Gate signals are successively fed to the gate signal lines (Gb2 to Gby) to thereby perform display. The time period in which the second bits of the digital data signals are inputted to the pixels in all the lines is called a writing-in period Ta2. In Embodiment 3, the writing-in periods Ta1 and Ta2 overlap each other. However, the present invention is not limited to this, and the same driving method can also be used in the case where the writing-in periods Ta1 and Ta2 do not overlap each other.

On the other hand, before the second bits of the digital data signals are inputted to the pixels in all the lines, in other words, before the writing-in period Ta2 ends, feeding of the gate signal from the first gate signal line driver circuit 103 to the gate signal line Ga1 is again performed in parallel with inputting of the second bits of the digital data signals to the pixels. In the first-line pixels, the EL element 110 either emits light or not upon input of the digital data signal, thereby performing display. That is, the display period Tr2 ends and the display period Tr3 begins (FIG. 10). The gate signals are successively fed to the gate signal lines (Ga2 to Gay) to thereby perform display. The time period in which the third bits of the digital data signals are inputted to the pixels in all the lines is called a writing-in period Ta3. In Embodiment 3, the writing-in periods Ta2 and Ta3 overlap each other. However, the present invention is not limited to this, and the same driving method can also be used in the case where the writing-in periods Ta2 and Ta3 do not overlap each other.

The above-described operation is repeatedly performed until the eighth bits of the digital data signals are inputted to the pixels. Consequently, the display periods (Tr1 to Tr8) appear successively in order (FIG. 10). The eight bit of each digital data signal is held in the pixel until the first bit of the digital data signal is again input. When the first bit of the digital data signal is again input to the pixel, the display period Tr8 ends. At this time, the frame period also ends. At the end of the group of the display periods (Tr1 to Tr8), display of one image is completed. The period in which one image is displayed in the driving method of the present invention is called a frame period (F). Each of the display periods (Tr1 to Tr8) is the time period from the moment at which the corresponding writing-in period (one of Ta1 to Ta8) begins to the moment at which the next writing-in period begins (one of Ta2 to Ta8 and the first writing-in period Ta1 for the next frame). Thus, each of the display periods (Tr1 to Tr8) is determined by the difference between the beginning times of the corresponding pair of the writing-in periods (Ta1 to Ta8).

After the end of the one frame period, the gate signal from the first gate signal line driver circuit 103 is again fed to the gate signal line Ga1. Then, first bits of digital data signals are inputted to the pixels, and display through the first-line pixels is again performed during the display period Tr1. The above-described operation is thereafter repeated.

In Embodiment 3, all the digital data signals inputted in the writing-in periods Ta4 and Ta8 are signals for selecting the non-luminescing state of the EL element. Consequently, each of the display periods Tr4 and Tr8 is set as a display period during which all the pixels do not luminesce. These writing-in and display periods are called a non-luminescing writing-in period and a non-luminescing display period, respectively. In the case of the conventional analog drive, the EL elements luminesce continuously when the EL display is made to perform complete-white display. Such a condition may cause the EL layer to deteriorate rapidly. In the present invention, non-luminescing display periods are set to achieve a certain effect of limiting the deterioration of the EL layer.

The lengths of the six display periods in the display periods (Tr1 to Tr8), excluding the non-luminescing display periods, are set so that Tr1:Tr2:Tr3:Tr5:Tr6:Tr7= $2^3:2^4:2^2:2^1:2^5:2^0$. It is possible to perform gray-scale display using desired levels in 64 gray-scale levels by selecting a combination of these display periods. The ratio of the length of the non-luminescing display periods Tr4 and Tr8 to that of the other display periods may be freely determined.

The gray-scale level of one pixel in display during one frame period is determined as the total sum of the lengths of the display periods during which the corresponding EL element emits light in the frame period. If the luminance of the pixel when the pixel luminesces through all the display periods excluding the non-luminescing display periods is 100%, a 76% luminance can be expressed by luminescing of the pixel through the periods Tr2 and Tr6. Also, a 11% luminance can be expressed by luminescing of the pixel through the periods Tr3, Tr5, and Tr7.

The writing-in periods for writing with one gate signal line driver circuit are equal in length. In Embodiment 3, Ta1=Ta3=Ta5=Ta7 and Ta2=Ta4=Ta6=Ta8 are established since the writing-in periods (Ta1 to Ta8) are alternately assigned to the pair of gate signal line driver circuits.

In the present invention, it is necessary that each of the sums Tr1+Tr2, Tr2+Tr3, . . . , Tr8+(initial display period Tr1 for the next frame) of the adjacent pairs of the display periods be equal to or greater than the length of the corresponding one of the writing-in periods Ta1, Ta2, . . . , Ta8. In Embodiment 3, the two non-luminescing display periods Tr4 and Tr8 can be freely set in a range such that the above condition is satisfied. It is also necessary that the sum of the lengths of the writing-in periods for writing with one gate signal line driver circuit be shorter than one frame period.

The driving method in Embodiment 3 makes it possible to limit the variation of the currents outputted from TFTs when the gate voltages applied to the TFTs are equal even if the characteristics of the TFTs vary to some extent. Thus, it is possible to avoid occurrence of a large difference between the luminous amounts of the EL element between adjacent pixels due to variations of the characteristics of the TFTs when signals having the same voltage level are inputted to the TFTs.

In Embodiment 3, the display periods (Tr1 to Tr8) may appear in any order. However, it is necessary that the sum of each adjacent pair of the display periods be equal to or greater than the length of the writing-in period corresponding to the preceding display period.

In Embodiment 3, for ease of explanation, the pair of gate signal line driver circuits are alternately used with respect to the writing-in periods (Ta1 to Ta8). However, the present invention is not limited to this. In the present invention, if there is no overlap in each of the adjacent pairs of the writing-in periods, two gate signal line driver circuits or one gate signal line driver circuit may be used for drive during the adjacent pair of writing-in periods. On the other hand, if there is an overlap in the adjacent pair of the writing-in periods in the present invention, it is necessary to use separate gate signal line driver circuits with respect to the two overlapping writing-in periods.

Conversely speaking, it does not matter whether each adjacent pair of writing-in periods overlap or not, since in Embodiment 3 the pair of driver circuits are alternately used. The same driving method can be used in either of the case where each adjacent pair of writing-in periods overlap and the case where each adjacent pair of writing-in periods do not overlap.

In the display periods and the writing-in periods overlap each other. In other words, it is possible to display through each pixel even in the writing-in period. Therefore, the proportion of the total sum of the lengths of the display periods in one frame (duty ratio) can be set to a higher value. Suitable non-luminescing display periods, such as those used in Embodiment 3, can be set to realize a desirable duty ratio lower than 100%.

[Embodiment 4]

Figure 11:
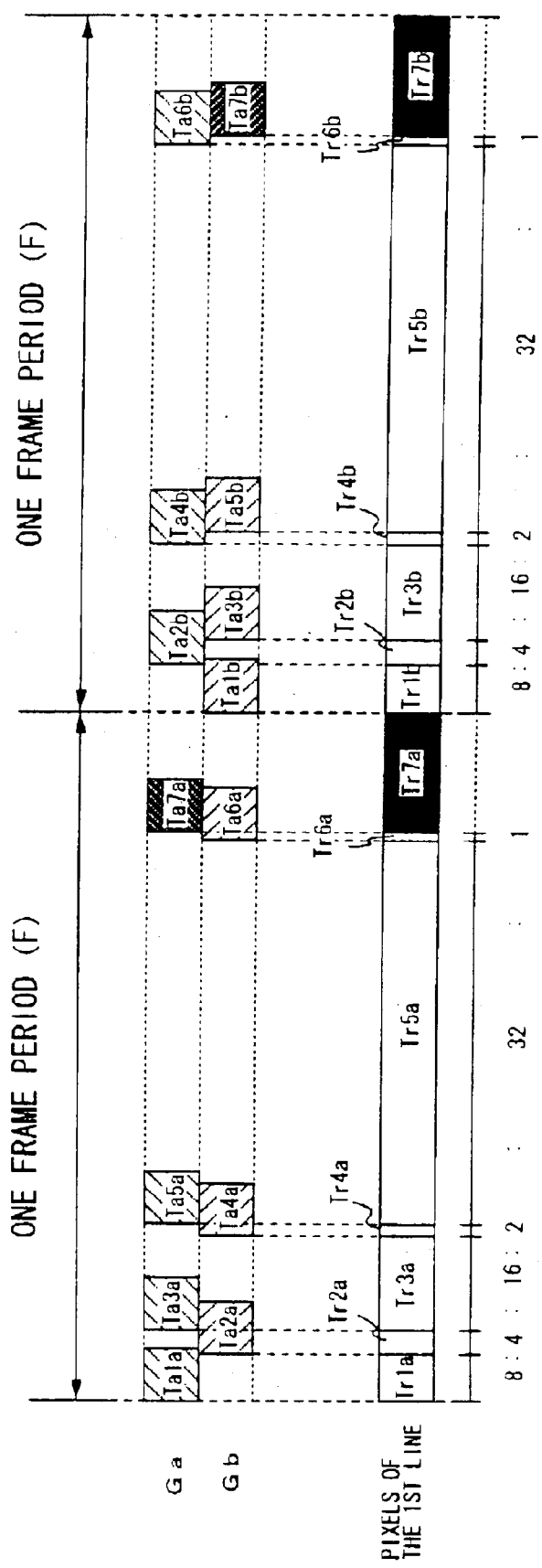
FIG. 11 is a diagram illustrating a driving method of the EL display of the present invention.

A further example of 64 gray-scale display system in the EL display of the present invention will be described with reference to FIG. 11. In Embodiment 4, the EL display has the configuration shown in FIGS. 1 through 3. The driving methods in Embodiment 4 will be only outlined with respect to the points already described with respect to the embodiment mode or Embodiment 1.

First, a gate signal from the first gate signal line driver circuit 103 is fed to the gate signal line Ga1 and digital data signals are inputted to the first-line pixels. Then simultaneously the EL elements 110 either emit light or not through a display period Tr1. FIG. 11 shows the display periods with respect to the first-line pixels in particular. Gate signals are successively fed to the gate signal lines (Ga2 to Gay) and display is simultaneously performed. The time period in which all the gate signal lines (Ga1 to Gay) are selected and the first bits of the digital data signals are inputted to the pixels in all the lines is a writing-in period Ta1a.

On the other hand, before the writing-in period Ta1a ends, feeding to a gate signal from the second gate signal line driver circuit 105 to the gate signal line Gb1 is performed in parallel with inputting of the first bits of the digital data signals to the pixels. In the first-line pixels, the EL element 110 either emits light or not upon input of the digital data signal, thereby performing display. That is, the display period Tr1a ends and a display period Tr2a begins (FIG. 11). Gate signals are successively fed to the gate signal lines (Gb2 to Gby) to perform display. The time period in which the second bits of the digital data signals are inputted to the pixels in all the lines is called a writing-in period Ta2a.

On the other hand, in other words before the writing-in period Ta2a ends, feeding of the gate signal from the first gate signal line driver circuit 103 to the gate signal line Ga1 is again performed in parallel with inputting of the second bits of the digital data signals to the pixels. In the first-line pixels, the EL element 110 either emits light or not upon input of the digital data signal, thereby performing display. That is, the display period Tr2a ends and a display period Tr3a begins (FIG. 11). The gate signals are successively fed to the gate signal lines (Ga2 to Gay) to perform display. The time period in which the third bits of the digital data signals are inputted to the pixels in all the lines is called a writing-in period Ta3a.

The above-described operation is repeatedly performed until the seventh bits of the digital data signals are inputted to the pixels. After the writing-in period Ta7a, inputting of the gate signal from the second gate signal line driver circuit 105 to the gate signal line Gb1 is again performed. At the end of the display period Tr7a, display of one image through the display periods (Tr1a to Tr7a) can be completed. The period in which one image is displayed in the driving method of the present invention is called a frame period (F). Then, in the first-line pixels, the EL element 110 either emits light or not upon input of the digital data signal, thereby performing display. That is, a first display period Tr1b for the next frame begins (FIG. 11). The gate signals are successively inputted to the gate signal lines (Gb2 to Gby) to perform display. The time period in which the first bits of the digital data signals are inputted to the pixels in all the lines is called a writing-in period Ta1b.

On the other hand, before the writing-in period Ta1b ends, feeding of the gate signal from the second gate signal driver circuit 105 to the gate signal line Gb1 is performed in parallel with inputting of the first bits of the digital data signals to the pixels. In the first-line pixels, the EL element 110 either emits light or not upon input of the digital data signal, thereby performing display. That is, the display period Tr1b ends and a display period Tr2b begins (FIG. 11). The gate signals are successively fed to the gate signal lines (Gb2 to Gby) to perform display. The time period in which the second bits of the digital data signals are inputted to the pixels in all the lines is called a writing-in period Ta2b.

The above-described operation is repeatedly performed until the seventh bits of the digital data signals are inputted to the pixels. As a result, display periods (Tr1a to Tr7a, Tr1b to Tr7b) appear successively (FIG. 11). The seventh bit of each digital data signal is held on the pixel until the first bit of the digital data is again inputted. When the first bit of the digital data is again inputted, the display period Tr7b ends and the frame period ends simultaneously. Each of the display periods (Tr1a to Tr7a, Tr1b to Tr7b) is the time period from the moment at which the corresponding writing-in period (one of Ta1a to Ta7a, and Ta1b to Ta7b) begins to the moment at which the next writing-in period (one of Ta2a to Ta7a, Ta1b to Ta7b, and first writing-in period Ta1a for the next frame) begins. Thus, each of the display periods is determined by the difference between the beginning times of the corresponding pair of the writing-in periods.

After the end of the one frame period, the gate signal from the first gate signal line driver circuit 103 is again inputted to the gate signal line Ga1. Consequently, the first bits of the digital data signals are inputted to the pixels and the first-line pixels perform display through the display period Tr1a again. The above-described operation is thereafter repeated.

In Embodiment 4, all the digital signals inputted in the writing-in periods Ta7a and Ta7b are signals for selecting the non-luminescing state of the EL element. Consequently, each of the display periods Tr7a and Tr7b is set as a display period during which all the pixels do not luminesce. These writing-in and display periods are called a non-luminescing writing-in period and a non-luminescing display period, respectively. In the case of the conventional analog drive, the EL elements luminesce continuously when the EL display is made to perform complete-white display. Such a condition may cause the EL layer to deteriorate rapidly. In the present invention, non-luminescing display periods are set to achieve a certain effect of limiting the deterioration of the EL layer.

The ratio of the lengths of the twelve display periods in the display periods (Tr1a to Tr7a, Tr1b to Tr7b), excluding the two non-luminescing display periods Tr7a and Tr7b, are set so that Tr1a:Tr2a:Tr3a:Tr4a:Tr5a:Tr6a= Tr1b:Tr2b:Tr3b:Tr4b:Tr5b:Tr6b=$2^3$:$2^2$:$2^4$:$2^1$:$2^5$:$2^0$. It is possible to perform gray-scale display using desired levels in 2n gray-scale levels by selecting a combination of these display periods. The ratio of the length of the non-luminescing display periods Tr7a and Tr7b to that of the other display periods may be freely determined.

The gray-scale level of one pixel in display during one frame period is determined as the total sum of the lengths of the display periods during which the corresponding EL element emits light in the frame period. If the luminance of the pixel when the pixel luminesces through all the display periods excluding the non-luminescing display periods is 100%, a 76% luminance can be expressed by luminescing of the pixel through the periods Tr3a and Tr5a (or Tr3b and Tr5b). Also, a 11% luminance can be expressed by luminescing of the pixel through the periods Tr2a, Tr4a, and Tr6a (or Tr2b, Tr4b, and Tr6b) selected.

The writing-in periods for writing with one gate signal line driver circuit are equal in length, respectively. In Embodiment 4, Ta1a=Ta3a=Ta5a=Ta7a=Ta2a=Ta4a=Ta6a and Ta2b=Ta4b=Ta6b=Ta1b=Ta3b=Ta5b=Ta7b are established since the writing-in periods (Ta1a to Ta7a, Ta1b to Ta7b) are alternately assigned to the pair of gate signal driver circuits.

In the present invention, it is necessary that each of the sums Tr1a+Tr2a, Tr2a+Tr3a, ..., Tr7a+Tr1b, Tr1b+Tr2b, Tr2b+Tr3b, ..., Tr7b+(initial display period Tr1a for the next frame) of the adjacent pairs of the display periods be equal to or greater than the length of the corresponding one of the writing-in periods Ta1a, Ta2a, ..., Ta7a, Ta1b, Ta2b, ..., and Ta7b. In Embodiment 4, the two non-luminescing display periods Tr7a and Tr7b can be freely set in a range such that the above condition is satisfied.

The driving method in Embodiment 4 makes it possible to limit the variation of the currents outputted from TFTs when the gate voltages applied to the TFTs are equal even if the characteristics of the TFTs vary to some extent. Thus, it is possible to avoid occurrence of a large difference in the luminous amount of the EL element between adjacent pixels due to variations of the characteristics of the TFTs when signals having the same voltage level are inputted to the TFTs.

In Embodiment 4, the display periods (Tr1a to Tr7a, Tr1b to Tr7b) may appear in any order. However, it is necessary that the sum of each adjacent pair of the display periods be equal to or greater than the length of the writing-in period corresponding to the preceding display period.

In Embodiment 4, for ease of explanation, the pair of gate signal line driver circuits are alternately used with respect to the writing-in periods (Ta1a to Ta7a, Ta1b to Ta7b). However, the present invention is not limited to this. In the present invention, if there is no overlap in each of the adjacent pairs of the writing-in periods, two gate signal line driver circuits can be used for drive during the adjacent pair of writing-in periods, or one gate signal line driver circuit may be used instead of the separate driver circuits. On the other hand, if there is an overlap in the adjacent pairs of the writing-in periods in the present invention, it is necessary to use separate signal line driver circuits with respect to the two overlapping writing-in periods.

Conversely speaking, it does not matter whether each adjacent pair of writing-in periods overlap or not, since, in Embodiment 4, the pair of driver circuits are alternately used. The same driving method can be used in either of the case where each adjacent pair of writing-in periods overlap each other and the case where each adjacent pair of writing-in periods do not overlap.

In the present invention, the display periods and the writing-in periods overlap each other. In other words, it is possible to perform display through each pixel even in the writing-in period. Therefore, the proportion of the total sum of the lengths of the display periods in one frame period (duty ratio) can be set to a higher value. Suitable non-luminescing display periods, such as those used in Embodiment 4, can be set to realize a desirable duty ratio lower than 100%.

[Embodiment 5]

Figure 5:
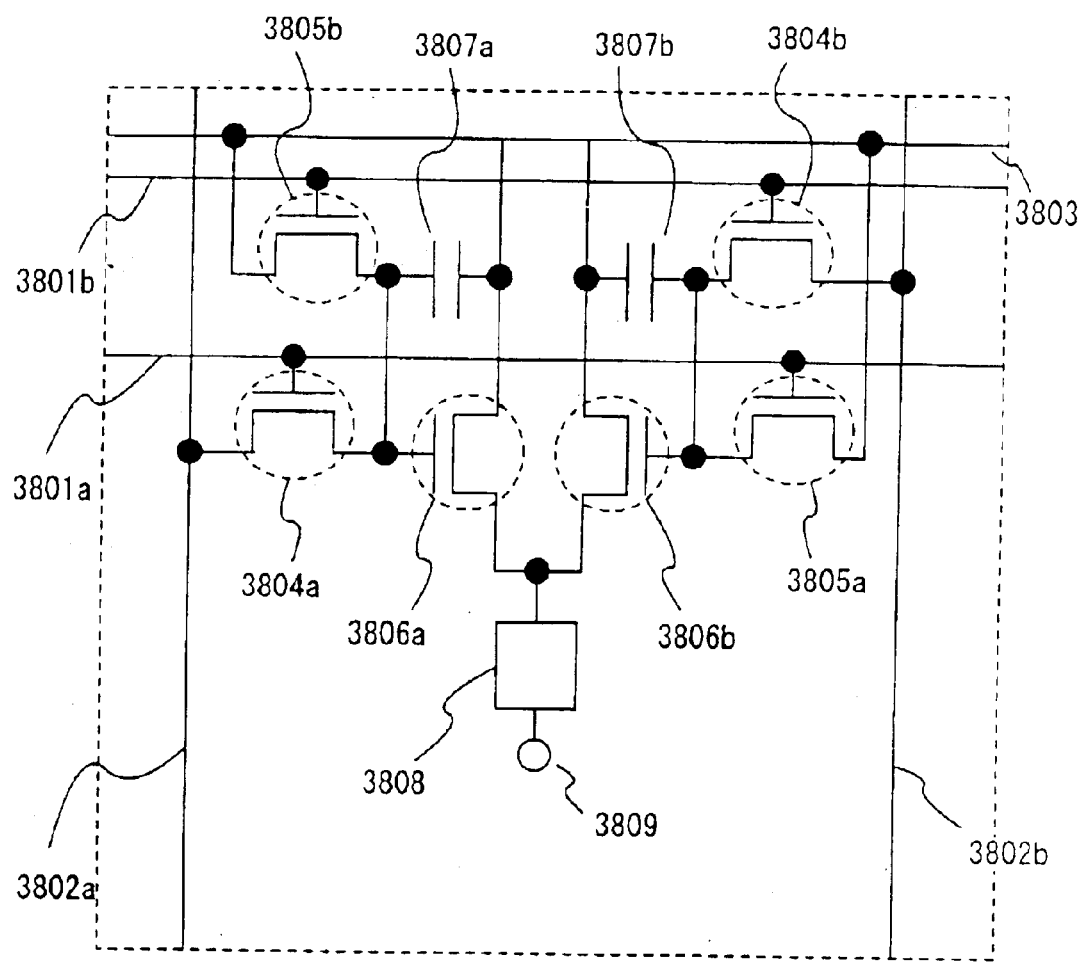
FIG. 5 is a diagram showing a circuit configuration of a pixel of the EL display of the present invention.
Figure 6:
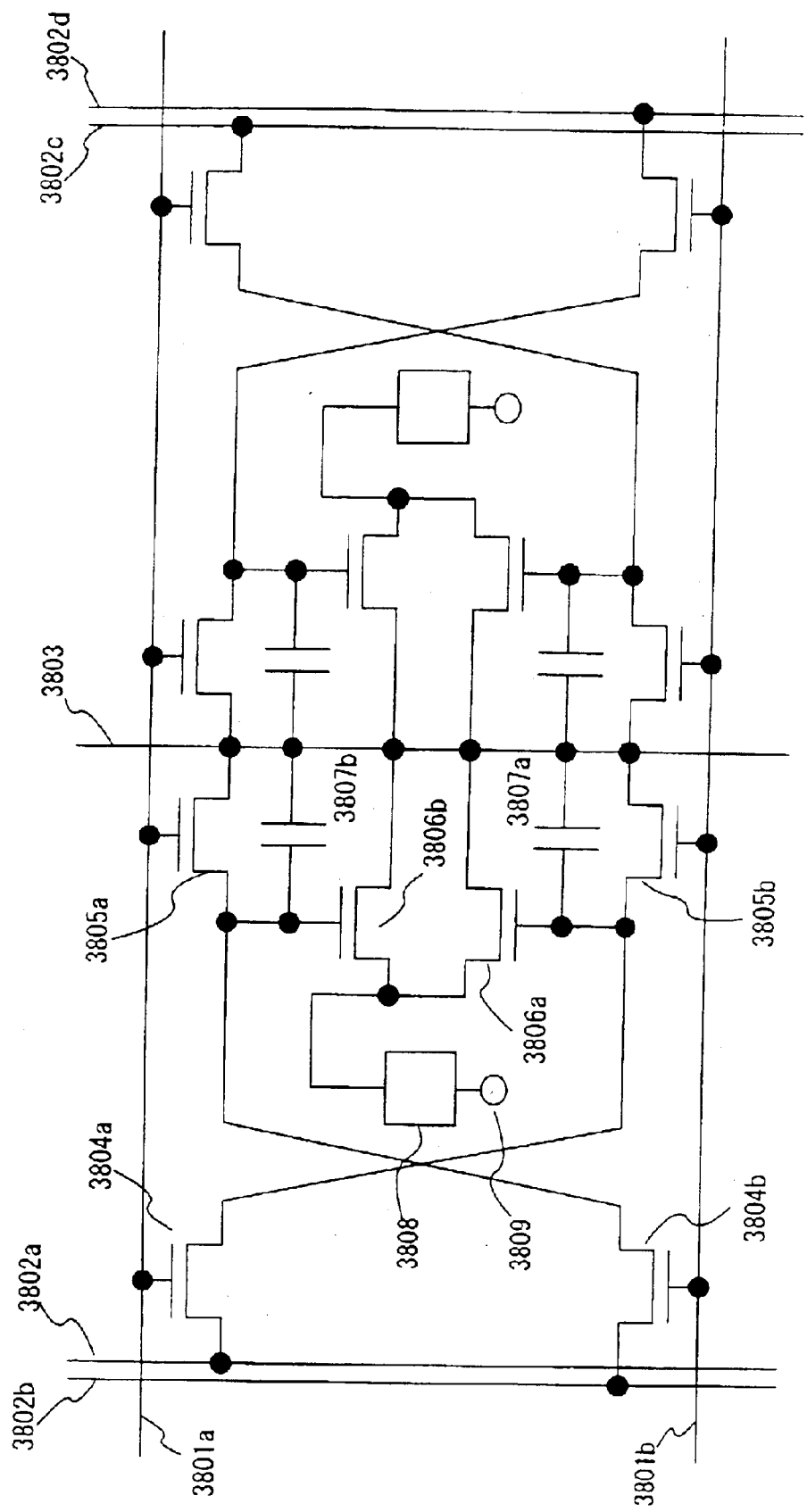
FIG. 6 is a diagram showing a circuit configuration of the pixel of the EL display of the present invention.
Figure 7:
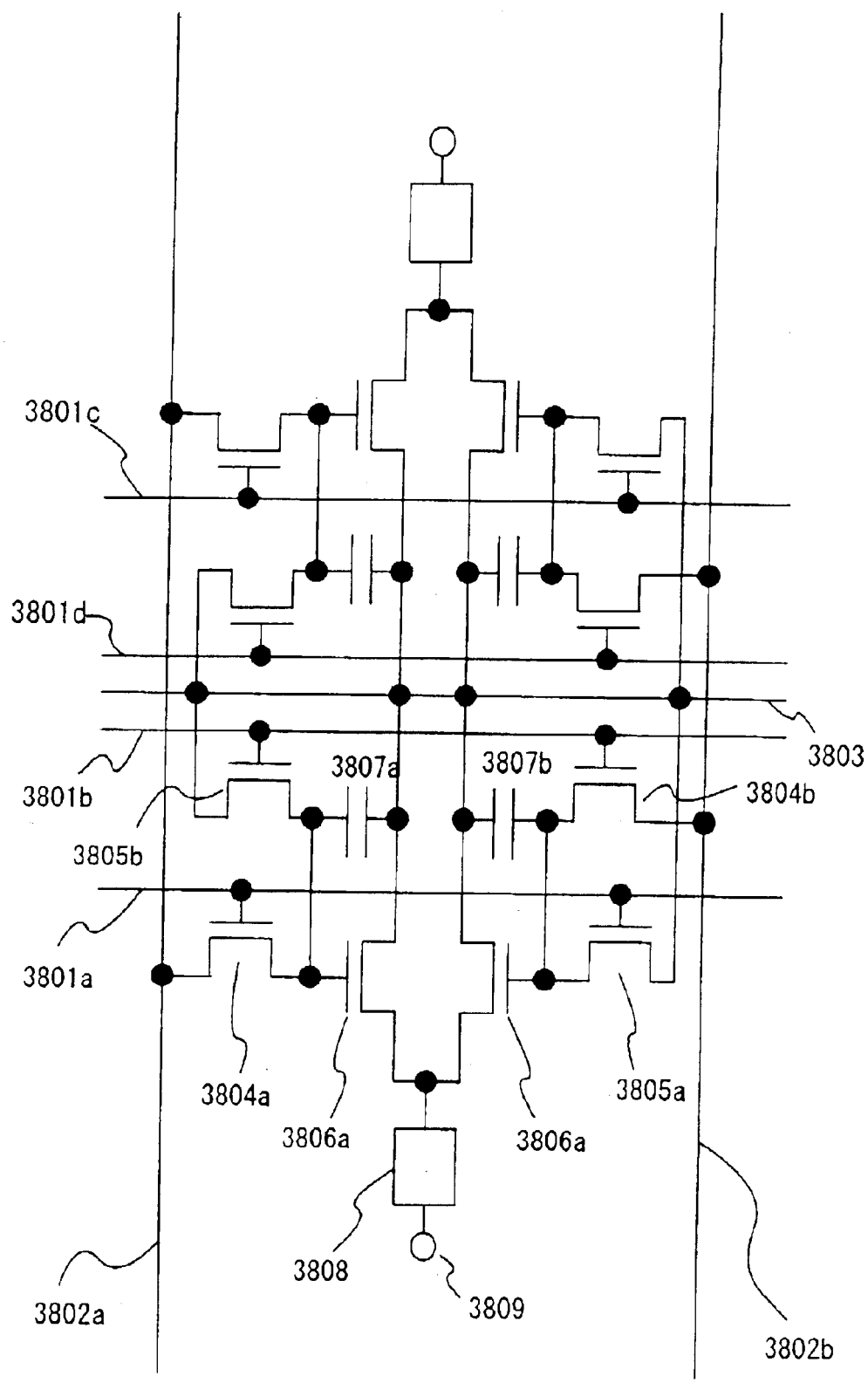
FIG. 7 is a diagram showing a circuit configuration of the pixel of the EL display of the present invention.

In this embodiment, an example of a case in which a pixel constitution shown in FIGS. 5, 6 and 7 differs from that of the circuit diagram (constitution) shown in FIG. 3. Note that in this embodiment, reference numeral 3801*a*, 3801*b* denotes gate wirings (a portion of the signal line) of a switching TFT 3804*a*, 3804*b*, 3802*a* and 3802*b* denotes a source wiring (a portion of the source signal line) of a switching TFT 3804*a*. 3804*b*, 3806*a*, 3806*b* denotes a EL driver TFT, 3805*a*, 3805*b* denotes a erasing TFT. 3808 denotes an EL element, 3803 denotes electric current supply lines, and 3807*a* and 3807*b* denote a capacitors.

Further, FIG. 5 is an example of a case in which the electric current supple line 3803 is formed parallel to the gate wirings 3801*a* and 3801*b*. In FIG. 5, the structure is formed such that the electric current supply line 3803 and the gate wirings 3801*a*. 3801*b* not to overlap. However, forming both in different layers, the films can be located overlapping each other with an insulating film therebetween. In this case, the exclusive surface area can be shared by the electric current supply line 3803 and the gate wiring 3801*a*, 3801*b*, and the pixel portion can be made with higher definition.

FIGS. 6 and 7 are an example of a case in which the electric current supply line 3803 is common between two pixels. Namely, this is characterized in that the two pixels are formed having linear symmetry around the electric current supply line 3803. In this case, the number of the electric current supply line can be reduced, and therefore the pixel portion can be made with higher definition.

Furthermore, FIG. 6 is an example of a case in that the electric current supply line 3803 and the source wiring 3802*a*, 3802*b* are formed in parallel. FIG. 7 is an example of a case in that the electric current supply line 3803 and the gate wiring 3801*a*, 3801*b* are formed in parallel. In FIGS. 6 and 7, when it is possible to provide the electric current supply line 3808 so as to overlap with one of the source wiring 3802*a* to 3802*d* or the gate wiring 3801*a* to 3801*b*, it is effective to provide them so as to overlap with each other. In this case, the number of electric current supply lines can be reduced, and therefore the pixel portion can be made with higher definition.

[Embodiment 6]

An example of manufacturing an EL display using the present invention is explained in this embodiment.

Figure 12A:
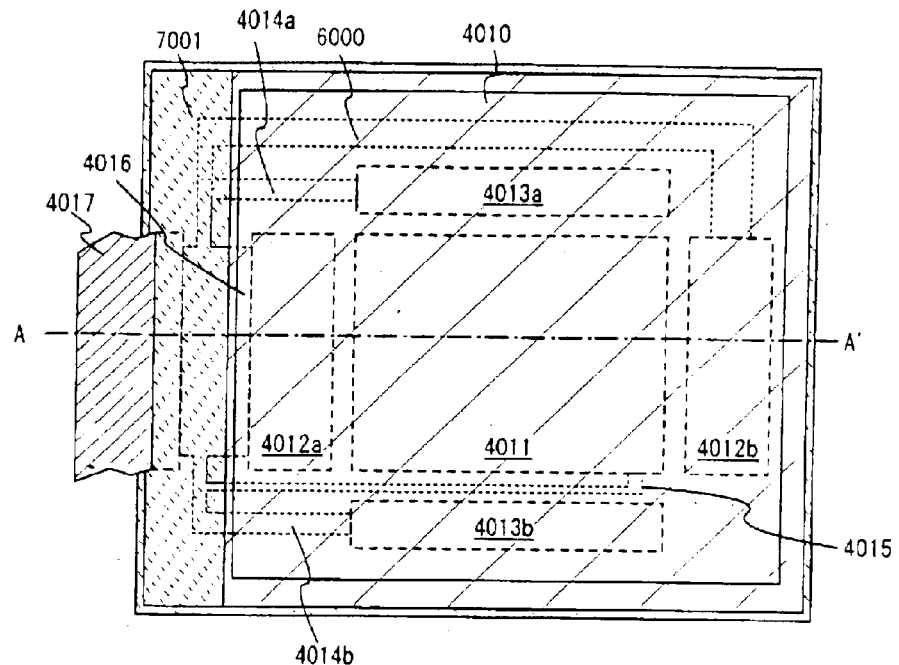
FIGS. 12A and 12B are a top view and a cross-sectional view, respectively, of the EL display of the present invention.

FIG. 12A is a top view of an EL display device using the present invention. In FIG. 9A, reference numeral 4010 is a substrate, reference numeral 4011 is a pixel portion, reference numeral 4012*a*, 4012*b* are a source signal side driver circuit, and reference numeral 4013*a*, 4013*b* are a gate signal side driver circuit. Each driver circuits and electric current supply line are connected to external equipment, through an FPC 4017, via wirings 4016*a*, 4016*b*, 4014*a*, 4014*b* and 4015.

A covering material 6000, a sealing material (also referred to as a housing material) 7000, and an airtight sealing material (a second sealing material) 7001 are formed so as to enclose at least the pixel portion, preferably the driver circuits and the pixel portion, at this point.

Figure 12B:
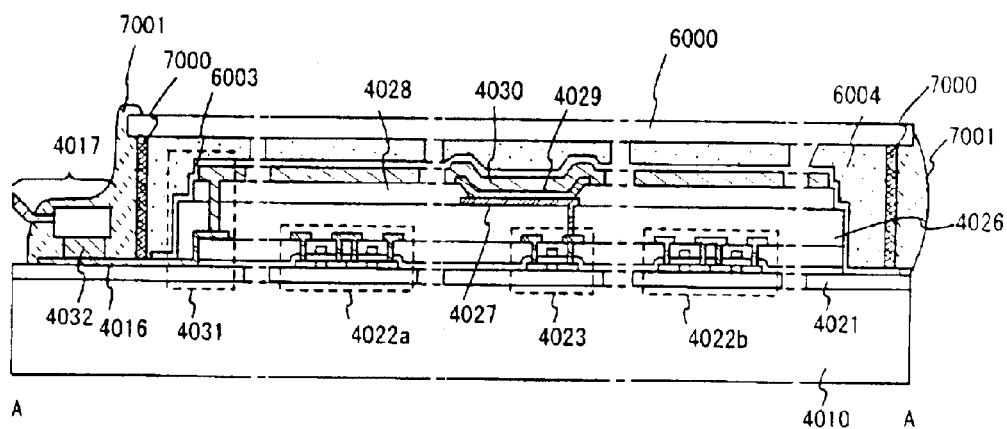

Further, FIG. 12B is a cross sectional structure of the EL display device of the present invention in which FIG. 12A is cut along the line A—A'. A driver circuit TFT 4022*a*, 4022*b* (note that a CMOS circuit in which an n-channel TFT and a p-channel TFT are combined is shown in the figure here), a pixel portion TFT 4023 (note that only an EL driver TFT for controlling the current flowing to an EL element is shown here) are formed on a base film 4021 on a substrate 4010. The TFTs may be formed using a known structure (a top gate structure or a bottom gate structure).

After the driver circuit TFT 4022*a*, 4022*b* and the pixel portion TFT 4023 are completed, a pixel electrode 4027 is formed on an interlayer insulating film (leveling film) 4026 made from a resin material. The pixel electrode is formed from a transparent conducting film for electrically connecting to a drain of the pixel TFT 4023. An indium oxide and tin oxide compound (referred to as ITO) or an indium oxide and zinc oxide compound can be used as the transparent conducting film. An insulating film 4028 is formed after forming the pixel electrode 4027, and an open portion is formed on the pixel electrode 4027.

An EL layer 4029 is formed next. The EL layer 4029 may be formed having a lamination structure, or a single layer structure, by freely combining known EL materials (such as a hole injecting layer, a hole transporting layer, a light emitting layer, an electron transporting layer, and an electron injecting layer). A known technique may be used to determine which structure to use. Further, EL materials exist as low molecular weight materials and high molecular weight (polymer) materials. Evaporation is used when using a low molecular weight material, but it is possible to use easy methods such as spin coating, printing, and ink jet printing when a high molecular weight material is employed.

In this embodiment, the EL layer is formed by evaporation using a shadow mask. Color display becomes possible by forming emitting layers (a red color emitting layer, a green color emitting layer, and a blue color emitting layer), capable of emitting light having different wavelengths, for each pixel using a shadow mask. In addition, methods such as a method of combining a charge coupled layer (CCM) and color filters, and a method of combining a white color light emitting layer and color filters may also be used. Of course, the EL display device can also be made to emit a single color of light.

After forming the EL layer 4029, a cathode 4030 is formed on the EL layer. It is preferable to remove as much as possible any moisture or oxygen existing in the interface between the cathode 4030 and the EL layer 4029. It is therefore necessary to use a method of depositing the EL layer 4029 in an inert gas atmosphere or the cathode 4030 within a vacuum. The above film deposition becomes possible in this embodiment by using a multi-chamber method (cluster tool method) film deposition apparatus.

Note that a lamination structure of a LiF (lithium fluoride) film and an Al (aluminum) film is used in this embodiment as the cathode 4030. Specifically, a 1 nm thick LiF (lithium fluoride) film is formed by evaporation on the EL layer 4029, and a 300 nm thick aluminum film is formed on the LiF film. An MgAg electrode, a known cathode material, may of course also be used. The wiring 4016 is then connected to the cathode 4030 in a region denoted by reference numeral 4031. The wiring 4016 is an electric power supply line for imparting a predetermined voltage to the cathode 4030, and is connected to the FPC 4017 through a conducting paste material 4032.

In order to electrically connect the cathode 4030 and the wiring 4016 in the region denoted by reference numeral 4031, it is necessary to form a contact hole in the interlayer insulating film 4026 and the insulating film 4028. The contact holes may be formed at the time of etching the interlayer insulating film 4026 (when forming a contact hole for the pixel electrode) and at the time of etching the insulating film 4028 (when forming the opening portion before forming the EL layer). Further, when etching the insulating film 4028, etching may be performed all the way to the interlayer insulating film 4026 at one time. A good contact hole can be formed in this case, provided that-the interlayer insulating film 4026 and the insulating film 4028 are the same resin material.

A passivation film 6003, a filling material 6004, and the covering material 6000 are formed covering the surface of the EL element thus made.

In addition, the sealing material 7000 is formed between the covering material 6000 and the substrate 4010, so as to surround the EL element portion, and the airtight sealing material (the second sealing material) 7001 is formed on the outside of the sealing material 7000.

The filling material 6004 functions as an adhesive for bonding the covering material 6000 at this point. PVC (polyvinyl chloride), epoxy resin, silicone resin. PVB (polyvinyl butyral), and EVA (ethylene vinyl acetate) can be used as the filling material 6004. If a drying agent is formed on the inside of the filling material 6004, then it can continue to maintain a moisture absorbing effect, which is preferable.

Further, spacers may be contained within the filling material 6004. The spacers may be a powdered substance such as BaO, giving the spacers themselves the ability to absorb moisture.

When using spacers, the passivation film 6003 can relieve the spacer pressure. Further, a film such as a resin film can be formed separately from the passivation film to relieve the spacer pressure.

Furthermore, a glass plate, an aluminum plate, a stainless steel plate, an FRP (fiberglass-reinforced plastic) plate, a PVF (polyvinyl fluoride) film, a Mylar film, a polyester film, and an acrylic film can be used as the covering material 6000. Note that if PVB or EVA is used as the filling material 6004, it is preferable to use a sheet with a structure in which several tens of sum of aluminum foil is sandwiched by a PVF film or a Mylar film.

However, depending upon the light emission direction from the EL element (the light radiation direction), it is necessary for the covering material 6000 to have light transmitting characteristics.

Further, the wiring 4016 is electrically connected to the FPC 4017 through a gap between the sealing material 7000, the sealing material 7001 and the substrate 4010. Note that although an explanation of the wiring 4016 has been made here, the wirings 4014*a*, 4014*b* and 4015 are also electrically connected to the FPC 4017 by similarly passing underneath the sealing material 7001, sealing material 7000 and the substrate 4010.

In this embodiment, the covering material 6000 is bonded after forming the filling material 6004, and the sealing material 7000 is attached so as to cover the lateral surfaces (exposed surfaces) of the filling material 6004, but the filling material 6004 may also be formed after attaching the covering material 6000 and the sealing material 7000. In this case, a filling material injection opening is formed through a gap formed by the substrate 4010, the covering material 6000, and the sealing material 7000. The gap is set into a vacuum state (a pressure equal to or less than $10^{-2}$ Torr), and after immersing the injection opening in the tank holding the filling material, the air pressure outside of the gap is made higher than the air pressure within the gap, and the tilling material fills the gap.

Note that it is possible to implement the constitution of this embodiment by freely combining it with the constitution of embodiment 1 or embodiment 5.

[Embodiment 7]

An example of an EL display in accordance with the present invention, manufactured in a form different from that of Embodiment 6 according to the present invention, will be described with reference to FIGS. 13A and 13B. Portions or components identical or corresponding to those in FIGS. 12A and 12B are indicated by the same reference characters, and the description for them will not be repeated.

Figure 13A:
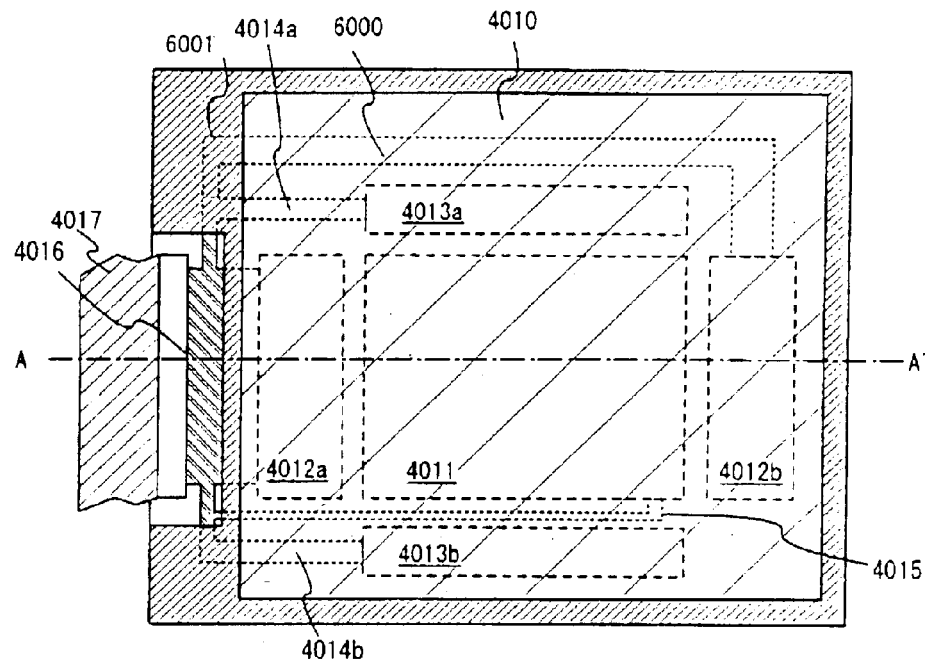
FIGS. 13A and 13B are a top view and a cross-sectional view, respectively, of the EL display of the present invention.
Figure 13B:
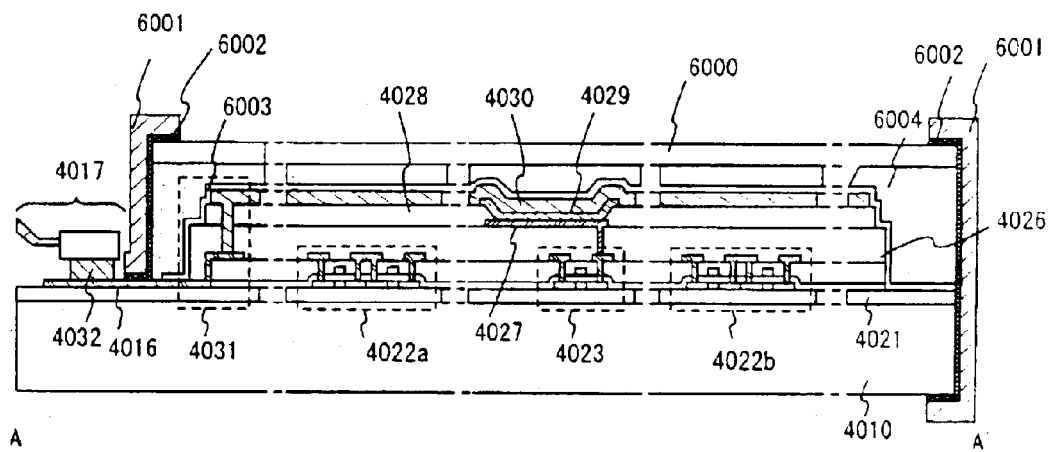

FIG. 13A is a top view of the EL display of Embodiment 7, and FIG. 13B is a cross-sectional view taken along the line A—A' in FIG. 13A.

Internal portions of the EL device below a passivation film 6003 which covers a surface of the EL element are formed in the same manner as Embodiment 6.

Further, a filler 6004 is provided so as to cover the EL element. The filler 6004 also functions as an adhesive for bonding a cover member 6000. As filler 6004, polyvinyl chloride (PVC), epoxy resin, silicone resin, polyvinyl butyral (PVB) or ethylene-vinyl acetate (EVA) may be used. Preferably, a desiccant is provided in the filler 6004 to maintain a moisture absorbing effect.

The filler 6004 may also contain a spacer. The spacer may be particles of BaO or the like such that the spacer itself has a moisture absorbing effect.

If a spacer is provided, the passivation film 6003 can reduce the influence of the spacer pressure. A resin film or the like may also be provided independently of the passivation film to reduce the influence of the spacer pressure.

As the cover member 6000, a glass sheet, an aluminum sheet, a stainless steel sheet, a fiberglass-reinforced plastic (FRP) sheet, polyvinyl fluoride (PVF) film. Mylar film, polyester film, acrylic film, or the like may be used. If PVB or EVA is used as filler 6004, it is preferable to use a sheet having a structure in which an aluminum foil having a thickness of several tens of m is sandwiched between PVF or Mylar films.

Some setting of the direction of luminescence from the EL element (the direction in which light is emitted) necessitates making the cover member 6000 transparent.

Next, the cover member 6000 is bonded by using the filler 6004. Thereafter, a frame member 6001 is attached so as to cover side surfaces (exposed surfaces) formed by the filler 6004. The frame member 6001 is bonded by a sealing member 6002 (functioning as an adhesive). Preferably, a photo-setting resin is used as sealing member 6002. However, a thermosetting resin may be used if the heat resistance of the EL layer is high enough to allow use of such a resin. It is desirable that the sealing member 6002 has such properties as to inhibit permeation of moisture and oxygen as effectively as possible. A desiccant may be mixed in the sealing member 6002.

Also wiring 4016 is electrically connected to a flexible printed circuit (FPC) 4017 by being passed through a gap between the sealing member 6002 and the substrate 4010. While the electrical connection of the wiring 4016a has been described, other wirings 4016b, 4014a, 4014b, and 4015 are also connected electrically to the FPC 4017 by being passed through the gap between the sealing member 6002 and the substrate 4010.

In Embodiment 7, after the filler 6004 has been provided, the cover member 6000 is bonded and the frame member 6001 is attached so as to cover the side surfaces (exposed surfaces) of the filler 6004. However, the filler 6004 may be provided after attachment of the cover member 6000 and the frame member 6001. In such a case, a filler injection hole is formed which communicates with a cavity formed by the substrate 4010, the cover member 6000 and the frame member 6001. The cavity is evacuated to produce a vacuum (at $10^{-2}$ Torr or lower), the injection hole is immersed in the filler in a bath, and the air pressure outside the cavity is increased relative to the air pressure in the cavity, thereby filling the cavity with the filler.

It is noted that Embodiment 7 can be combined with any of Embodiments 1 to 5.

[Embodiment 8]

Figure 14A:
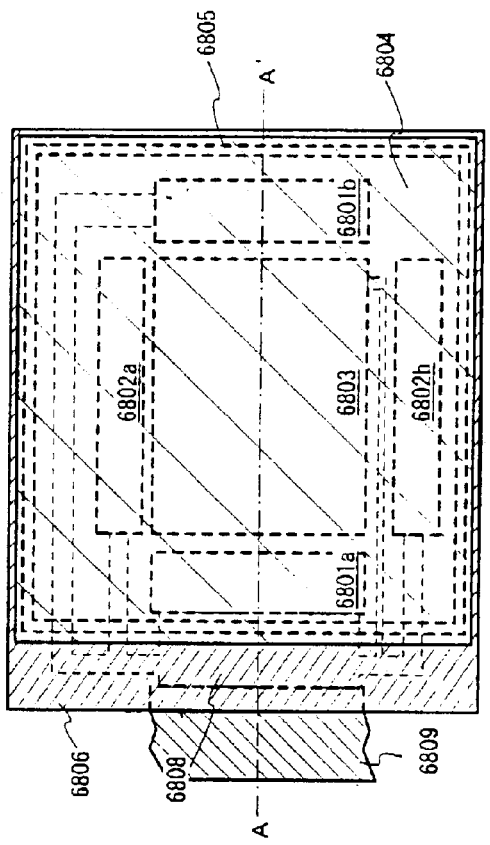
FIGS. 14A and 14B are a top view and a cross-sectional view, respectively, of the EL display of the present invention.

The EL display of the present invention will be explained in Embodiment 8 with reference to FIGS. 14A and 14B. FIG. 14A is a top view showing the state of the device in which sealing of the EL element formed on the TFT substrate is completed. Indicated by dotted lines, reference numerals 6801a and 6801b denote source signal line driver circuits, 6802a and 6802b denote writing-in gate signal line driver circuits, and 6803 denotes a pixel portion. Further, reference numeral 6804 denotes a covering member, 6805 denotes a first sealing member, and 6806 denotes a second sealing member. A filler 6807 (refer to FIG. 14B) is filled in a space, which is formed inside the sealed substrate, surrounded by the first sealing member 6805 and between the covering member and the TFT substrate.

Denoted by reference numeral 6808 is a connecting wiring for transmitting a signal to be inputted to a pair of the source signal line driver circuits 6801a and 6801b, a pair of the gate signal line driver circuits 6802a, and 6802b, and the pixel portion 403. The connecting wiring 6808 receives a video signal and a clock signal from an FPC (Flexible Print Circuit) 409 serving as a connecting terminal to an external equipment.

Figure 14B:
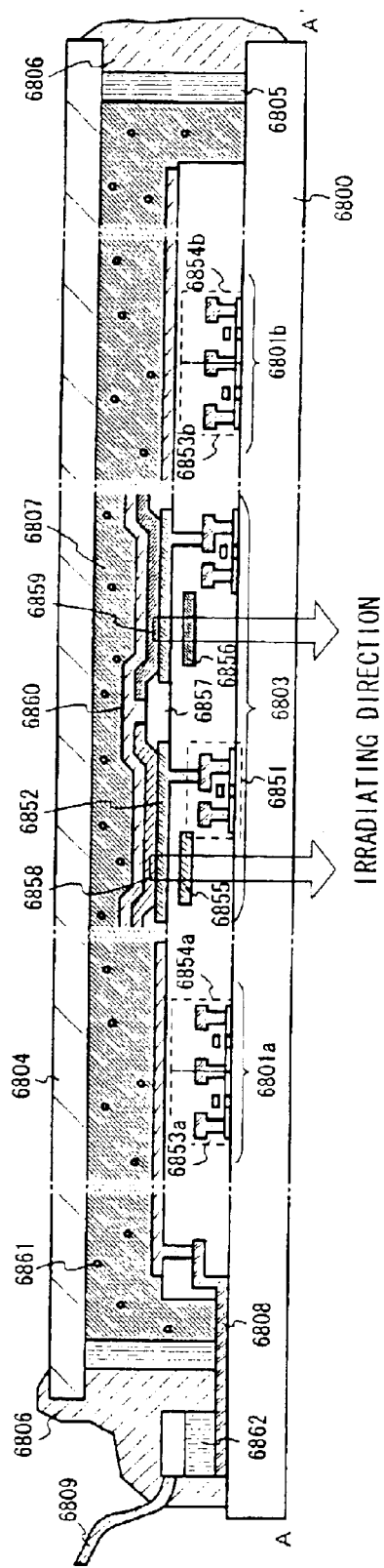

Shown in FIG. 14B is a sectional view corresponding to the cross-section taken along the line A—A' of FIG. 14A. In FIGS. 14A and 14B, the same reference numerals are used to denote the same components.

As shown in FIG. 14B, the pixel portion 6803 and the pair of the source signal line driver circuits 6801a and 6801b are formed on a substrate 6800. The pixel portion 6803 is composed of a plurality of pixels each including a TFT 6851 for controlling a current flowing to an EL element (hereinafter referred to as an EL driver TFT) and a pixel electrode 6852 that is electrically connected to the drain of the TFT 6851, and the like. In Embodiment 8, the EL driver TFT 6851 is formed of the P channel TFT. Furthermore, the pair of the source signal line driver circuits 6801a and 6801b is each formed using a CMOS circuit in which an N channel TFT 6853a and a P channel TFT 6854a are combined complementarily; and a CMOS circuit in which an N channel TFT 68536 and a P channel TFT 68546 are combined complementarily.

Each of the pixels has a color filter (R) 6855, a color filter (G) 6856, and a color filter (B) (not shown) under the pixel electrode. The color filter (R) is a color filter for extracting red light, the color filter (G) is a color filter for extracting green light, and the color filter (B) is a color filter for extracting blue light. It is to be noted that the color filter (R) 6855, the color filter (G) 6856, and the color filter (B) are provided in a red luminescing pixel, a green luminescing pixel, and a blue luminescing pixel, respectively.

First, improving the color purity of the color of the light emitted can be cited as an effect in the case of providing these color filters. For example, a red light is irradiated from an EL element that is from the red luminescing pixel (light is irradiated in a direction toward the pixel electrode side in Embodiment 8). The color purity of this red light can be improved by allowing this red light to pass through the color filter for extracting red light. This improvement in color purity by means of a color filter can be similarly applied to the other green and blue lights.

In a conventional structure without the provision of the color filters, visible radiation penetrating from the exterior of the EL display excites the light-emitting layer of the EL element, and therefore a problem occurs in which a desired color cannot be obtained. However, by providing color filters as in Embodiment 8, only light of a specific wavelength enters the EL element, in other words, the drawback of an external light exciting the EL element may be prevented.

Note that proposals to provide color filters in the structure have been made since the past but an EL element luminescing white was the EL element used in the structure. The light of another wavelength was cut in order to extract the red light in this case, resulting in inviting a reduction in luminance. Nevertheless, for example, because the red light emitted from the EL element is caused to pass through the color filter for extracting red light in Embodiment 8, there is no reduction in luminance.

Next, the pixel electrode 6852 is formed of a transparent conductive film and functions as the anode of the EL element. An insulating film 6857 is formed on each end of the pixel electrode 6852 to thereby further form a light-emitting layer 6858 emitting red light and a light-emitting layer 6859 emitting green light. It is to be noted that a light-emitting layer emitting blue light not shown in the drawing is provided in an adjacent pixel. Color display is thus performed by the pixels that correspond to the colors red, green, and blue. The color filter for extracting the blue color is of course provided in the pixel in which the light-emitting layer emitting blue light is formed.

Note that not only an organic material but also an inorganic material can be used as the material of the light-emitting layers 6858 and 6859. Also note that, though the structure shown here is composed of only the light-emitting layer, it may be a laminate structure in which the light-emitting layer is combined with an electron injection layer, an electron transportation layer, a hole transportation layer, or a hole injection layer.

A cathode 6860 of the EL element that is made of a conductive film having light blocking characteristics is formed-on top of the respective light-emitting layers. The cathode 6860 functions as a common wiring shared by all the pixels, and is electrically connected to the FPC 6809 via the connecting wiring 6808.

Next, the first sealing member 6805 is formed using a dispenser or the like, and a spacer (not shown) is sprayed to bond the first sealing member to the covering member 6804. The filler 6807 is then filled into the space surrounded by the TFT substrate, the covering member 6804, and the first sealing member 6805 by vacuum injection.

In Embodiment 8, barium oxide as a moisture absorbent material 6861 is added into the filler 6807 in advance. Note that though the moisture absorbent material is added into the filler used in Embodiment 8, it can be massively dispersed and sealed within the filler. In addition, it is also possible to use a moisture absorbent material as the material of a spacer not shown in the drawing.

After curing the filler 6807 with ultraviolet irradiation or heat, an opening portion (not shown) formed in the first sealing member 6805 is sealed up. Upon sealing up the opening portion of the first sealing member 6805, the connecting wiring 6808 and the FPC 6809 are electrically connected by using a conductive material 6862. Then, the second sealing member 6806 is disposed so as to cover the sides (exposed faces) of the first sealing member 6805 and a portion of the FPC 6809. The second sealing member 6806 may be formed from the same material as the first sealing member 6805.

By sealing the EL element within the filler 6807 using the method as described above, the EL element is completely cut off from external environment and invasion from the outside by substances that accelerate the oxidation degradation of the organic material, such as moisture and oxygen, can thus be prevented. Accordingly an EL display device of high reliability can be manufactured.

Further, according to Embodiment 8, an existing liquid crystal display manufacturing line can be diverted for manufacture of the device of the present invention to effectively reduce a capital investment in production of the device, and a plurality of light emitting devices can be manufactured on one substrate by a high-yield process, so that the manufacturing cost can be markedly reduced.

It is to be noted that Embodiment 8 can be combined with any of Embodiments 1 to 5.

[Embodiment 9]

Figure 15A:
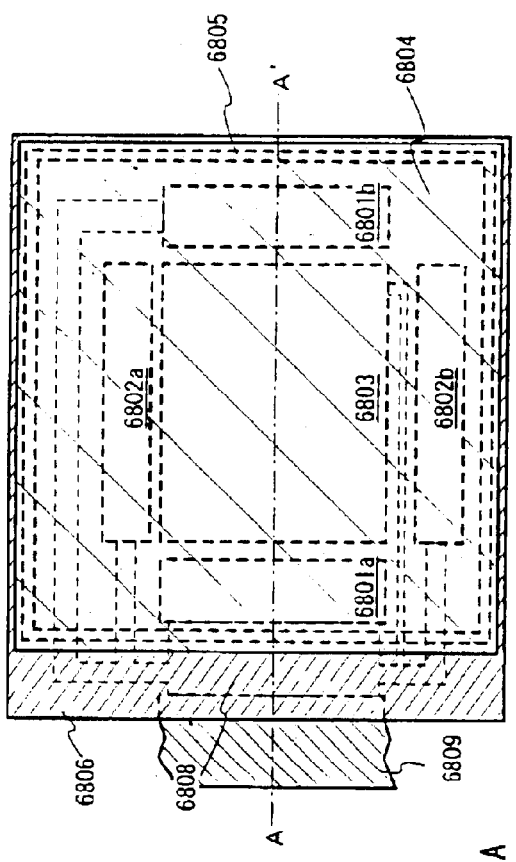
FIGS. 15A and 15B are a top view and a cross-sectional view, respectively, of the EL display of the present invention.
Figure 15B:
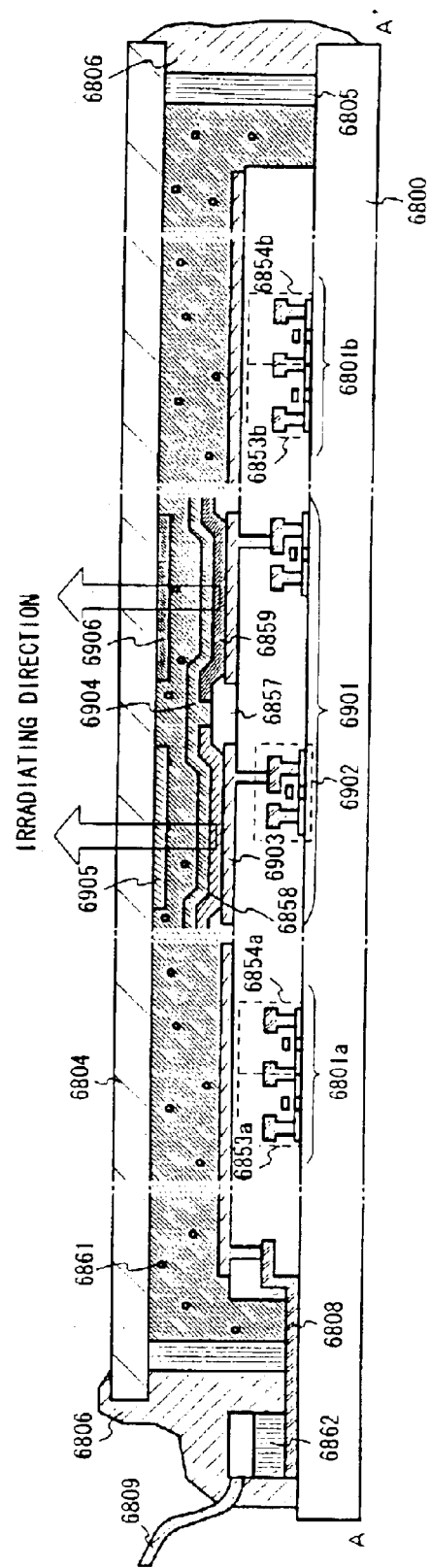

Shown in Embodiment 9 is an example of a case in which the emission direction of the light emitted from the EL element and the arrangement of the color filters in the EL display shown in Embodiment 8 are different. Though the explanation thereof will be made with reference to FIGS. 15A and 15B, the basic structure is the same as that of FIGS. 14A and 14B and therefore common reference numerals are used but only the modified components are denoted by new reference numerals and explained.

In Embodiment 9, the N channel TFT is used as an EL driver circuit 6902 in a pixel portion 6901. A pixel electrode 6903 that is formed of a conductive film having a light blocking characteristic is electrically connected to a drain of the EL driver circuit 6902. The pixel electrode 6903 serves as the cathode of the EL element in Embodiment 9.

A transparent conductive film 6904 is formed on the light-emitting layer 6858 emitting red light and the light-emitting layer 6859 emitting green light, which are formed by using the present invention. The transparent conductive film 6904 serves as the anode of the EL element.

In addition, a characteristic of Embodiment 9 is that a color filter (R) 6905, a color filter (G) 6906, and a color filter (B) (not shown) are formed on the covering member 6804. In the case of adopting the structure of the EL element of Embodiment 9, the light emitted from the light-emitting layer is in the direction towards the covering member side. Therefore, by adopting the structure of FIG. 15B, the color filters can be installed in the places of the paths of the light.

The manufacturing steps of the TFT substrate can be lessened by providing the color filter (R) 6905, the color filter (G) 6906, and the color filter (B) (not shown) on the covering member 6804 as in Embodiment 9. Consequently, merits such as improvement in yield and throughput can be attained.

It is to be noted that Embodiment 9 can be combined with any of Embodiments 1 to 5.

[Embodiment 10]

Figure 16:
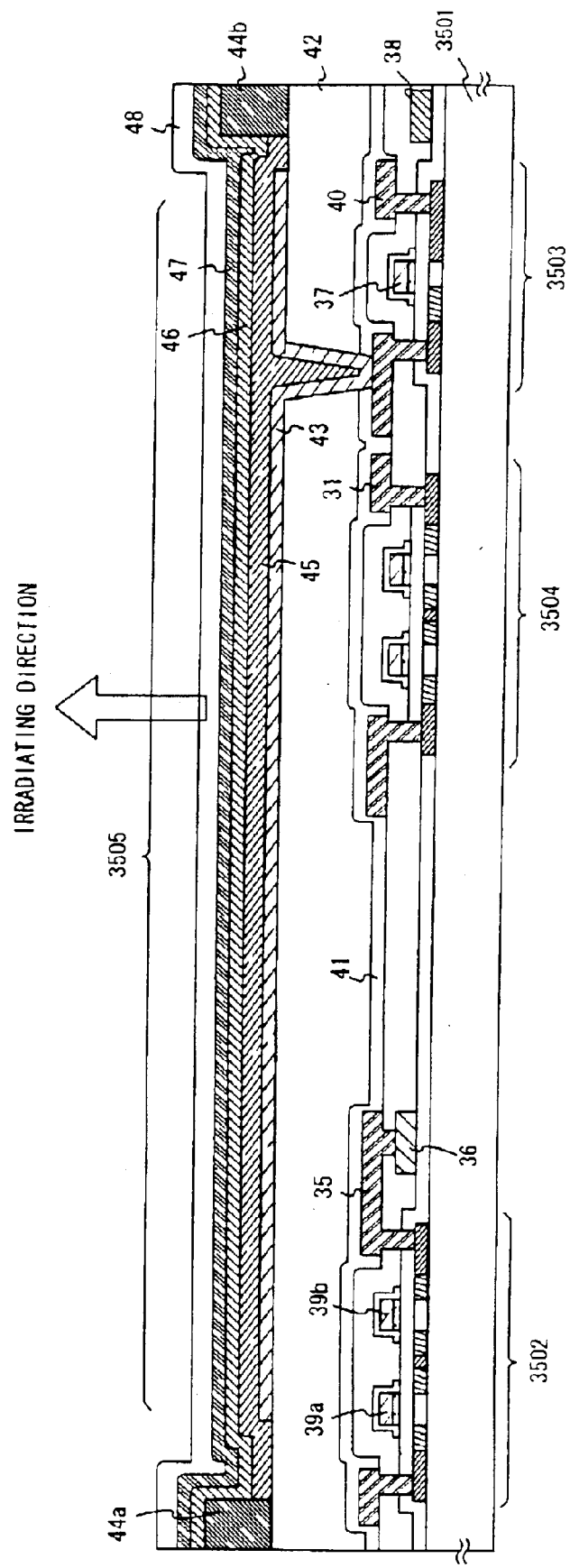
FIG. 16 is a cross-sectional view of the EL display of the present invention.

A more detailed cross sectional structure of a pixel portion is shown here in FIG. 16. A couple of switching TFT, erasing TFT and EL driver TFT can be a same structure respectively, so FIG. 16 shows only a switching TFT, a erasing TFT and an EL driver TFT.

In FIG. 16, the switching TFT 3502 formed on a substrate 3501 is manufactured by using an n-channel type TFT formed by a known method. A double gate structure is used in this embodiment. However, the single gate structure is a structure in which two TFTs are, in effect, connected in series, and it has the merit that an OFF current value can be decreased. Note that although a double gate structure is used in this embodiment, a single gate structure, a triple gate structure, and a multi gate structure possessing a greater number of gates may also be used. Further, the reference 38 denotes a gate signal line which connects the gate electrodes 38*a*, 38*b* of the switching TFT 3502 each other electrically.

An erasing TFT 3504 is an n-channel TFT, and is manufactured using a known method. A double gate structure is used in this embodiment. However, the double-gate structure is a structure in which two TFTs are, in effect, connected in series, and it has the merit that an OFF current value can be decreased. Note that although a double gate structure is used in this embodiment, a single gate structure, a triple gate structure, and a multi gate structure possessing a greater number of gates may also be used. A drain wiring 31 of an erasing TFT 3504 is electrically connected to a drain wiring 35 of the switching TFT 3502 and a gate electrode 37 of an EL driving TFT by a wiring 36.

A switching TFT 3502 and an erasing TFT 3504 can be using an p-channel TFT manufactured using a known method. It is preferable that the switching TFT 3502 and the erasing TFT 3504 use a same type TFT (n-channel or p-channel).

An EL driving TFT 3503 is using an n-channel TFT manufactured using a known method. A gate electrode 37 of the EL driving TFT is electrically connected to a drain wiring 35 of the switching TFT 3502 and a drain wiring 31 of the easing TFT 3504 by a wiring 36.

Since the EL driving TFT is an element for controlling the magnitude of a current to flow through the EL element, it is an element through which a large amount of current flows and which is highly liable to deterioration ascribable to heat and also deterioration ascribable to hot carriers. Therefore, that structure of the present invention in which an LDD region is provided on the drain side of the EL driving TFT so as to overlap the gate electrode through a gate insulating film is very effective.

A single gate structure of the EL driving TFT 3503 is shown in the figures in this embodiment, but a double gate structure or a multi-gate structure possessing a greater number of gates may also be used. In addition, a structure in which a plurality of TFTs are connected in parallel, effectively partitioning into a plurality of channel forming regions, and which can perform radiation of heat with high efficiency, may also be used. This structure is effective to deal with the deterioration ascribable to heat.

Furthermore, a source wiring 40 is connected to an electric power supply line, and a constant voltage is always applied.

A first passivation film 41 is formed on the switching TFT 3502, the EL driving TFT 3503 and the erasing TFT 3504, and a leveling film 42 is formed on top of that from an insulating resin film. It is extremely important to level the step due to the TFTs using the leveling film 42. An EL layer formed later is extremely thin, so there are cases in which defective light emissions occur. Therefore, to form the EL layer with as level a surface as possible, it is preferable to perform leveling before forming a pixel electrode.

Furthermore, reference numeral 43 denotes a pixel electrode (EL element cathode) made from a conducting film with high reflectivity, and this is electrically connected to a drain region of the EL driving TFT 3503. It is preferable to use a low resistance conducting film, such as an aluminum alloy film, a copper alloy film, and a silver alloy film, or a laminate of such films. Of course, a lamination structure with another conducting film may also be used.

In addition, a light emitting layer 45 is formed in a groove (corresponding to a pixel) formed by banks 44*a* and 44*b*, which are formed by insulating films (preferably resins). Note that only one pixel is shown in the figures here, but the light emitting layer may be formed and divided to correspond to each of the colors R (red), G (green), and B (blue). A π conjugate polymer material is used as an organic EL material. Polyparaphenylene vinylenes (PPV), polyvinyl carbazoles (PVK), and polyfluoranes can be given as typical polymer materials.

Note that there are several types of PPV organic EL materials, and materials recorded in Schenk, H., Becker, O., Gelsen, O., Kluge, E., Kreuder, W., and Spreitzer, H., "Polymers for Light Emitting Diodes", Euro Display Proceedings, 1999, pp. 33–37, and in Japanese Patent Application Laid-open No. Hei 10-92576, for example, may be used.

As specific light emitting layers, cyano-polyphenylene vinylene may be used as a red light radiating luminescence layer, polyphenylene vinylene may be used as a green light radiating luminescence layer, and polyphenylene vinylene or polyalkylphenylene may be used as a blue light radiating luminescence layer. The film thicknesses may be between 30 and 150 nm (preferably between 40 and 100 nm).

However, the above example is one example of the organic EL materials which can be used as luminescence layers, and it is not necessary to limit use to these materials. An EL layer (a layer for emitting light and for performing carrier motion for such) may be formed by freely combining light emitting layers, electric charge transporting layers, and electric charge injecting layers.

For example, this embodiment shows an example of using a polymer material as a light emitting layer, but a low molecular weight organic EL material may also be used. Further, it is possible to use inorganic materials such as silicon carbide, as an electric charge transporting layer or an electric charge injecting layer. Known materials can be used for these organic EL materials and inorganic materials.

A laminar structure EL layer, in which a hole injecting layer 46 made from PEDOT (polythiophene) or PAni (polyaniline) is formed on the luminescence layer 45, is used in this embodiment. An anode 47 is then formed on the hole injecting layer 46 from a transparent conducting film. The light generated by the light emitting layer 45 is radiated toward the upper surface (toward the top of the TFT) in this embodiment, and therefore the anode must be transparent to light. An indium oxide and tin oxide compound, or an indium oxide and zinc oxide compound can be used for the transparent conducting film. However, because it is formed after forming the low heat resistance light emitting and hole injecting layers, it is preferable to use a material which can be deposited at as low a temperature as possible.

An EL element 3505 is complete at the point where the anode 47 is formed. Note that what is called the EL element 3505 here is formed by the pixel electrode (cathode) 43, the light emitting layer 45, the hole injecting layer 46, and the anode 47. The pixel electrode 43 is nearly equal in area to the pixel, and consequently the entire pixel functions as an EL device. Therefore, the light emitting efficiency is extremely high, and a bright image display becomes possible.

In addition, a second passivation film 48 is then formed on the anode 47 in this embodiment. It is preferable to use a silicon nitride film or an oxidized silicon nitride film as the second passivation film 48. The purpose of this is the isolation of the EL element from the outside, and this is meaningful in preventing degradation due to oxidation of the organic EL material, and in controlling gaseous emitted from the organic EL material. The reliability of the EL display can thus be raised.

The EL display of the present invention has a pixel portion made from pixels structured as in FIG. 16, and has a switching TFT with a sufficiently low OFF current value, an erasing TFT and a EL driver control TFT which is strong with respect to hot carrier injection. An EL display panel having high reliability, and in which good image display is possible, can therefore be obtained.

The construction of this embodiment can be performed by being optionally combined with the constructions of Embodiments 1 to 7.

[Embodiment 11]

Figure 17:
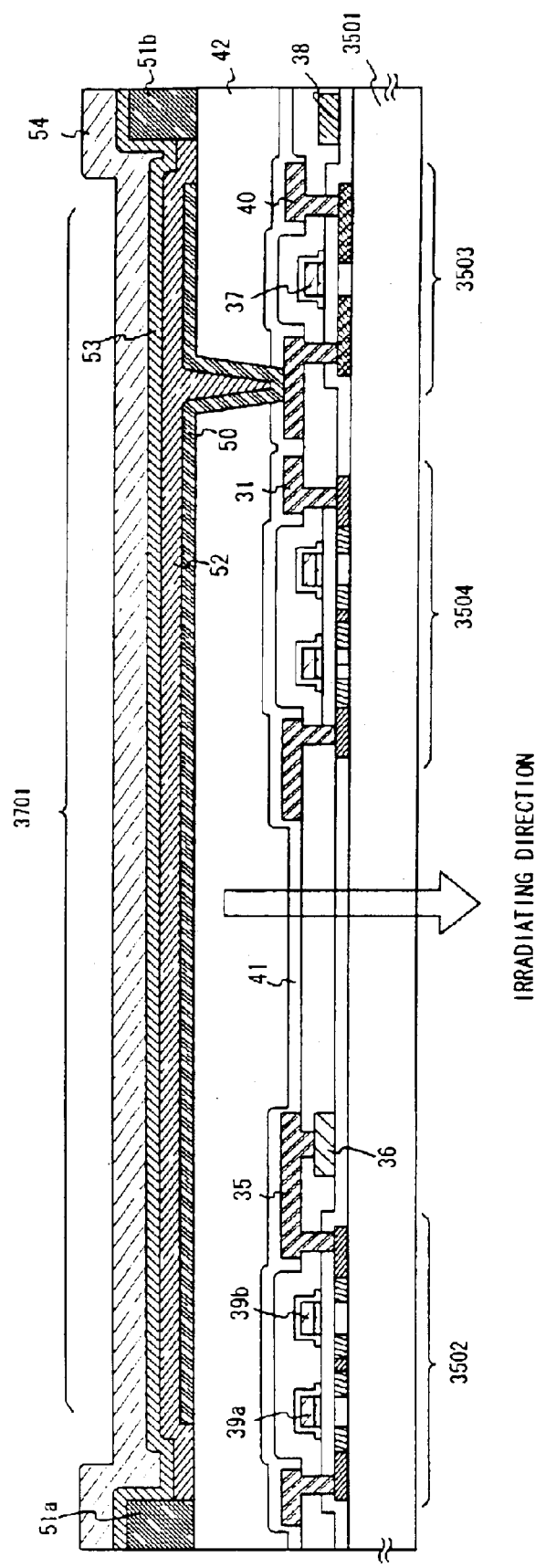
FIG. 17 is a cross-sectional view of the EL display of the present invention.
Figure 18:
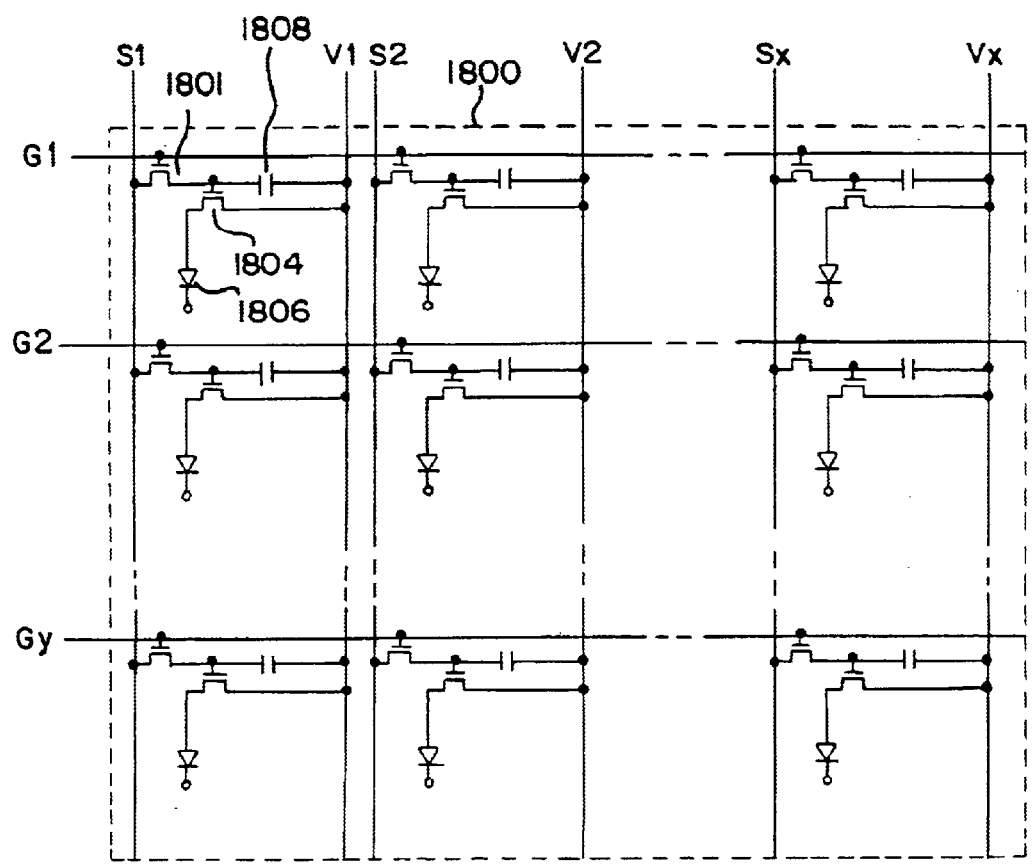
FIG. 18 is a diagram showing a circuit configuration of a pixel portion of a conventional EL display.
Figure 19:
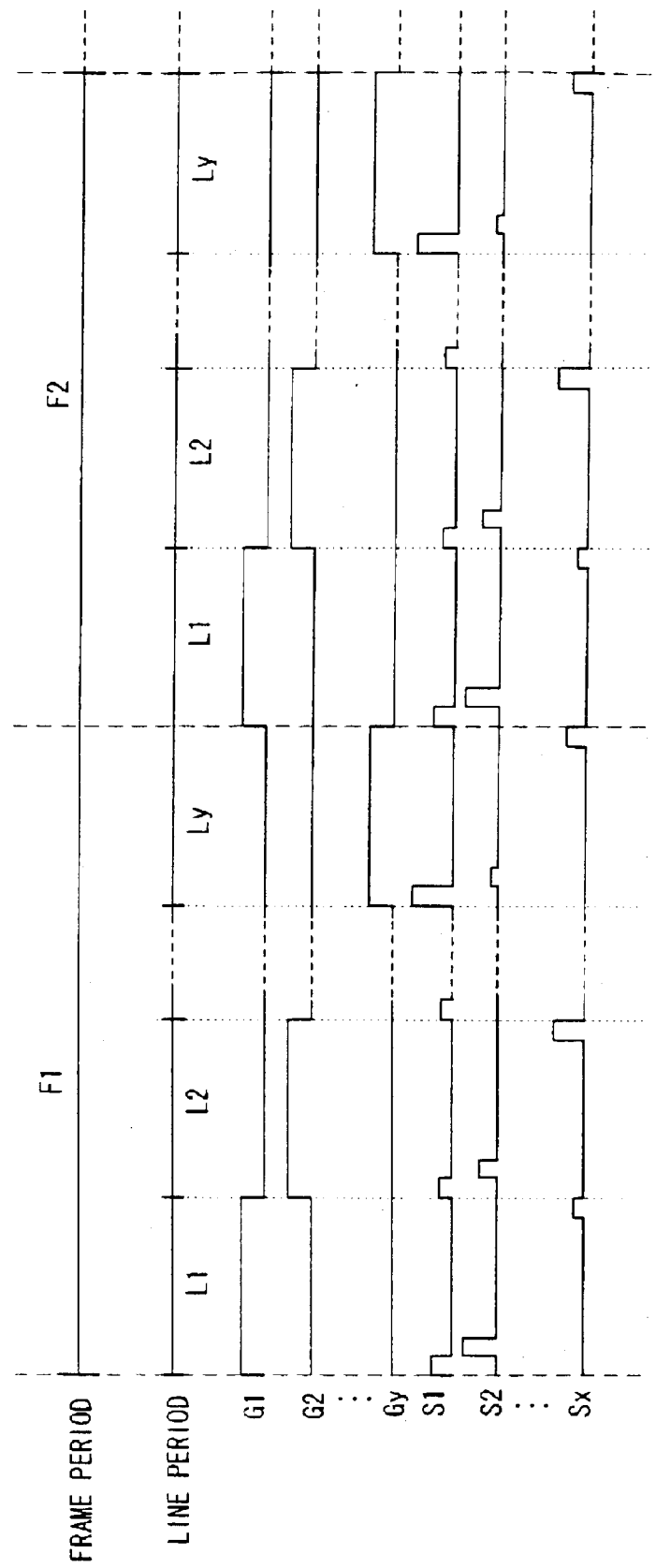
FIG. 19 is a diagram illustrating a driving method of the EL display of the present invention.
Figure 20A:
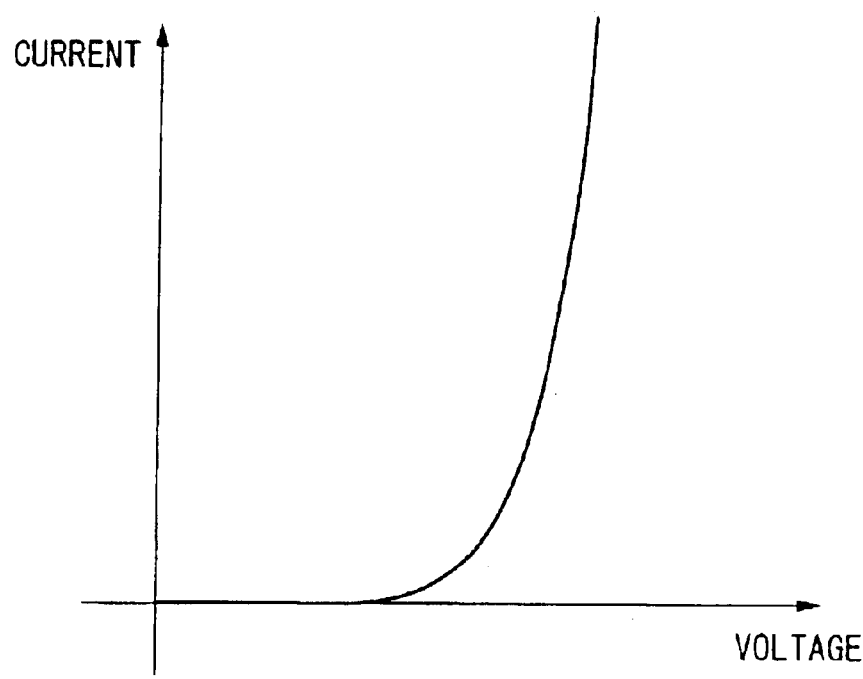
FIGS. 20A to 20B are diagrams showing power-supply voltage characteristics of an EL element and a TFT, respectively.
Figure 20B:
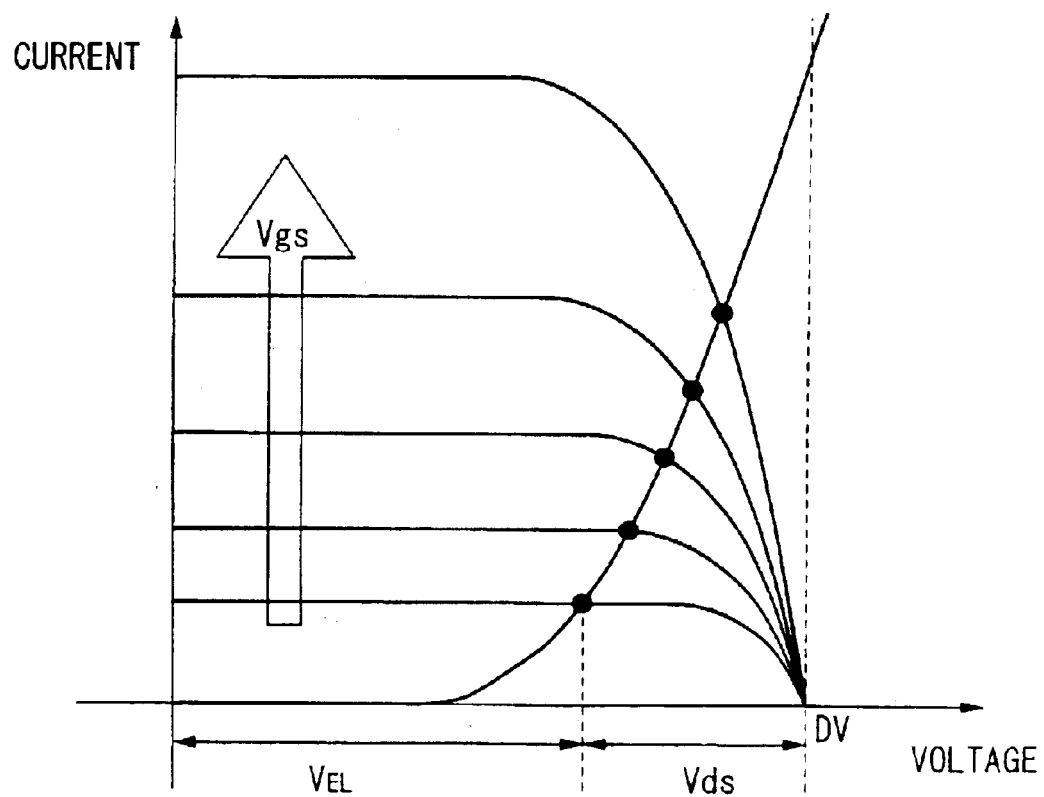

In this embodiment, there will be described a construction in which the structure of the EL element 3505 is reversed in the pixel portion stated in Embodiment 10. Reference will be had to FIG. 17. Incidentally, since the points of difference from the structure shown in FIG. 16 lie only in parts of the EL element and the EL driver TFT the others shall be omitted from description.

Referring to FIG. 17, an EL driver TFT 3503 is formed using the p-channel TFT manufactured by known method.

In this embodiment, a transparent conductive film is employed as a pixel electrode (anode) 50. Concretely, the conductive film is made of a compound of indium oxide and zinc oxide. Of course, a conductive film made of a compound of indium oxide and tin oxide may well be employed.

Besides, after banks 51a and 51b made of an insulating film have been formed, a luminescent layer 52 made of polyvinylcarbazole is formed on the basis of the application of a solution. The luminescent layer 52 is overlaid with an electron injection layer 53 made of potassium acetylacetonate (expressed as "acacK"), and a cathode 54 made of an aluminum alloy. In this case, the cathode 54 functions also as a passivation film. Thus, an EL element 3701 is formed.

In the case of this embodiment, light generated by the luminescent layer 52 is radiated toward a substrate formed with TFTs as indicated by an arrow.

By the way, the construction of this embodiment can be performed by being optionally combined with the constructions of Embodiments 1 to 7.

[Embodiment 12]

In FIGS. 3 and 5, the capacitor is provided so as to hold a voltage applied to a gate electrode of the EL driving TFT. However, the capacitor can be omitted. Since the n-channel TFT is used as the EL driving TFT, the EL driving TFT has an LDD region provided so as to overlap a gate electrode via a gate insulating film. In this region, a parasitic capacitor called a gate capacitor is generally formed. This embodiment is characterized in that the parasitic capacitor is used positively so as to hold a voltage applied to a gate electrode of the EL driving TFT.

The capacitance of the parasitic capacitor is varied depending upon the area in which the above-mentioned gate electrode overlaps the LDD region.

[Embodiment 13]

The embodiments of the present invention are explained using FIGS. 21 to 23A method of simultaneous manufacture of a pixel portion, and TFTs of a driver circuit portion formed in the periphery of the pixel portion, is explained here. Note that in order to simplify the explanation, a CMOS circuit is shown as a basic circuit for the driver circuits. The erasing TFT, the switching TFT and the EL driver TFT have a same structure which are provided two by two in each pixel. The erasing TFT can be formed by the same method of the switching TFT or the EL driver TFT, so the switching TFT and the EL driver TFT are shown one by one as a pixel TFT in this embodiment.

First, as shown in FIG. 21A, a base film 301 is formed to a thickness of 300 nm on a glass substrate 300. Silicon oxide nitride films are laminated as the base film 301 in this embodiment. At this point, it is appropriate to set the nitrogen concentration to between 10 and 25 wt % in the film contacting the glass substrate 300. In addition, it is effective that the base film 301 has a thermal radiation effect, and a DLC (diamond-like carbon) film may also be provided.

Next, an amorphous silicon film (not shown in the figures) is formed with a thickness of 50 nm on the base film 301 by a known deposition method. Note that it is not necessary to limit this to the amorphous silicon film, and another film may be formed provided that it is a semiconductor film containing an amorphous structure (including a microcrystalline semiconductor film). In addition, a compound semiconductor film containing an amorphous structure, such as an amorphous silicon germanium film, may also be used. Further, the film thickness may be made from 20 to 100 nm.

The amorphous silicon film is then crystallized by a known technique, forming a crystalline silicon film (also referred to as a polycrystalline silicon film or a polysilicon film) 302. Thermal crystallization using an electric furnace, laser annealing crystallization using a laser light, and lamp annealing crystallization using an infrared lamp exist as known crystallization methods. Crystallization is performed in this embodiment using an excimer laser light, which uses XeCl gas.

Note that pulse emission excimer laser light formed into a linear shape is used in this embodiment, but a rectangular shape may also be used, and continuous emission argon laser light and continuous emission excimer laser light can also be used.

In this embodiment, although the crystalline silicon film is used as the active layer of the TFT, it is also possible to use an amorphous silicon film.

Note that it is effective to form the active layer of the switching TFT, in which there is a necessity to reduce the OFF current, by the amorphous silicon film, and to form the active layer of the EL driver TFT by the crystalline silicon film. Electric current flows with difficulty in the amorphous silicon film because the carrier mobility is low, and the OFF current does not easily flow. In other words, the most can be made of the advantages of both the amorphous silicon film, through which current does not flow easily, and the crystalline silicon film, through which current easily flows.

Next, as shown in FIG. 21B, a protective film 303 is formed on the crystalline silicon film 302 with a silicon oxide film having a thickness of 130 nm. This thickness may be chosen within the range of 100 to 200 nm (preferably between 130 and 170 nm). Furthermore, other films may also be used providing that they are insulating films containing silicon. The protective film 303 is formed so that the crystalline silicon film is not directly exposed to plasma during addition of an impurity, and so that it is possible to have delicate concentration control of the impurity.

Resist masks 304a and 304b are then formed on the protective film 303, and an impurity element, which imparts n-type conductivity (hereafter referred to as an n-type impurity element), is added. Note that elements residing in periodic table group 15 are generally used as the n-type impurity element, and typically phosphorous or arsenic can be used. Note that a plasma doping method is used, in which phosphine ($PH_3$) is plasma activated without separation of mass, and phosphorous is added at a concentration of $1 \times 10^{18}$ atoms/$cm^3$ in this embodiment. An ion implantation method, in which separation of mass is performed, may also be used, of course.

The dose amount is regulated so that the n-type impurity element is contained in n-type impurity region 305, thus formed by this process, at a concentration of $2 \times 10^{16}$ to $5 \times 10^{19}$ atoms/$cm^3$ (typically between $5 \times 10^{17}$ and $5 \times 10^{18}$ atoms/$cm^3$).

Next, as shown in FIG. 21C, the protective film 303 is removed, and an activation of the added n-type impurity elements is performed. A known technique of activation may be used as the means of activation, but activation is done in this embodiment by irradiation of excimer laser light. Of course, a pulse emission excimer laser and a continuous emission excimer laser may both, be used, and it is not necessary to place any limits on the use of excimer laser light. The goal is the activation of the added impurity element, and it is preferable that irradiation is performed at an energy level at which the crystalline silicon film does not melt. Note that the laser irradiation may also be performed with the protective film 303 in place.

The activation by heat treatment (furnace annealing) may also be performed along with activation of the impurity element by laser light. When activation is performed by heat treatment, considering the heat resistance of the substrate, it is good to perform heat treatment on the order of 450 to 550° C.

A boundary portion (connecting portion) with end portions of the n-type impurity region 305, namely regions, in which the n-type impurity element is not added, on the periphery of the n-type impurity region 305, is delineated by this process. This means that, at the point when the TFTs are later completed, extremely good connecting portion can be formed between LDD regions and channel forming regions.

Unnecessary portions of the crystalline silicon film are removed next, as shown in FIG. 21D, and island shape semiconductor films (hereafter referred to as active layers) 307 to 310 are formed.

Then, as shown in FIG. 21E, a gate insulating film 311 is formed, covering the active layers 307 to 310. An insulating film containing silicon and with a thickness of 10 to 200 nm, preferably between 50 and 150 nm, may be used as the gate insulating film 311. A single layer structure or a lamination structure may be used. A 110 nm thick silicon oxide nitride film is used in this embodiment.

Thereafter, a conductive film having a thickness of 200 to 400 nm is formed and patterned to form gate electrodes 312 to 316. In the present embodiment, the gate electrodes and wirings (hereinafter referred to as the gate wirings) electrically connected to the gate electrodes for providing conductive paths are formed of different materials from each other. More specifically, the gate wirings are made of a material having a lower resistivity than the gate electrodes. Thus, a material enabling fine processing is used for the gate electrodes, while the gate wirings are formed of a material that can provide a smaller wiring resistance but is not suitable for fine processing. It is of course possible to form the gate electrodes and the gate wirings with the same material.

Although the gate electrode can be made of a single-layered conductive film, it is preferable to form a lamination film with two, three or more layers for the gate electrode if necessary. Any known conductive materials can be used for the gate electrode. It should be noted, however, that it is preferable to use such a material that enables fine processing, and more specifically, a material that can be patterned with a line width of 2 $\mu$m or less.

Typically, it is possible to use a film made of an element selected from tantalum (Ta), titanium (Ti), molybdenum (Mo), tungsten (W), chromium (Cr), and silicon (Si), a film of nitride of the above element (typically a tantalum nitride film, tungsten nitride film, or titanium nitride film), an alloy film of combination of the above elements (typically Mo—W alloy or Mo—Ta alloy), or a silicide film of the above element (typically a tungsten silicide film or titanium silicide film). Of course, the films may be used as a single layer or a laminate layer.

In this embodiment, a laminate film of a tungsten nitride (WN) film having a thickness of 30 nm and a tungsten (W) film having a thickness of 370 nm is used. This may be formed by sputtering. When an inert gas of Xe, Ne or the like is added as a sputtering gas, film peeling due to stress can be prevented.

The gate electrode 313 is formed at this time so as to overlap a portion of the n-type impurity region 305, respectively, sandwiching the gate insulating film 311. This overlapping portion later becomes an LDD region overlapping the gate electrode.

Figure 22A:
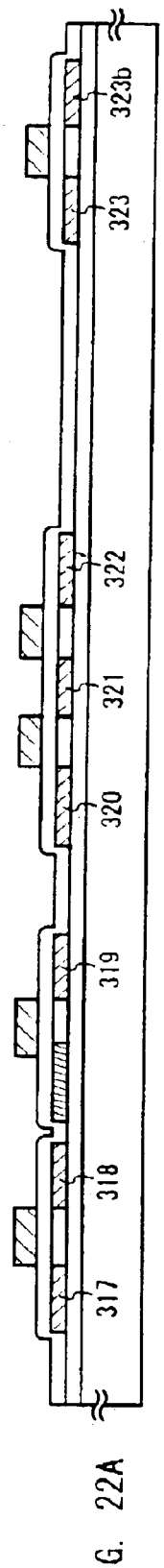
FIGS. 22A to 22D are diagrams showing a manufacturing process of the EL display of the present invention.

Next, an n-type impurity element (phosphorous is used in this embodiment) is added in a self-aligning manner with the gate electrodes 312 to 316 as masks, as shown in FIG. 22A. The addition is regulated so that phosphorous is added to impurity regions 317 to 323, 323b thus formed at a concentration of 1/10 to 1/2 that of the impurity region 305 (typically between 1/4 and 1/3). Specifically, a concentration of $1 \times 10^{16}$ to $5 \times 10^{18}$ atoms/$cm^3$ (typically $3 \times 10^{17}$ to $3 \times 10^{18}$ atoms/$cm^3$) is preferable.

Figure 22B:
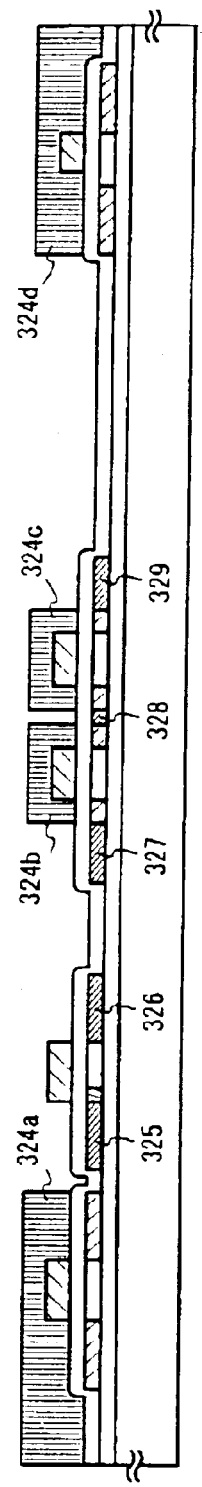

Resist masks 324a to 324d are formed next, with a shape covering the gate electrodes etc., as shown in FIG. 22B, and an n-type impurity element (phosphorous is used in this embodiment) is added, forming impurity regions 325 to 329 containing phosphorous at high concentration. Ion doping using phosphine ($PH_3$) is also performed here, and is regulated so that the phosphorous concentration of these regions is from $1 \times 10^{20}$ to $1 \times 10^{21}$ atoms/$cm^3$ (typically between $2 \times 10^{20}$ and $5 \times 10^{20}$ atoms/$cm^3$).

A source region or a drain region of the n-channel TFT is formed by this process, and in the switching TFT, a portion of the n-type impurity regions 320 to 322 formed by the process of FIG. 22A is remained. These remaining regions correspond to the LDD regions of the switching TFT.

Figure 22C:
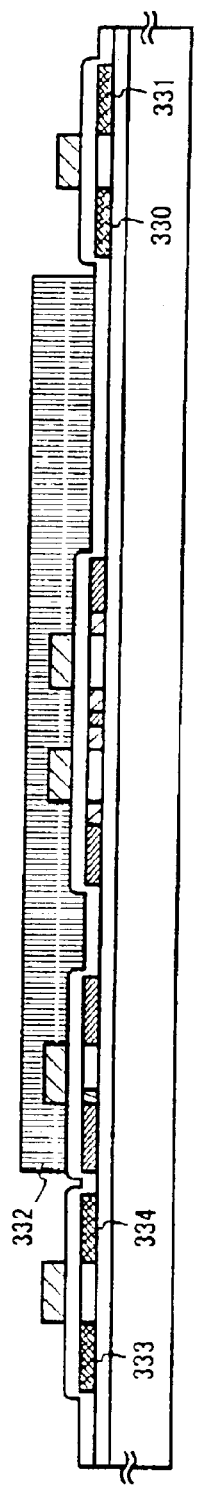
Figure 22D:
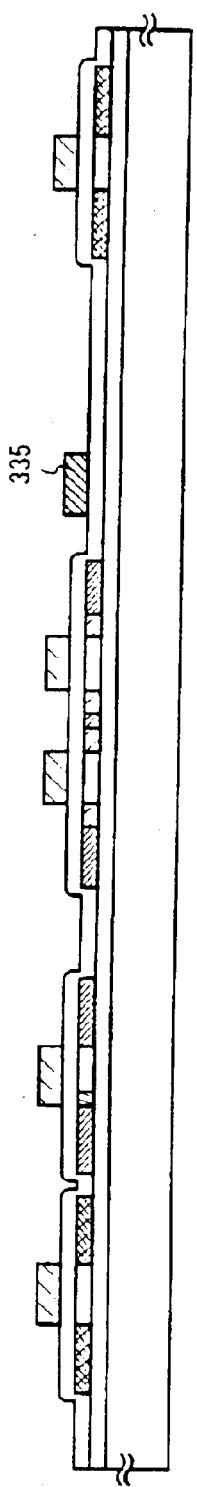

Next, as shown in FIG. 22C, the resist masks 324a to 324d are removed, and a new resist mask 332 is formed. A p-type impurity element (boron is used in this embodiment) is then added, forming impurity regions 330, 331, 333 and 334 containing boron at high concentration. Boron is added here to form impurity regions 330, 331, 333 and 334 at a concentration of $3 \times 10^{20}$ to $3 \times 10^{21}$ atoms/$cm^3$ (typically between $5 \times 10^{20}$ and $1 \times 10^{21}$ atoms/$cm^3$) by ion doping using diborane ($B_2H_6$).

Note that phosphorous has already been added to the impurity regions 330, 331, 333 and 334 at a concentration of $1 \times 10^{16}$ to $1 \times 10^{18}$ atoms/$cm^3$, but boron is added here at a concentration of at least 3 times that of the phosphorous. Therefore, the n-type impurity regions already formed completely invert to p-type, and function as p-type impurity regions.

Next, after removing the resist mask 332, the n-type or p-type impurity elements added to the active layer at respective concentrations are activated. Furnace annealing, laser annealing or lamp annealing can be used as a means of activation. In this embodiment, heat treatment is performed for 4 hours at 550° C. in a nitrogen atmosphere in an electric furnace.

At this time, it is critical to eliminate oxygen from the surrounding atmosphere as much as possible. This is because when even only a small amount of oxygen exists, an exposed surface of the gate electrode is oxidized, which results in an increased resistance and later makes it difficult to form an ohmic contact with the gate electrode. Accordingly, the oxygen concentration in the surrounding atmosphere for the activation process is set at 1 ppm or less, preferably at 0.1 ppm or less.

After the activation process is completed, the gate wiring 335 having a thickness of 300 nm is formed. As a material for the gate wiring 335, a metal film containing aluminum (Al) or copper (Cu) as its main component can be used. The gate wiring 335 is arranged so as to provide electrical connection for the gate electrodes 314 and 31 of the switching TFT (see FIG. 22D).

The above-described structure can allow the wiring resistance of the sate wiring to be significantly reduced, and therefore, an image display region (pixel portion) with a large area can be formed. More specifically, the pixel structure in accordance with the present embodiment is advantageous for realizing an EL display device having a display screen with a diagonal size of 10 inches or larger (or 30 inches or larger.)

A first interlayer insulating film 336 is formed next, as shown in FIG. 23A. A single layer insulating film containing silicon is used as the first interlayer insulating film 336, while a lamination film may be used. Further, a film thickness of between 400 nm and 1.5 μm may be used. A lamination structure of an 800 nm thick silicon oxide film on a 200 nm thick silicon oxide nitride film is used in this embodiment.

In addition, heat treatment is performed for 1 to 12 hours at 300 to 450° C. in an atmosphere containing between 3 and 100% hydrogen, performing hydrogenation. This process is one of hydrogen termination of dangling bonds in the semiconductor film by hydrogen, which is thermally activated. Plasma hydrogenation (using hydrogen activated by a plasma) may also be performed as another means of hydrogenation.

Note that the hydrogenation processing may also be inserted during the formation of the first interlayer insulating film 336. Namely, hydrogen processing may be performed as above after forming the 200 nm thick silicon oxide nitride film, and then the remaining 800 nm thick silicon oxide film may be formed.

Next, a contact hole is formed in the first interlayer insulating film 336, and source wirings 337 to 340 and drain wirings 341 to 343 are formed. In this embodiment, this electrode is made of a laminate film of three-layer structure in which a titanium film having a thickness of 100 nm, an aluminum film containing titanium and having a thickness of 300 nm, and a titanium film having a thickness of 150 nm are continuously formed by a sputtering method. Of course, other conductive films may be used.

A first passivation film 344 is formed next with a thickness of 50 to 500 nm (typically between 200 and 300 nm). A 300 nm thick silicon oxide nitride film is used as the first passivation film 344 in this embodiment. This may also be substituted by a silicon nitride film. Note that it is effective to perform plasma processing using a gas containing hydrogen such as $H_2$ or $NH_3$ before the formation of the silicon oxide nitride film. Hydrogen activated by this preprocess is supplied to the first interlayer insulating film 336, and the film quality of the first passivation film 344 is improved by performing heat treatment. At the same time, the hydrogen added to the first interlayer insulating film 336 diffuses to the lower side, and the active layers can be hydrogenated effectively.

Next, as shown in FIG. 23B, a second interlayer insulating film 345 made of organic resin is formed. As the organic resin, it is possible to use polyimide, polyamide, acryl, BCB (benzocyclobutene) or the like. Especially, since the second interlayer insulating film 345 is primarily used for leveling, acryl excellent in leveling properties is preferable. In this embodiment, an acrylic film is formed to a thickness sufficient to level a stepped portion formed by TFTs. It is appropriate that the thickness is made 1 to 5 μm (more preferably, 2 to 4 μm).

Thereafter, a contact hole is formed in the second interlayer insulating film 345 and the first passivation film 344 to reach the drain wiring 343, and then the pixel electrode 346 is formed. In the present embodiment, an transparent conductive film having a thickness of 120 nm which is formed by indium oxide added 10 to 20 wt % zinc oxide is formed as the pixel electrode 346.

Next, as shown in FIG. 23C, a bank 347 made of resin material is formed. The bank 347 may be formed by patterning a 1 to 2 μm thick acrylic film or polyimide film. The bank 347 is formed as a stripe shape between pixels. In this embodiment, the bank 347 is formed along with the top of the source wiring 339, though can be formed also along with the top of the gate wiring 336. The bank 347 can be used as a shielding film by containing a carbon and the like to resin material which form the bank 347.

Next, the EL layer 348 and the cathode (MgAg electrode) 349 are formed in succession by vapor deposition method without exposure to the atmosphere. The thickness of the EL layer 348 is 80 to 200 nm (typically 100 to 120 nm), the cathode thereof is 180 to 300 nm (typically 200 to 250 nm). In this embodiment, only one pixel electrode is shown in figures, at this time EL layer emitting light of red color, EL layer emitting light of green color and EL layer emitting light of blue color are formed simultaneously.

In this process, an EL layer 348 and cathode 349 are sequentially formed for a pixel corresponding to red, a pixel corresponding to green, and a pixel corresponding to blue. However, since the EL layer 348 is poor in tolerance to solutions, they must be independently formed for each color without using the photolithography technique. Thus, it is preferable to mask pixels except a desired one by the use of the metal mask, and selectively form an EL layer 348 and cathode 349 for the desired pixel.

That is, a mask is set to conceal all areas except the pixel for the red color and, by using this mask, the EL layer and the cathode are selectively formed for emitting light of red color. Next, a mask is set to conceal all areas except the pixel for the green color and, by using this mask, the EL layer and the cathode are selectively formed for emitting light of green color. Next, similarly, a mask is set to conceal all areas except the pixel for the blue color and, by using this mask, the EL layer and the cathode are selectively formed for emitting light of blue color. Though different masks were used above, it is also allowable to use the same mask repetitively. It is desired to conduct the treatment without breaking the vacuum condition until the EL layer and the cathode are formed on all pixels.

The EL layer may have 4 layers other light emitting layer, a positive hole injection layer, a positive hole transport layer, a light-emitting layer and an electron injection layer. Thus various examples of combination are reported already, and it is possible to use any of them. A known material can be used as the EL layer 348. A desired example of the known material is an organic material by taking a drive voltage into consideration. In this embodiment, further, the MgAg electrode was used as the cathode of the EL element. However, any other known material may be used.

An active matrix substrate having a structure as shown in FIG. 23C is thus completed. Note that after the formation of the bank 347, it is effective to use the multi-chamber method (or the in-line method) of the thin film deposition apparatus for the process of forming the films until the formation of the passivation film 351, in succession and without exposure to the atmosphere.

In the active matrix substrate of the present embodiment, TFTs having optimal structures are arranged not only in the pixel portion but also in the driver circuit portion, thereby indicating an extremely high reliability and increasing its operation performance. In the crystallization steps, it is possible to dope the metal catalyst such as Ni and the like to increase the crystallinity. According to this, the driving frequency of the source signal driver circuit can be set not less than 10 MHz.

First, a TFT having a structure to decrease hot carrier injection so as not to drop the operation speed thereof as much as possible is used as an n-channel TFT 205 of a CMOS circuit forming a driver circuit portion. Note that the driver circuit here includes a shift register, a buffer, a level shifter, latches in line sequential driving and transmission gate in dot sequential driving.

In the case of Embodiment 1, as shown in FIG. 23C, an active layer of the n-channel TFT 205 is composed of a source region 355, a drain region 356, an LDD region 357, and a channel forming region 358. The LDD region 357 overlaps the gate electrode 313 via the gate insulating film 311.

Consideration not to drop the operation speed is the reason why the LDD region is formed at only the drain region side. In this n-channel TFT 205, it is not necessary to pay attention to an OFF current value very much, rather, it is better to give importance to an operation speed. Thus, it is desirable that the LDD region 357 is made to completely overlap the gate electrode to decrease a resistance component to a minimum. That is, it is preferable to remove the so-called offset.

Furthermore, deterioration of the p-channel TFT 206 in the CMOS circuit due to the injection of hot carriers is almost negligible, and thus, it is not necessary to provide any LDD region for the p-channel TFT 206. It is of course possible to provide the LDD region similarly for the n-channel TFT 205, to exhibit countermeasure against the hot carriers.

Note that, among the driver circuits, the CMOS circuit is used, in which a large electric current flows in both directions in the channel forming region. Namely, the roles of the source region and the drain region are interchanged. In the case where the n-channel TFT is used for the CMOS circuit, the LDD regions are disposed to interpose the channel forming region between both side of the channel forming region. As an example, the transmission gate which is used for the dot sequential driving can be given. In addition, among the driver circuit, when the CMOS circuit is used which is necessary to control the value of the OFF current to be as small as possible, it is preferable to use an n-channel TFT having the structure that portion of the LDD region overlap the gate electrode through the gate insulating film. The effect thereof is already referred to an explanation of the EL driver TFT 202. As an example, the transmission gate which is used for the dot sequential driving can be also given.

Note that, in practice, it is preferable to additionally perform packaging (sealing) after completing up through FIG. 23C by using a highly airtight protective film which has very little gas leakage (such as a laminate film or an ultraviolet cured resin film or a sealing material that is transmissive, so that there is no exposure to the atmosphere. By making the inside of the sealing material an inert environment, and by placing a driving agent (for example, barium oxide) within the sealing material, the reliability of the EL element is increased.

Furthermore, after the airtightness is increased by the packing processing etc. a connector (a flexible printed circuit, FPC) for connecting output terminals from elements or circuits formed on the substrate and external signal terminals, is attached, completing a manufactured product. The completed manufactured product in this state of being able to be shipped is referred to as an EL display device (or an EL module) throughout this specification.

[Embodiment 14]

Figure 24:
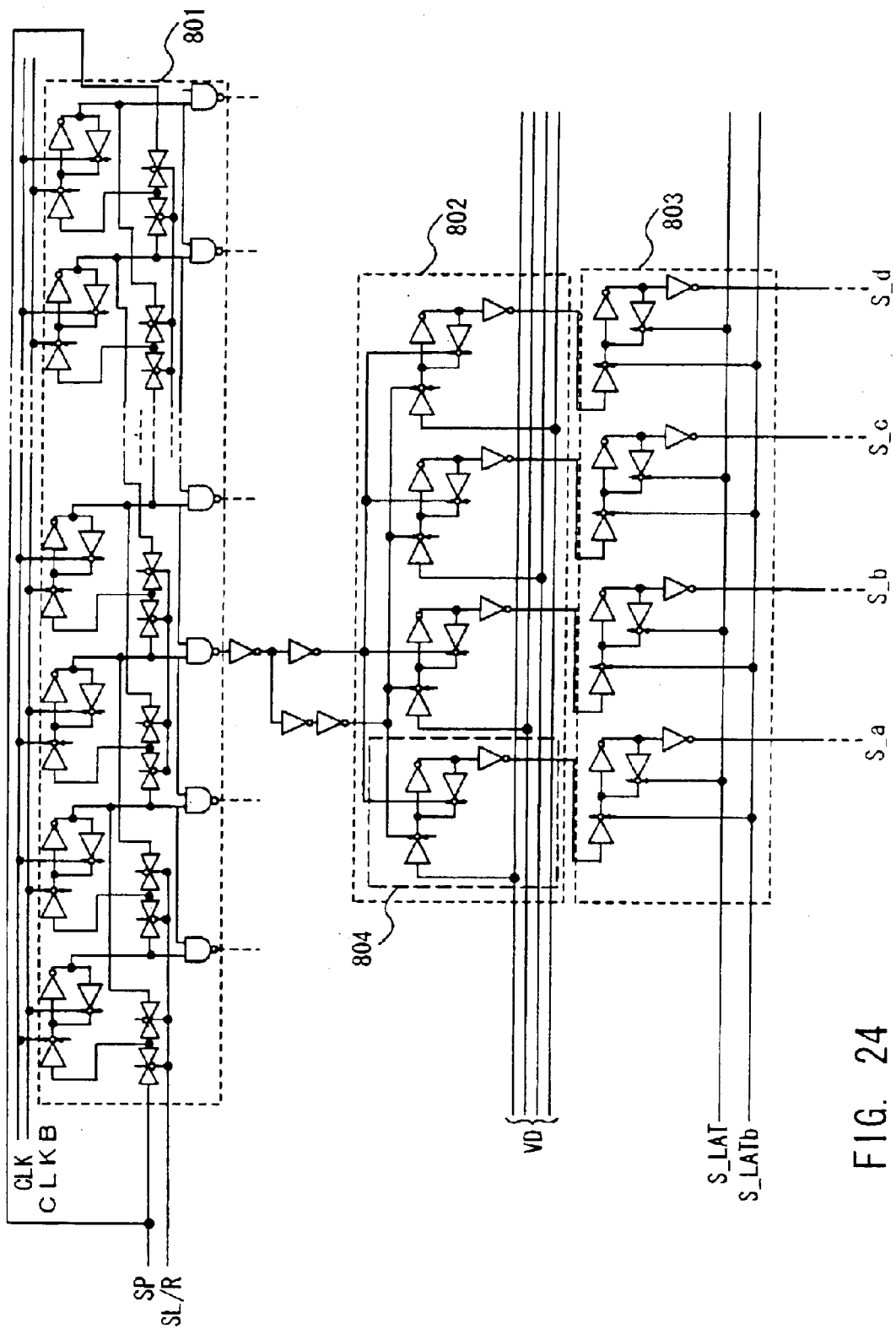
FIG. 24 is a diagram showing a circuit configuration of a source signal line driver circuit used in the present invention.

A detailed structure of the source signal side driver circuit 102 or the source side driver circuit 104 shown by FIG. 1 is explained in this embodiment. A circuit diagram of an example of a source signal side driver circuit used in the present invention is shown in FIG. 24.

Shift registers 801, latches (A) 802, and latches (B) 803 are arranged as shown in figure. Note that one group of the latches (A) 802 and the latches (B) 803 corresponds to four source signal lines S_a to S_d in this embodiment. Further, a level shifter for changing the width of the amplitude of the signal voltage is not formed in this embodiment, but it may also be suitably formed by a designer.

A clock signal CLK, a clock signal CLKB in which the polarity of CLK is inverted, a start pulse SP, and a driver direction changeover signal SL/R are each input to the shift registers 801 by wirings shown in figure. Further, a digital data signal VD input from the outside is input to the latches (A) 802 by wirings shown in figure. A latch signal S_LAT and a signal S_LATb, in which the polarity of S_LAT is inverted are input to the latches (B) 803 by wirings shown in figure.

Regarding a detailed structure of the latches (A) 802, an example of 804 the portion of the latches (A) 802 corresponding to the source signal line S_a is explained. The 804, the portion of the latches (A) 802 has two clocked inverters and two inverters.

Figure 25:
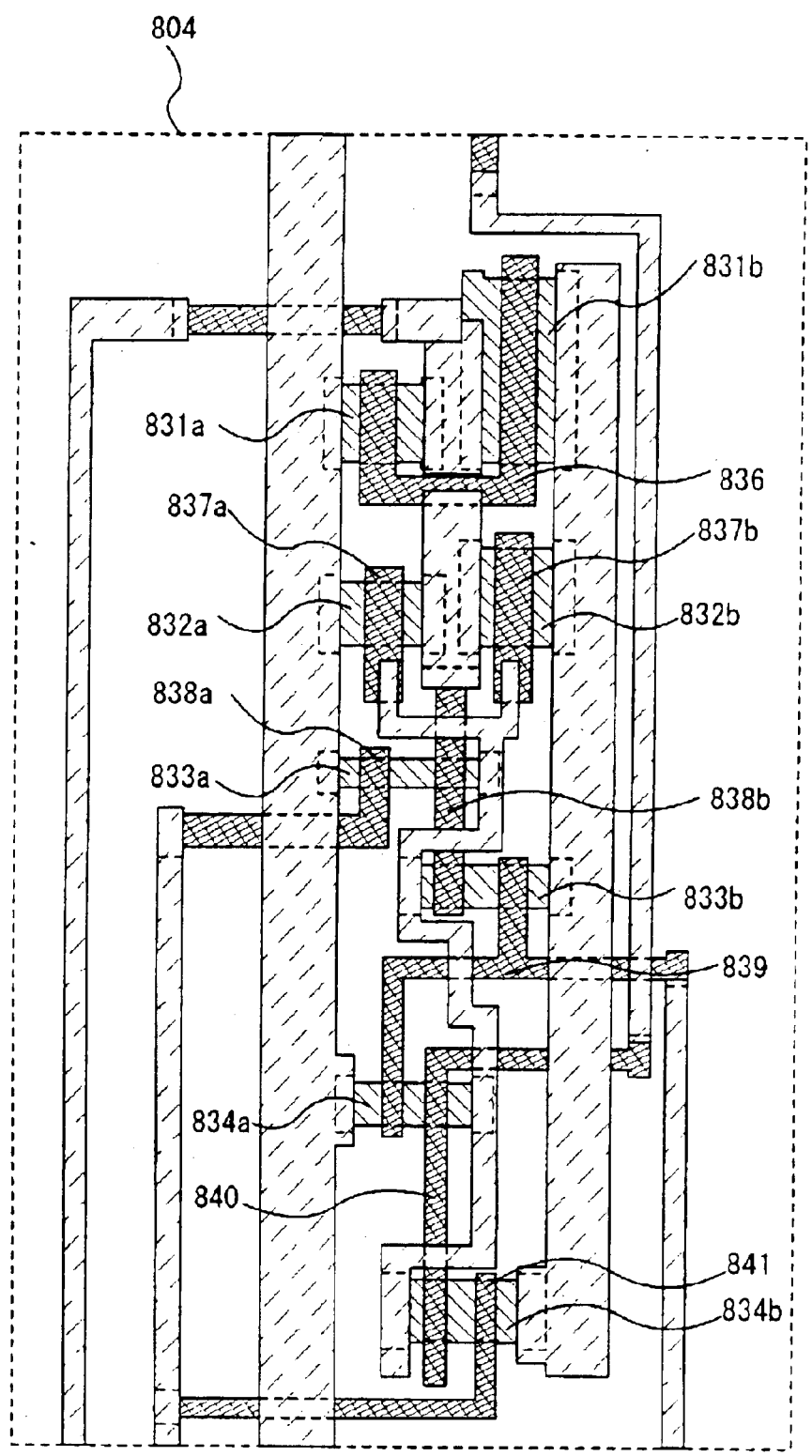
FIG. 25 is a top view of a latch circuit used in the present invention.

A top view of the portion 804 of the latches (A) 802 is shown in FIG. 25. Reference numerals 831a and 831b each denotes an active layer of a TFT forming one inverter of 804, the portion of the latches (A) 802, and reference numeral 836 denotes a common gate electrode of the TFT forming one inverter. Further, reference numerals 832a and 832b each denotes an active layer of another TFT forming one inverter of 804, the portion the latches (A) 802, and references numerals 837a and 837b denote gate electrodes formed on the active layers 832a and 832b, respectively. Note that the gate electrodes 837a and 837b are electrically connected.

Reference numerals 833a and 833b each denotes an active layer of a TFT forming one clocked inverter of 804, the portion of the latches (A)802. Gate electrodes 838a and 838b are formed on the active layer 833a, becoming a double gate structure. Further, gate electrodes 838b and 839 are formed on the active layer 833b, becoming a double gate structure.

Reference numerals 834a and 834b each denotes an active layer of a TFT forming another clocked inverter of 804, the portion of the latches (A) 802. Gate electrodes 839 and 840 are formed on the active layer 834*a*, becoming a double gate structure. Further, gate electrodes 840 and 841 are formed on the active layer 834*b*, becoming a double gate structure.

[Embodiment 15]

The material used in the EL layer of the EL element in the EL display of the present invention is not limited to an organic EL material, and the present invention can be implemented using an inorganic EL material. However, at present inorganic EL materials have an extremely high driver voltage, and therefore TFTs which have voltage resistance characteristics such that they are able to withstand such a high voltage must be used.

Alternately, if an inorganic EL material having a lower driver voltage is developed in the future, it is possible to apply such a material to the present invention.

Furthermore, it is possible to freely combine the constitution of this embodiment with the constitution of any of Embodiments 1 to 14.

[Embodiment 16]

In the present invention, an organic material used as an EL layer may be either a low molecular organic material or a polymer (high molecular) organic material. As the low molecular organic material, materials are known centering on $Alq_3$ (tris-8-quinolylite-aluminum), TPD (triphenylamine derivative) or the like. As polymer organic material, π-cooperative polymer materials can be given. Typically PPV (polyphenylenevynilene), PVK (polyvynilcarbazole), polycarbonate or the like can be given.

The polymer (high molecular) organic material can be formed with a simple thin film formation method such as the spin coating method (which is referred to also as solution application method), the dipping method, the dispense method, the printing method, the ink jet method or the like. The polymer organic material has a high heat endurance compared with the low molecular organic material.

Furthermore, in the case where the EL layer incorporated in the EL element incorporated in the EL display according to the present invention has an electron transport layer and a positive hole transport layer, the electron transport layer and the positive hole transport layer may be formed of inorganic material such as, for example, a non-crystal semiconductor formed of non-crystal Si or non-crystal $Si_{1-x}C_x$ or the like.

In the non-crystal semiconductor, a large quantity of trap level is present, and at the same time, the non-crystal semiconductor forms a large quantity of interface levels at an interface at which the non-crystal semiconductor contacts other layers. As a consequence, the EL element can emit light at a low voltage, and at the same time, an attempt can be made to provide a high luminance.

Besides, a dopant (impurity) is added to the organic EL layer, and the color of light emission of the organic EL layer may be changed. These dopant includes DCM1, nile red, lubren, coumarin 6, TPB and quinaquelidon.

[Embodiment 17]

The EL display device fabricated in accordance with the present invention is of the self-emission type, and thus exhibits more excellent Precognizability of the displayed image in a light place as compared to the liquid crystal display device. Furthermore, the EL display device has a wider viewing angle. Accordingly, the EL display device can be applied to a display portion in various electronic devices. For example, in order to view a TV program or the like on a large-sized screen, the EL display device in accordance with the present invention can be used as a display portion of an EL display (i.e. a display in which an EL display device is installed into a frame) having a diagonal size of 30 inches or larger (typically 40 inches or larger.)

The EL display includes all kinds of displays to be used for displaying information, such as a display for a personal computer, a display for receiving a TV broadcasting program, a display for advertisement display. Moreover, the EL display device in accordance with the present invention can be used as a display portion of other various electric devices.

Such electronic devices include a video camera, a digital camera, a goggles-type display (head mount display), a car navigation system, a sound reproduction device (a car audio, an audio equipment), note-size personal computer, a game machine, a portable information terminal (a mobile computer, a mobile telephone, a mobile game machine, an electronic book, or the like), an image reproduction apparatus including a recording medium (more specifically, an apparatus which can reproduce a recording medium such as a digital video disc (DVD), and includes a display for displaying the reproduced image), or the like. In particular, in the case of the portable information terminal, use of the EL display device is preferable, since the portable information terminal that is likely to be viewed from a tilted direction is often required to have a wide viewing angle. FIGS. 26 to 27 respectively show various specific examples of such electronic devices.

Figure 26A:
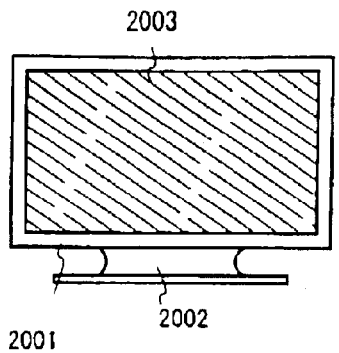
FIGS. 26A to 26F are electronic equipments incorporating the EL display of the present invention.

FIG. 26A illustrates an EL display which includes a frame 2001, a support table 2002, a display portion 2003, or the like. The present invention is applicable to the display portion 2003. The EL display is of the self-emission type and therefore requires no back light. Thus, the display portion thereof can have a thickness thinner than that of the liquid crystal display device.

Figure 26B:
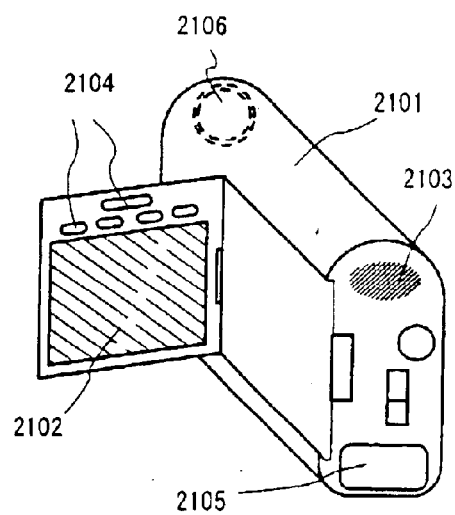

FIG. 26B illustrates a video camera which includes a main body 2101, a display portion 2102, an audio input portion 2103, operation switches 2104, a battery 1105, an image receiving portion 2106, or the like. The EL display device in accordance with the present invention can be used as the display portion 2102.

Figure 26C:
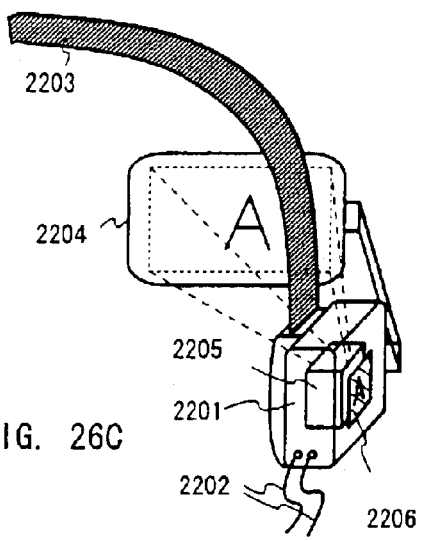

FIG. 26C illustrates a portion (the right-half piece) of an EL display of head mount type, which includes a main body 2201, signal cables 2202, a head mount band 2203, a display portion 2204, an optical system 2205, an EL display device 2206, or the like. The present invention is applicable to the EL display device 2206.

Figure 26D:
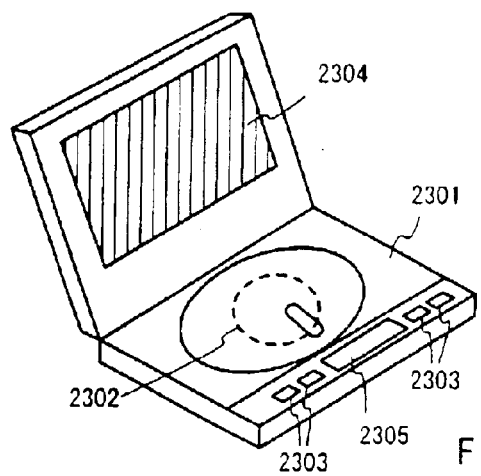

FIG. 26D illustrates an image reproduction apparatus including a recording medium (more specifically, a DVD reproduction apparatus), which includes a main body 301, a recording medium (a DVD or the like) 2302, operation switches 2303, a display portion (a) 2304, another display portion (b) 2305, or the like. The display portion (a) 2304 is used mainly for displaying image information, while the display portion (b) 2304 is used mainly for displaying character information. The EL display device in accordance with the present invention can be used as these display portions (a) 2304 and (b) 2305. The image reproduction-apparatus including a recording medium further includes a game machine or the like.

Figure 26E:
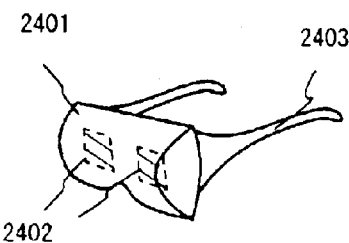

FIG. 26E illustrates a goggles-type display (head mount display) which includes a main body 2401, a display portion 2402, an arm portion 2403. The EL display device in accordance with the present invention can be used as the display portion 2402.

Figure 26F:
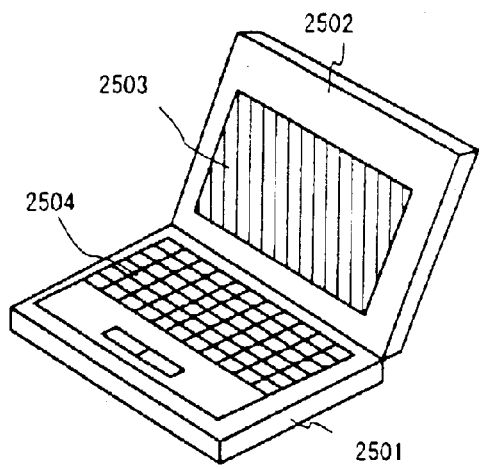

FIG. 26F illustrates a personal computer which includes a main body 2501, a frame 2502, a display portion 2503, a key board 2504, or the like. The EL display device in accordance with the present invention can be used as the display portion 2503.

When the brighter luminance of light emitted from the EL material becomes available in the future, the EL display device in accordance with the present invention will be applicable to a front-type or rear-type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. The EL display device is suitable for displaying moving pictures since the EL material can exhibit high response speed.

A portion of the EL display device that is emitting light consumes power, so it is desirable to display information in such a manner that the light emitting portion therein becomes as small as possible. Accordingly, when the EL display device is applied to a display portion which mainly displays character information, e.g., a display portion of a portable information terminal, and more particular, a mobile telephone or a sound reproduction device, it is desirable to drive the EL display device so that the character information is formed by a light-emitting portion while a non-emission portion corresponds to the background.

Figure 27A:
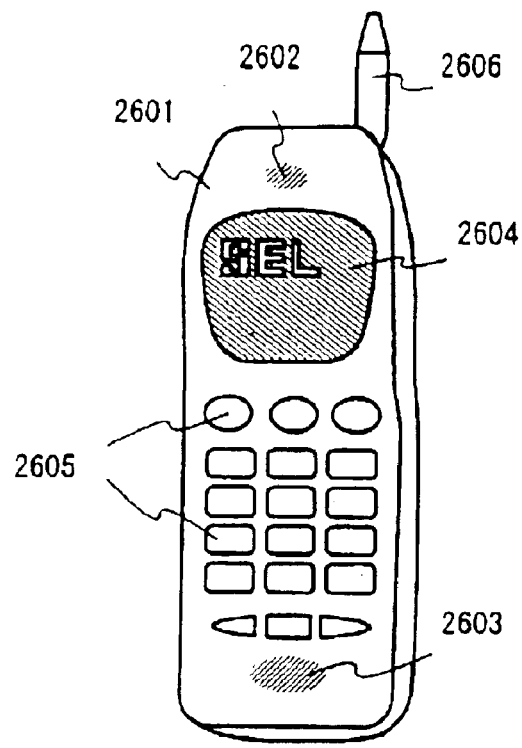
FIGS. 27A and 27B are electronic equipments incorporating the EL display of the present invention.

With now reference to FIG. 27A, a portable telephone is illustrated, which includes a main body 2601, an audio output portion 2602, an audio input portion 2603, a display portion 2604, operation switches 2605, and an antenna 2606. The EL display device in accordance with the present invention can be used as the display portion 2604. The display portion 2604 can reduce power consumption of the portable telephone by displaying white-colored characters on a black-colored background.

Figure 27B:
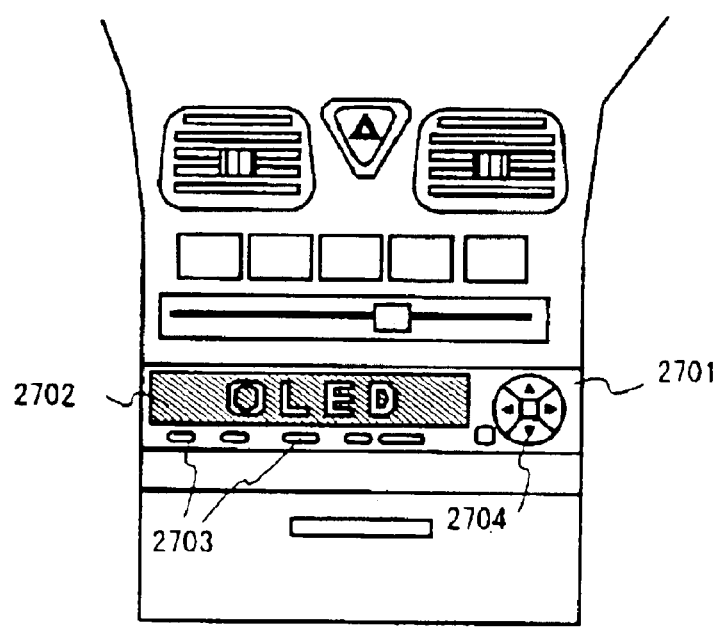

FIG. 27B illustrates a sound reproduction device, a car audio equipment in concrete term, which includes a main body 2701, a display portion 2702, and operation switches 2703 and 2704. The EL display device in accordance with the present invention can be used as the display portion 2702. Although the car audio equipment of the mount type is shown in the present embodiment, the present invention is also applicable to an audio of the portable type or the set type. The display portion 2702 can reduce power consumption by displaying white-colored characters on a black-colored background, which is particularly advantageous for the audio of the portable type.

As set forth above, the present invention can be applied variously to a wide range of electronic devices in all fields. The electronic device in the present embodiment can be obtained by utilizing an EL display device having the configuration in which the structures in Embodiments 1 through 15 are freely combined.

By adopting the above structure, the present invention is capable of suppressing the variations in the amount of current flow outputted when equivalent gate voltages are applied even if there is a slight variation in the characteristic caused of TFTs. As a result, the situation in which the occurrence of a vast difference between the luminous amount of the EL element with that of an adjacent pixel caused by the variation of the characteristic of TFTs even if signals having equivalent voltages are fed may be avoided.

According to the present invention, a pair of gate signal line driver circuits and a pair of source signal line driver circuits are employed to enable overlapping of adjacent writing-in periods and hence to a display period shorter than the corresponding writing-in period. Thus, the present invention makes it possible to set a markedly short display period to realize a large number of gray-scale levels.

In addition, the non-luminescing periods for not performing displays can be provided in the present invention. In the case of the conventional analog drive, if the EL display is made to display all white images, then the EL element is constantly luminescing, becoming a factor in advancing the deterioration of the EL layer. The non-luminescing periods can be provided in the present invention, and therefore a level of deterioration of the EL layer can be suppressed.

What is claimed is:

1. An electronic device comprising:
 a pixel portion including a plurality of pixels formed over a substrate, each of said pixels comprising:
  an EL element;
  a pair of EL driver TFTs;
  a pair of switching TFTs; and
  a pair of eliminating TFTs,
 wherein luminescence of the EL element is controlled by said pair of EL driver TFTs;
 wherein one of said pair of EL driver TFTs is controlled by one of said pair of switching TFTs and one of said pair of eliminating TFTs;
 wherein the other of said pair of EL driver TFTs is controlled by the other of said pair of switching TFTs and the other of said eliminating TFTs.

2. A device according to claim 1, wherein further comprising a pair of gate signal line driver circuits comprising TFTs formed over said substrate,
 wherein the driving frequency of said pair of source signal line driver circuits is 10 MHZ or more.

3. A device according to claim 1, wherein said EL element has a pixel electrode, an opposing electrode, and an EL layer interposed between said pixel electrode and said opposing electrode.

4. A device according to claim 1, wherein said device is an EL display device.

5. A device according to claim 1, wherein said device is a video camera.

6. A device according to claim 1, wherein said device is a head-mount type EL display device.

7. A device according to claim 1, wherein said device is a DVD player.

8. A device according to claim 1, wherein said device is a head-mount display.

9. A device according to claim 1, wherein said device is a personal computer.

10. A device according to claim 1, wherein said device is a portable telephone.

11. A device according to claim 1, wherein said device is a car audio.

12. An electronic device comprising:
 first and second source signal line driver circuits;
 at least one gate signal line driver circuit;
 a pixel portion including a plurality of pixels over a substrate;
 a plurality of first source signal lines connected to said first source signal line driver circuit;
 a plurality of second source signal lines connected to said second source signal line driver circuit;
 a plurality of gate signal lines connected to said gate signal line driver circuit; and
 a power supply line,
 wherein said plurality of pixels each have a first switching TFT, a second switching TFT, a first eliminating TFT, a second eliminating TFT, a first EL driver TFT, a second driver TFT, and an EL element;
 wherein one of a source region and a drain region of said first switching TFT is connected to said first source signal line, and the other thereof is connected to a gate electrode of said first EL driver TFT, wherein one of a source region and a drain region of said second switching TFT is connected to said second source signal line, and the other thereof is connected to a gate electrode of said second EL driver TFT, wherein one of a source region and a drain region of said first eliminating TFT is connected to said power supply line, and the other thereof is connected to said gate electrode of said second EL driver TFT, wherein one of a source region and a drain region of said second eliminating TFT is connected to said power supply line, and the other thereof is connected to said gate electrode of said first EL driver TFT, wherein one of a source region and a drain region of said first EL driver TFT is connected to said power supply line, and the other thereof is connected to said EL element, respectively, and wherein one of a source region and a drain region of said second EL driver TFT is connected to said power supply line, and the other thereof is connected to said EL element, respectively.

13. A device according to claim 12, wherein said first switching TFT and said first eliminating TFT are simultaneously turned ON or OFF, and said second switching TFT and said second eliminating TFT are simultaneously turned ON or OFF.

14. A device according to claim 12, wherein each of said first EL driver TFT and said second EL driver TFT becomes and OFF state when an electric potential of said power supply line is applied to said gate electrode of each of said EL driver TFT.

15. A device according to claim 12, wherein an (n) number of writing-in periods Ta1, Ta2, . . . , Tan and an (n) number of display periods Tr1, Tr2, . . . , Trn are provided in one frame period;

said (n) number of writing-in periods Ta1, Ta2, . . . , Tan appear in said order;

said (n) number of display periods Tr1, Tr2, . . . , Trn appear in said order;

a time period from the moment at which each of said (n) number of writing-in periods Ta1, Ta2, . . . , Tan begins to the moment at which the writing-in period subsequent to said each of said (n) number of writing-in periods Ta1, Ta2, . . . , Tan begins corresponds to each of said display periods Tr1, Tr2, . . . , Trn;

a writing-in period which appears subsequently to said writing-in period Tan is a writing-in period Ta1' which appears first in the next frame period;

a display period which appears subsequently to said display period Trn is a display period Tr1' which appears first in the next frame period;

said (n) number of writing-in periods Ta1, Ta2, . . . , Tan are divided into an (i) number of writing-in periods (i: an integer equal to or larger than 0 and equal to or smaller than n) and an (n-1) number of writing-in periods;

in each of said (i) number of writing-in periods, digital data signals are inputted from said first source signal line driver circuit to all of said plurality of pixels through said first source signal line;

in each of said (n-i) number of writing-in periods, digital data signals are inputted from said second source signal line driver circuit to all of said plurality of pixels through said second source signal line;

in each of said (i) number of writing-in periods, the digital data signals inputted from said second source signal line driver circuit before said (i) number of writing-in periods are erased from all of said plurality of pixels;

in each of said (n-i) number of writing-in periods, the digital data signals inputted from said first source signal line driver circuit before said (n-i) number of writing-in periods are erased from all of said plurality of pixels;

adjacent pairs (Ta1, Ta2), (Ta2, Ta3), . . . , (Ta(n-1), Tan), (Tan, Ta1') between the group of said (n) number of writing-in periods Ta1, Ta2, . . . , Tan and the subsequent group of said (n) number of writing-in periods Ta2, Ta3, . . . , Ta1' are divided into a group of a (j) number of adjacent pairs of writing-in periods (j: an integer equal to or greater than 0 and equal to or smaller than (n-1)) and an (n-j) number of adjacent pairs of writing-in periods;

in each of said (j) number of adjacent pairs of writing-in periods, the two writing-in periods overlap each other;

in each of said (n-j) number of adjacent pairs of writing-in periods, the two writing-in periods do not overlap each other;

in one writing-in period in each of said (j) number of adjacent pairs of writing-in periods, the digital data signals are inputted from said first source signal line driver circuit to all of said plurality of pixels and, in the other writing-in period, the digital data signals are inputted from said second source signal line driver circuit to all of said plurality of pixels;

in each of said (n) number of writing-in periods Ta1, Ta2, . . . , Tan, one of a luminescing state and a non-luminescing state of the EL element of each of said plurality of pixels is selected by the digital data signal inputted to said plurality of pixels;

in each of said (n) number of display periods Tr1, Tr2, . . . , Trn, the EL element of each of said plurality of pixels is set in one of the luminescing state and the non-luminescing state according to the digital data signal;

in each of an (m) number of display periods (m: an integer equal to or larger than 0 and equal to or smaller than n) in said (n) number of display periods Tr1, Tr2, . . . , Trn, all of the EL elements of said plurality of pixels are set in the non-luminescing state; and the length of each of the sums Tr1+Tr2, Tr2+Tr3, . . . , Trn+Tr1' of the lengths of adjacent pairs between the group of said (n) number of display periods Tr1, Tr2, . . . , Trn and the subsequent group of said (n) number of display periods Tr2, Tr3, . . . , Tr1' is equal to or longer than the length of said writing-in periods Ta1, Ta2, . . . , Tan.

16. A device according to claim 15, wherein the proportions of the lengths of said (n-m) number of display periods coincide with the proportions of the lengths of an (n-m) number of periods defined by dividing a (k) number of periods T1, T2, . . . , Tk (k: an integer equal to or larger than 1 and equal to or smaller than (n-m)) a (n-m-k) number of times, and wherein if said (k) number of periods T1, T2, . . . , Tk are arranged in increasing order of length, the proportions of the lengths of said (k) number of periods T1, T2, . . . , Tk can be expressed by $2^0:2^1: \ldots :2^{0(k-1)}$.

17. A device according to claim 15, wherein the two writing-in periods in at least one of said adjacent pairs of said (n) number of writing-in periods (Ta1, Ta2), (Ta2, Ta3), . . . , (Tan, Ta1') overlap each other.

18. A device according to claim 15, wherein all the EL elements of said plurality of pixels are set in the non-luminescing state in at least one of said (n) number of display periods Tr1, Tr2, ..., Trn.

19. A device according to claim 15, wherein none of said (n) number of display periods Tr1, Tr2, ..., Trn is set as a period in which all the EL elements of said plurality of pixels are set in the non-luminescing state.

20. A device according to claim 15, wherein the lengths of said (i) number of writing-in periods are equal to each other; and the lengths of said (n–i) number of writing-in periods are equal to each other.

21. A device according to claim 15, wherein the lengths of said (n) number of writing-in periods Ta1, Ta2, ..., Tan are equal to each other.

22. A device according to claim 15, wherein said (i) number of writing-in periods and said (n–i) number of writing-in periods appear alternately.

23. A device according to claim 15, wherein, if said (n–m) number of display periods are arranged in increasing order of length, the proportions of the lengths of said (n–m) number of display periods can be expressed by $2^0 : 2^1 : \ldots : 2^{(n-m-1)}$.

24. A device according to claim 15, wherein said EL layer is a low molecular type organic material or a polymer organic material.

25. A device according to claim 24, wherein said low molecular type organic material comprises $Alq_3$ (tris-8-quinolilite-aluniinum) or TPD (triphenylamine derivative).

26. A device according to claim 24, wherein said polymer organic material comprises PPV (polyphenylene vinylene), PVK (polyvinyl carbazole), or polycarbonate.

27. A device according to claim 12, wherein said pair of source signal line driver circuits comprises TFTs formed over said substrate and the driving frequency of said pair of source signal line driver circuits is 10 MHZ or more.

28. A device according to claim 12, wherein said EL element has a pixel electrode, an opposing electrode, and an EL layer interposed between said pixel electrode and said opposing electrode.

29. A device according to claim 12, wherein said EL element has a pixel electrode, an opposing electrode, and an EL layer interposed between said pixel electrode and said opposing electrode;
said opposing electrode is maintained at a constant potential; and
said power supply line is maintained at a constant potential.

30. A device according to claim 12, wherein said device is an EL display device.

31. A device according to claim 12, wherein said device is a video camera.

32. A device according to claim 12, wherein said device is a head-mount type EL display device.

33. A device according to claim 12, wherein said device is a DVD player.

34. A device according to claim 12, wherein said device is a head-mount display.

35. A device according to claim 12, wherein said device is a personal computer.

36. A device according to claim 12, wherein said device is a portable telephone.

37. A device according to claim 12, wherein said device is a car audio.

38. A display device comprising:
a pair of source signal line driver circuits;
a pixel portion including a plurality of pixels,
wherein each of said plurality of pixels comprises a light emitting element, a pair of driver TFTs, a pair of switching TFTs and a pair of eliminating TFTs,
wherein luminescence of the light emitting element is controlled by said pair of driver TFTs,
wherein one of said pair of driver TFTs is controlled by one of said pair of switching TFTs and one of said pair of eliminating TFTs, and
wherein the other of said pair of driver TFTs is controlled by the other of said pair of switching TFTs and the other of said eliminating TFTs.

39. A device according to claim 38,
wherein said pair of source signal line driver circuits comprise a TFT on a substrate on which said pixel portion is also formed, and
wherein the driving frequency of said pair of source signal line driver circuits is 10 MHZ or more.

40. A device according to claim 38, wherein said light emitting element has a pixel electrode, an opposing electrode, and an EL layer interposed between said pixel electrode and said opposing electrode.

41. A device according to claim 38, wherein said device is one of selected from the group consisting of an EL display device, a video camera, a head-mount type EL display device, a DVD player, a head-mount display, a personal computer, a portable telephone, a car audio.

42. An electronic device comprising:
at least one pixel electrode;
a first driver transistor for supplying an electric current to said pixel electrode;
a second driver transistor for supplying an electric current to said pixel electrode wherein said first driver transistor and said second driver transistor are electrically connected to said pixel electrode in parallel;
a first switching transistor for switching the first driver transistor wherein a gate electrode of said first switching transistor is connected to a first gate line;
a second switching transistor for switching the second driver transistor wherein a gate electrode of said second switching transistor is connected to a second gate line;
a first source signal line electrically connected to the first switching transistor; and
a second source signal line electrically connected to the second switching transistor wherein the first and second source signal lines extend in parallel to each other.

43. A device according to claim 42 wherein each of said first driver transistor, said second driver transistor, said first switching transistor and said second switching transistor is a thin film transistor.

44. A device according to claim 42 further comprising an EL layer adjacent to said pixel electrode.

45. A device according to claim 42, wherein said device is an EL display device.

46. A device according to claim 42, wherein said device is a video camera.

47. A device according to claim 42, wherein said device is a head-mount type EL display device.

48. A device according to claim 42, wherein said device is DVD player.

49. A device according to claim 42, wherein said device is a head-mount display.

50. A device according to claim 42, wherein said device is a personal computer.

51. A device according to claim 42, wherein said device is a portable telephone.

52. A device according to claim 42, wherein said device is a car audio.

* * * * *